United States Patent
Stengel et al.

(10) Patent No.: US 12,484,440 B2
(45) Date of Patent: Nov. 25, 2025

(54) ELECTROLUMINESCENT DEVICES HAVING SENSITIZER AND FLUORESCENT EMITTER

(71) Applicant: Merck Patent GmbH, Darmstadt (DE)

(72) Inventors: Ilona Stengel, Darmstadt (DE); Antonia Horn, Offenbach (DE); Falk May, Mainz (DE); Aaron Lackner, Mannheim (DE); Christof Pflumm, Darmstadt (DE); Amel Mekic, Darmstadt (DE); Nils Haase, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 610 days.

(21) Appl. No.: 17/276,060

(22) PCT Filed: Sep. 12, 2019

(86) PCT No.: PCT/EP2019/074290
§ 371 (c)(1),
(2) Date: Mar. 12, 2021

(87) PCT Pub. No.: WO2020/053314
PCT Pub. Date: Mar. 19, 2020

(65) Prior Publication Data
US 2022/0045276 A1    Feb. 10, 2022

(30) Foreign Application Priority Data
Sep. 12, 2018  (EP) ..................... 18194110

(51) Int. Cl.
*H10K 85/60*  (2023.01)
*H10K 85/30*  (2023.01)
(Continued)

(52) U.S. Cl.
CPC ......... *H10K 85/623* (2023.02); *H10K 85/342* (2023.02); *H10K 85/346* (2023.02);
(Continued)

(58) Field of Classification Search
CPC .. H10K 85/623; H10K 85/342; H10K 85/346; H10K 85/371; H10K 50/11;
(Continued)

(56) References Cited

U.S. PATENT DOCUMENTS 4,539,507 A    9/1985  Vanslyke et al.
5,151,629 A    9/1992  Vanslyke
(Continued)

FOREIGN PATENT DOCUMENTS

CN    102113146 A    6/2011
EP    0676461 A2    10/1995
(Continued)

OTHER PUBLICATIONS

Cheng G et al. "Highly efficient white organic light-emitting devices based on a multiple emissive-layer structure" Thin Solid Films, Elsevier, Amsterdam, NL, vol. 516, No. 15, Jun. 2, 2008 (Jun. 2, 2008), pp. 5133-5136.
(Continued)

*Primary Examiner* — Davienne N Monbleau
*Assistant Examiner* — John Patrick Cornely
(74) *Attorney, Agent, or Firm* — Faegre Drinker Biddle & Reath LLP

(57) ABSTRACT

The present invention describes electronic devices and compositions that can be used in electronic devices, the electronic devices including a sensitizer and a fluorescent emitter, wherein the sensitizer is a phosphorescent compound and wherein at least one of the two following conditions (I) or (II) must be satisfied, it being preferable when condition (I) is satisfied:

(Continued)

$$S_1^K(FE) - S_1^K(S) \geq X \quad \text{(I)}$$

$$S_1^{max}(FE) - S_1^{max}(S) \leq Y \quad \text{(II)}$$

wherein, e.g., X, Y are each −0.5 eV; $S_1^K(FE)$ is the energy of the first excited singlet state of the fluorescent emitter; $S_1^K(S)$ is the energy of the first excited state of the sensitizer; $S_1^{max}(FE)$ is the energy of the first excited singlet state of the fluorescent emitter; $S_1^{max}(S)$ is the energy of the first excited state of the sensitizer; and wherein the photoluminescence spectra of the sensitizer and of the fluorescent emitter are determined at room temperature.

21 Claims, 2 Drawing Sheets

(51) Int. Cl.
- H10K 50/11 (2023.01)
- H10K 50/12 (2023.01)
- H10K 101/10 (2023.01)
- H10K 101/30 (2023.01)
- H10K 101/40 (2023.01)

(52) U.S. Cl.
CPC ........... H10K 85/371 (2023.02); *H10K 50/11* (2023.02); *H10K 50/121* (2023.02); *H10K 2101/10* (2023.02); *H10K 2101/30* (2023.02); *H10K 2101/40* (2023.02)

(58) Field of Classification Search
CPC ............. H10K 50/121; H10K 2101/10; H10K 2101/30; H10K 2101/40; H10K 85/615; H10K 85/622; H10K 85/624; H10K 85/631
See application file for complete search history.

(56) References Cited

U.S. PATENT DOCUMENTS

| | | | |
|---|---|---|---|
| 2002/0125818 A1 | 9/2002 | Sato et al. | |
| 2005/0214575 A1 | 9/2005 | Igarashi et al. | |
| 2006/0025617 A1* | 2/2006 | Begley | C07C 17/16 552/292 |
| 2006/0192482 A1 | 8/2006 | Igarashi et al. | |
| 2011/0303903 A1 | 12/2011 | Yoshinaga et al. | |
| 2013/0037785 A1 | 2/2013 | Fujita et al. | |
| 2017/0077418 A1* | 3/2017 | Stoessel | H10K 85/622 |
| 2017/0092889 A1* | 3/2017 | Seo | H10K 85/6572 |
| 2018/0151821 A1* | 5/2018 | Peng | H10K 50/125 |
| 2020/0371198 A1 | 11/2020 | Schoor | |
| 2021/0280811 A1 | 9/2021 | Ohsawa et al. | |
| 2022/0045277 A1 | 2/2022 | Stengel et al. | |

FOREIGN PATENT DOCUMENTS

| | | |
|---|---|---|
| JP | 2003-077674 A | 3/2003 |
| JP | 2005-071986 A | 3/2005 |
| JP | 2005-310766 A | 11/2005 |
| JP | 2006-066562 A | 3/2006 |
| JP | 2020-017721 A | 1/2020 |
| JP | 2021-514061 A | 6/2021 |
| JP | 2022-500870 A | 1/2022 |
| KR | 10-2011-0044213 A | 4/2011 |
| TW | 201638086 A | 11/2016 |
| TW | 201640696 A | 11/2016 |
| WO | 98/27136 A1 | 6/1998 |
| WO | 2015/091716 A1 | 6/2015 |
| WO | 2016/193243 A1 | 12/2016 |
| WO | 2018/097153 A1 | 5/2018 |
| WO | 2018/097156 A1 | 5/2018 |

OTHER PUBLICATIONS

Freitag et al. "Lambertian white top-emitting organic light emitting device with carbon nanotube cathode" Journal of Applied Physics, American Institute of Physics, US vol. 112, No. 11, Dec. 1, 2012 (Dec. 1, 2012), pp. 114505-114505.

International Preliminary Report on Patentability received for PCT Patent Application No. PCT/EP2019/074290, mailed on Mar. 25, 2021, 15 pages. (8 pages of English Translation and 7 pages of Original Document).

International Search Report and Written Opinion received for PCT Patent Application No. PCT/EP2019/074290, mailed on Nov. 12, 2019, 18 pages. (8 pages of English Translation and 10 pages of Original Document).

* cited by examiner

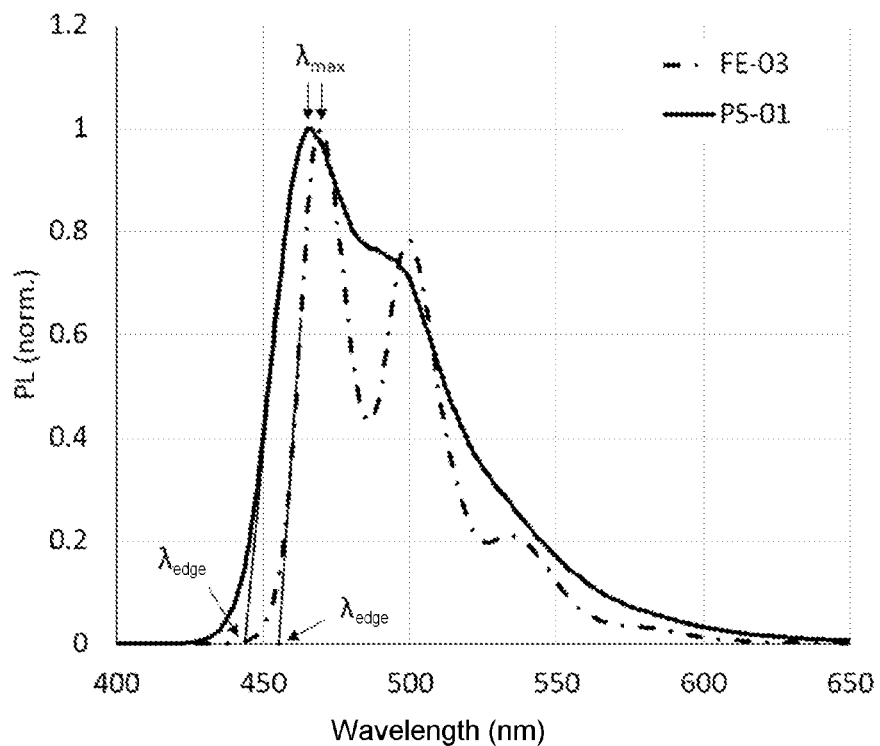
Figure 1: PL spectra in solution (toluene) of FE-03 and PS-01

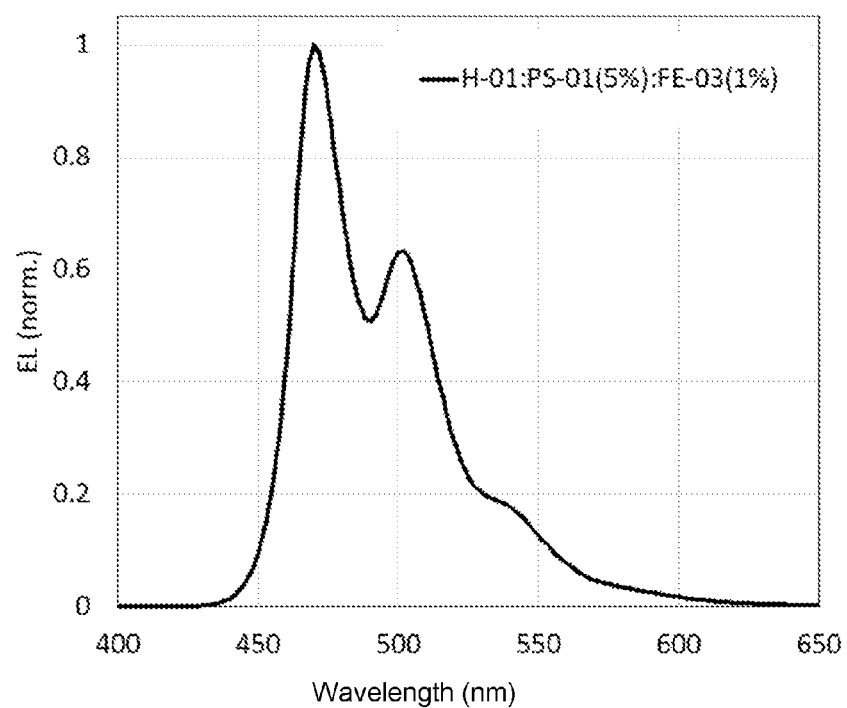
Figure 2: EL spectrum of Experiment 6

ELECTROLUMINESCENT DEVICES HAVING SENSITIZER AND FLUORESCENT EMITTER

CROSS-REFERENCE TO RELATED APPLICATIONS

This application is a national stage application (under 35 U.S.C. § 371) of PCT/EP2019/074290, filed Sep. 12, 2019, which claims benefit of European Application No. 18194110.5, filed Sep. 12, 2018, both of which are incorporated herein by reference in their entirety.

The present invention relates to organic electroluminescent devices and to compositions comprising different organic functional materials.

BACKGROUND OF THE INVENTION

The structure of organic electroluminescent devices, especially of OLEDs (organic light-emitting diodes), in which organic semiconductors are used as functional materials is described, for example, in U.S. Pat. Nos. 4,539,507, 5,151, 629, EP 0676461 and WO 98/27136. Emitting materials used are frequently organometallic complexes that exhibit phosphorescence, and fluorescent emitters. For quantum-mechanical reasons, up to four times the energy efficiency and power efficiency is possible using organometallic compounds as phosphorescent emitters. In general terms, there is still a need for improvement in OLEDs, especially also in OLEDs which exhibit phosphorescence, for example with regard to efficiency, operating voltage and lifetime. Also known are organic electroluminescent devices comprising fluorescent emitters or emitters that exhibit TADF (thermally activated delayed fluorescence).

The properties of organic electroluminescent devices are not only determined by the emitters used. Also of particular significance here are especially the other materials used, such as host/matrix materials, hole blocker materials, electron transport materials, hole transport materials and electron or exciton blocker materials. Improvements to these materials can lead to distinct improvements to electroluminescent devices.

According to the prior art, there are different approaches to further improving the performance data of organic electroluminescent devices. WO 2015/091716 A1 and WO 2016/193243 A1 disclose OLEDs containing both a phosphorescent compound and a fluorescent emitter in the emission layer, where the energy is transferred from the phosphorescent compound to the fluorescent emitter. In this context, the phosphorescent compound accordingly behaves as a host material. As the person skilled in the art knows, host materials have higher singlet and triplet energies as compared to the emitters in order that the energy from the host material can also be transferred to the emitter with maximum efficiency. The systems disclosed in the prior art have exactly such an energy relation.

BRIEF SUMMARY OF THE INVENTION

The present invention relates to a fluorescent electronic device comprising a sensitizer and a fluorescent emitter, wherein the sensitizer is a phosphorescent compound and wherein at least one of the two following conditions (I) or (II) must be satisfied, it being preferable when condition (I) is satisfied:

$$S_1^K(FE) - S_1^K(S) \geq X \quad (I)$$

$$S_1^{max}(FE) - S_1^{max}(S) \leq Y \quad (II)$$

where the parameters used are as follows:

X, Y are each −0.5 eV;

$S_1^K(FE)$ is the energy of the first excited singlet state of the fluorescent emitter which is ascertained from the edge on the short-wavelength side of the normalized photoluminescence spectrum of the fluorescent emitter;

$S_1^K(S)$ is the energy of the first excited state of the sensitizer which is ascertained from the edge on the short-wavelength side of the normalized photoluminescence spectrum of the sensitizer;

$S_1^{max}(FE)$ is the energy of the first excited singlet state of the fluorescent emitter which is ascertained from the location of the first maximum at short wavelengths of the photoluminescence spectrum of the fluorescent emitter;

$S_1^{max}(S)$ is the energy of the first excited state of the sensitizer which is ascertained from the location of the first maximum at short wavelengths of the photoluminescence spectrum of the sensitizer;

wherein the photoluminescence spectra of the sensitizer and of the fluorescent emitter are determined from solution at a concentration of 1 mg in 100 ml of toluene at room temperature.

Further details of the determination of the parameters specified can be found in the examples section of the present invention.

DETAILED DESCRIPTION OF THE INVENTION

The experimental determination of the energy values is disclosed in the examples. The energies should be determined by this method.

Wavelengths in the present invention always have the unit nm. A form of words such as "on the short-wavelength side of the normalized photoluminescence spectrum" thus means going from short wavelengths in nm (e.g. from 300 nm) to greater wavelengths in nm (e.g. 700 nm). Shorter wavelengths thus always mean higher energy as well. For the conditions specified herein, the wavelengths are converted from the unit nm to the unit eV.

It has been found that such devices of the invention have particularly good performance data, especially very good efficiencies, lifetimes and also low voltages.

In a preferred embodiment of the present invention, the fluorescent emitter is a sterically shielded fluorescent emitter.

Steric shielding is determined via the shielding factor (SF) parameter. In the present invention, the shielding factor (SF), also called shielding parameter, is ascertained by the method that follows.

For the fluorescent emitter (also called fluorescent compound), a quantum-chemical calculation is conducted, for example with the aid of the software package Gaussian09 Rev. E.01. First, the singlet ground state geometry is optimized with B3PW91/6-31G(d). For this optimized geometry, a triplet single-point calculation is conducted with B3PW91/6-31G(d) (multiplicity 3; UDFT), from which the triplet electron density is obtained. The singlet ground state electron density is likewise obtained from a single point calculation with B3PW91/631-G(d) for the optimized geometry. The absolute value of the differential between the triplet electron density and singlet electron density (singlet electron density=electron density of the singlet ground state) is a location-dependent parameter and is referred to as triplet density. The triplet density is used to determine the triplet area. This is that area for which the triplet density is $2*10^{-4}$, meaning that it is the isosurface of the triplet density with isovalue $2*10^{-4}$. For all calculations, the standard convergence criteria of Gaussian09 are used.

The "solvent-excluded surface" (also referred to as Connolly surface) of the fluorescent compound is also calculated. This is the surface of the solvent-excluded volume (Michael L. Connolly, "Computation of Molecular Volume", J. Am. Chem. Soc., 1985, Vol. 107, p. 1118-1124). If the van der Waals volume of the fluorescent compound is considered to be hard, i.e. to be a volume that cannot be penetrated, the solvent-excluded volume in the context of the present invention is the portion of the space that cannot be occupied by a hard sphere with radius 0.4 nm. The solvent-excluded surface can be calculated, for example, by the algorithm described in Xu D, Zhang Y (2009), "Generating Triangulated Macromolecular Surfaces by Euclidean Distance Transform" PLoS ONE 4(12): e8140 (doi: 10.1371/journal.pone.0008140). The algorithm is implemented, for example, in the freeware software package EDTSurf. The van der Waals radii rVDW that are used for the calculation are compiled in the following table:

| Element | Ca | C | N | O | S | H | P | Ne | Fe | All others |
|---|---|---|---|---|---|---|---|---|---|---|
| $r_{VDW}$ (Å) | 1.9 | 1.88 | 1.63 | 1.48 | 1.78 | 1.2 | 1.97 | 1.63 | 0.74 | 1.8 |

In the next step, the signed distance d between triplet surface and solvent-excluded surface is calculated on the solvent-excluded surface. The sign convention is as follows: if the solvent-excluded surface is outside the triplet surface (viewed from the centre of the fluorescent compound), the sign is positive, and otherwise negative.

Thereafter, the surface integral I of the scalar function e-d/0.2 nm is formed across the solvent-excluded surface. In addition, the total area A of the solvent-excluded surface is determined. The shielding parameter SF is defined as SF=1−I/A.

The person skilled in the art will be able to implement the method without difficulty with the aid of commercial software in the routine process for determining parameters of molecular relevance.

The factor SF here is preferably not less than 0.45, preferably not less than 0.5, very preferably not less than 0.6 and especially preferably not less than 0.65.

It has been found that the shielding factor has a significant effect on the efficiency of the electronic device.

It is further preferable in the context of the invention when X and/or Y are −0.4 eV, preferably −0.3 eV, very preferably −0.2 eV, even more preferably −0.1 eV, especially preferably 0.0 eV and most preferably 0.1 eV.

It is further preferable when X is not less than −0.2 eV, very preferably not less than −0.15 eV, more preferably not less than −0.1 eV, even more preferably not less than 0.05 eV and most preferably not less than 0.00 eV.

It is further preferable when Y is not less than 0.00 eV, even more preferably greater than 0.00 eV, even more preferably not less than 0.01 eV, especially preferably not less than 0.02 eV, exceptionally preferably not less than 0.03 eV, very exceptionally preferably not less than 0.05 eV, even more preferably not less than 0.07 and most preferably not less than 0.10 eV.

In a preferred embodiment, X is not less than −0.2 eV and Y is not less than 0.00 eV, even more preferably greater than 0.00 eV, even more preferably not less than 0.01 eV, especially preferably not less than 0.02 eV, exceptionally preferably not less than 0.03 eV, very exceptionally preferably not less than 0.05 eV, even more preferably not less than 0.07 and most preferably not less than 0.10 eV.

In a preferred embodiment, X is not less than −0.1 eV and Y is not less than 0.00 eV, even more preferably greater than 0.00 eV, even more preferably not less than 0.01 eV, especially preferably not less than 0.02 eV, exceptionally preferably not less than 0.03 eV, very exceptionally preferably not less than 0.05 eV, even more preferably not less than 0.07 and most preferably not less than 0.10 eV.

In a preferred embodiment, X is not less than −0.05 eV and Y is not less than 0.00 eV, even more preferably greater than 0.00 eV, even more preferably not less than 0.01 eV, especially preferably not less than 0.02 eV, exceptionally preferably not less than 0.03 eV, very exceptionally preferably not less than 0.05 eV, even more preferably not less than 0.07 and most preferably not less than 0.10 eV.

It is further preferable when X is not less than 0.0 eV and Y is not less than 0.00 eV, even more preferably greater than 0.00 eV, even more preferably not less than 0.01 eV, especially preferably not less than 0.02 eV, exceptionally preferably not less than 0.03 eV, very exceptionally preferably not less than 0.05 eV, even more preferably not less than 0.07 eV and most preferably not less than 0.10 eV.

It is further preferable when condition (I) is satisfied. It is additionally preferable when condition (II) is satisfied. Finally, it is preferable when both condition (I) and condition (II) are satisfied.

It is preferable when the sensitizer transfers its energy that it absorbs in the electronic device directly to the fluorescent emitter and the fluorescent emitter emits excitation energy absorbed by the sensitizer by fluorescence.

The energy may be transferred from the sensitizer to the fluorescent emitter via various mechanisms. An important route for transfer of the energy appears to be Förster resonance energy transfer (FRET or else FET).

In a preferred embodiment of the present invention, the absorption spectrum of the fluorescent emitter overlaps with the photoluminescence (emission) spectrum of the sensitizer.

It is further preferable when the absorption spectrum of the fluorescent emitter overlaps with the photoluminescence spectrum of the sensitizer and the magnitude of the gap between the triplet metal-to-ligand charge transfer ($^3$MLCT) band of the photoluminescence spectrum of the sensitizer and the absorption maximum of the fluorescent emitter satisfies the following condition (III):

$$|\lambda_{em}^{3MLCT}(S) - \lambda_{abs}^{max}(FE)| \leq V \qquad (III)$$

where V is 0.5 eV, V is preferably 0.4 eV, V is very preferably 0.3 eV, V is especially preferably 0.2 eV, V is even more preferably 0.15 eV and V is especially preferably 0.1 V.

The triplet metal-to-ligand charge transfer ($^3$MLCT) band, characterized by the parameter $\lambda_{em}^{3MLCT}(S)$, of the photoluminescence spectrum of the sensitizer, is found here from the edge at short wavelengths in the photoluminescence spectrum of the sensitizer. The $\lambda_{em}^{3MLCT}(S)$, value is thus identical to the $S_1^K(S)$ value already mentioned. $\lambda_{abs}^{max}$ (FE) is the peak absorption wavelength of the first maximum at long wavelengths of the fluorescent emitter. Each value is calculated in electron volts.

It is especially preferable that the condition (IV) is satisfied $$\lambda_{em}^{3MLCT}(S) - \lambda_{abs}^{max}(FE) \leq W \quad (IV)$$

where W is 0.5 eV, W is preferably 0.4 eV, W is very preferably 0.3 eV, W is especially preferably 0.2 eV, W is even more preferably 0.15 eV and W is especially preferably 0.1 V.

The Förster resonance energy transfer between the sensitizer and the fluorescent emitter can be described with the aid of the Förster radius, $R^6_{FRET}$, which is given by the following equation:

$$R^6_{FRET} = \frac{9\ln(10)\kappa^2 \phi_S}{128\pi^5 N_A n^4} J(\lambda)$$

where κ is the dipole orientation factor, $\phi_s$ is the quantum yield of the sensitizer, n is the refractive index of the medium, $N_A$ is the Avogadro constant and $J(\lambda)$ is the spectral overlap integral. The spectral overlap integral is defined by the following equation:

$$J(\lambda) \int_0^\infty F_S(\lambda) \varepsilon_{FE}(\lambda) \lambda^4 d\lambda$$

where λ is the wavelength, $F_s(\lambda)$ is the normalized radiation intensity of the photoluminescence spectrum of the sensitizer and $\varepsilon_{FE}$ is the molar coefficient of absorption of the fluorescent emitter. Both the photoluminescence spectrum for determination of $F_s(\lambda)$ and the absorption spectrum for determination of $\varepsilon_{FE}$ are measured from solution of the respective compounds in toluene. The Förster radius is calculated with the following settings: n=1.7 and $\kappa^2$=2/3.

A small Förster radius is preferred. It is preferable when the Förster radius is less than 3 nm, very preferably not more than 2.5 nm, even more preferably not more than 2.3 nm and especially preferably not more than 2.1 nm. It has been found that there is a distinct improvement in the lifetime of electronic devices with decreasing Förster radius.

In another embodiment of the present invention, a greater Förster radius is preferred. This leads to greater efficiency of the electronic device. It is preferable when the Förster radius is not less than 2.5 nm, very preferably not less than 2.7 nm, even more preferably not less than 2.8 nm and especially preferably not less than 3.0 nm.

The sensitizer may basically be any phosphorescent compound, with the sole proviso that the intersystem crossing (ISC) rates are fast enough. A person skilled in the art in the field will have no difficulty in selecting the suitable compounds for the present purpose from a multitude of suitable compounds that are known to him.

A phosphorescent compound in the context of the present invention is preferably a compound capable of emitting light at room temperature under optical or electrochemical excitation in an environment as exists in the organic electroluminescent device, where the emission is from a spin-forbidden transition, for example a transition from an excited triplet state or a mixed singlet/triplet state.

Suitable phosphorescent compounds (also called triplet emitters for short hereinafter) are especially compounds which, when suitably excited, emit light, preferably in the visible region, and also contain at least one atom of atomic number greater than 20, preferably greater than 38 and less than 84, more preferably greater than 56 and less than 80, especially a metal having this atomic number.

Preferably, the sensitizer is a phosphorescent compound from the group of the organometallic complexes, especially from the group of the transition metal complexes.

Phosphorescent compounds used with preference are organometallic complexes containing copper, molybdenum, tungsten, rhenium, ruthenium, osmium, rhodium, iridium, palladium, platinum, silver, gold or europium, especially compounds containing copper, iridium or platinum, and very preferably iridium and platinum. In the context of the present invention, all luminescent compounds containing the abovementioned metals are regarded as phosphorescent compounds.

Particular preference is given to phosphorescent organometallic complexes described in patent application WO2015/091716. Particularly phosphorescent organometallic complexes described in WO00/70655, WO2001/41512, WO2002/02714, WO2002/15645, EP1191612, WO2005/033244, WO2005/019373, US2005/0258742, WO2006/056418, WO2007/115970, WO2007/115981, WO2008/000727, WO2009/050281, WO2009/050290, WO2011/051404, WO2011/073149, WO2012/121936, US2012/0305894, WO2012/170571, WO2012/170461, WO2012/170463, WO2006/121811, WO2007/095118, WO2008/156879, WO2008/156879, WO2010/068876, WO2011/106344, WO2012/172482, EP3126371, WO2015/014835, WO2015/014944, WO2016/020516, US2016/0072081, WO2010/086089, WO2011/044988, WO2014/008982, WO2014/023377, WO2014/094961, WO2010/069442, WO2012/163471, WO2013/020631, US2015/0243912, WO2008/000726, WO2010/015307, WO2010/054731, WO2010/054728, WO2010/099852, WO2011/032626, WO2011/157339, WO2012/007086, WO2015/036074, WO2015/104045, WO2015/117718, WO2016/015815, which are preferably iridium and platinum complexes. These especially also include organometallic complexes having polypodal ligands as described in WO2004081017, WO2005042550, US20050170206, WO2009/146770, WO2010/102709, WO2011/066898, WO2016124304, WO2017032439, WO2018019688, EP3184534, WO2018/011186, WO 2016/193243 and WO 2015/091716A1.

These additionally also include binuclear organometallic complexes as described in WO2011/045337, US2015/0171350, WO2016/079169, WO2018/019687, WO2018/041769, WO2018/054798, WO2018/069196, WO2018/069197, WO2018/069273.

These additionally also include copper complexes as described in WO2010/031485, US2013/150581, WO2013/017675, WO2013/007707, WO2013/001086, WO2012/156378, WO2013/072508, EP2543672.

Examples of suitable phosphorescent palladium complexes are described in WO2014/109814.

In general, all phosphorescent complexes as used for phosphorescent OLEDs according to the prior art and as known to those skilled in the art in the field of organic electroluminescence are suitable, and the person skilled in the art will be able to use further phosphorescent complexes without exercising inventive skill.

In a preferred embodiment of the invention, in the case of preparation of the emitting layer by vapour deposition, the phosphorescent compound is in a concentration of 5% to 99.9% by volume in the emitting layer, preferably from 5% to 60% by volume, more preferably from 10% to 50% by volume, most preferably 20% to 40% by volume, where the percentages by volume (% by volume) reported are based on the total volume of the emitting layer.

In a further-preferred embodiment of the invention, in the case of preparation of the emitting layer by vapour deposition, the phosphorescent compound is in a concentration of 5% to 99.9% by volume in the emitting layer, preferably from 5% to 60% by volume, more preferably from 5% to 45% by volume, most preferably 5% to 30% by volume, where the percentages by volume (% by volume) reported are based on the total volume of the emitting layer.

In yet a further-preferred embodiment of the invention, in the case of preparation of the emitting layer by vapour deposition, the phosphorescent compound is in a concentration of 1% to 50% by volume in the emitting layer, preferably from 2% to 40% by volume, more preferably from 3% to 30% by volume, most preferably 4% to 25% by volume, where the percentages by volume (% by volume) reported are based on the total volume of the emitting layer.

In a preferred embodiment of the invention, in the case of preparation of the emitting layer from solution, the phosphorescent compound is in a concentration of 5% to 99.9% by weight in the emitting layer, preferably from 5% to 60% by weight, more preferably from 10% to 50% by weight, most preferably 20% to 40% by weight, where the percentages by mass (% by weight) reported are based on the total mass of the emitting layer.

In a further-preferred embodiment of the invention, in the case of preparation of the emitting layer from solution, the phosphorescent compound is in a concentration of 5% to 99.9% by weight in the emitting layer, preferably from 5% to 60% by weight, more preferably from 5% to 45% by weight, most preferably 5% to 30% by weight, where the percentages by mass (% by weight) reported are based on the total mass of the emitting layer.

In yet a further-preferred embodiment of the invention, in the case of preparation of the emitting layer from solution, the phosphorescent compound is in a concentration of 1% to 50% by weight in the emitting layer, preferably from 2% to 40% by weight, more preferably from 3% to 30% by weight, most preferably 4% to 25% by weight, where the percentages by mass (% by weight) reported are based on the total mass of the emitting layer.

Explicit examples of phosphorescent sensitizers are Ir(ppy)$_3$ and its derivatives, and the structures detailed in the overviews that follow.

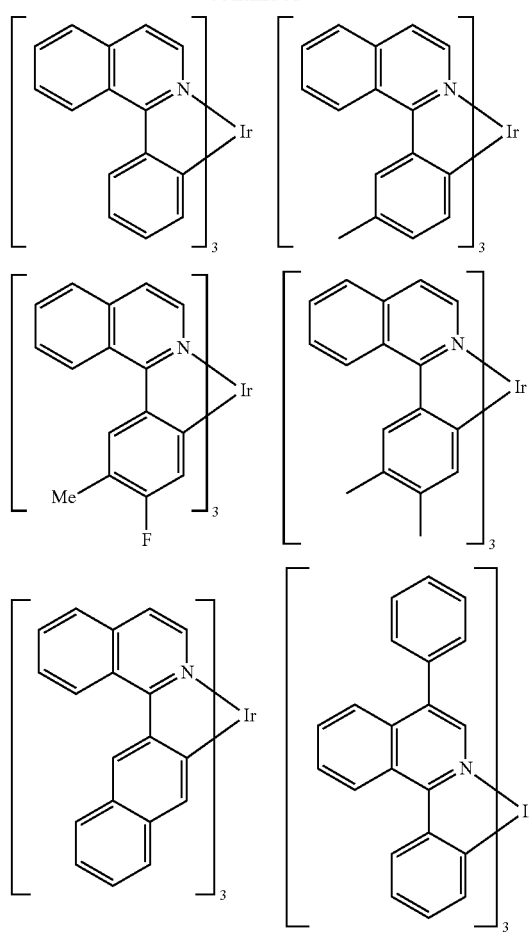

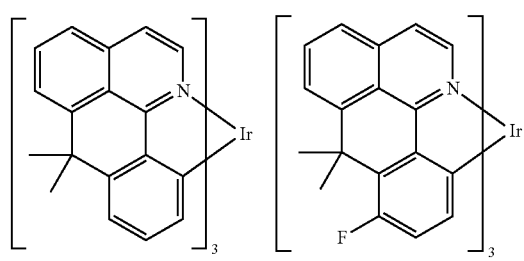

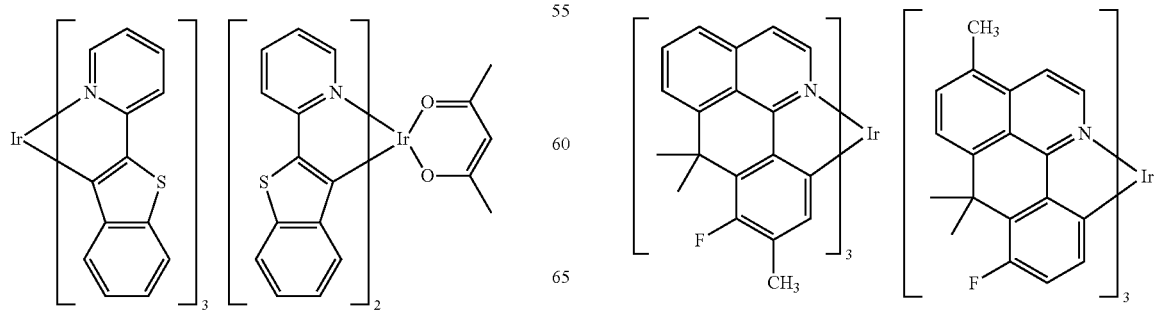

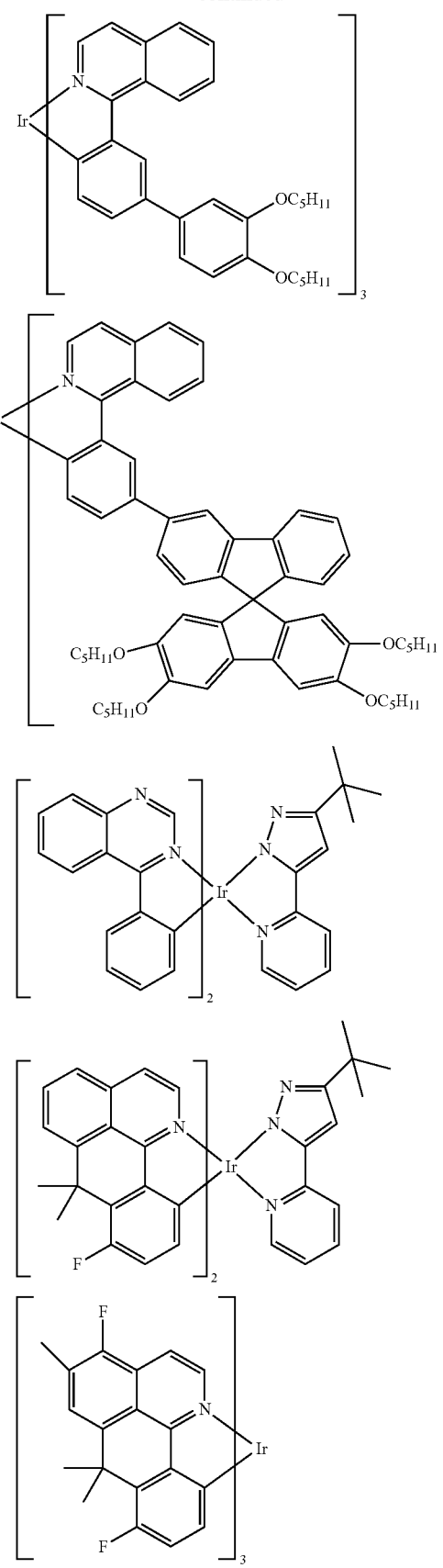
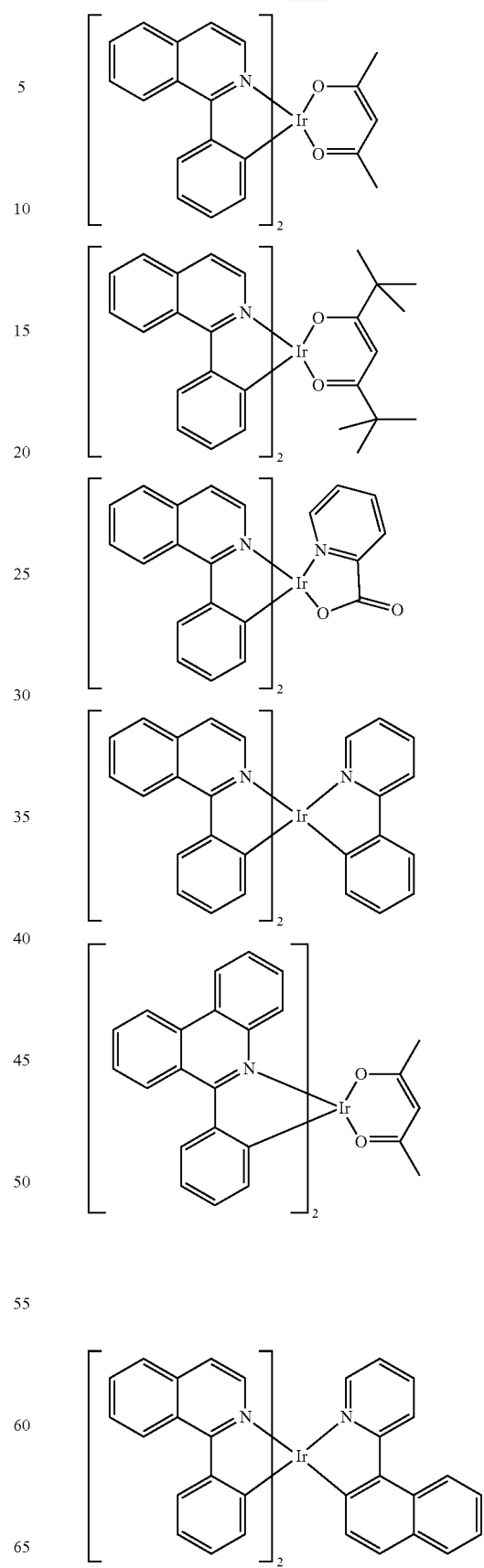

-continued
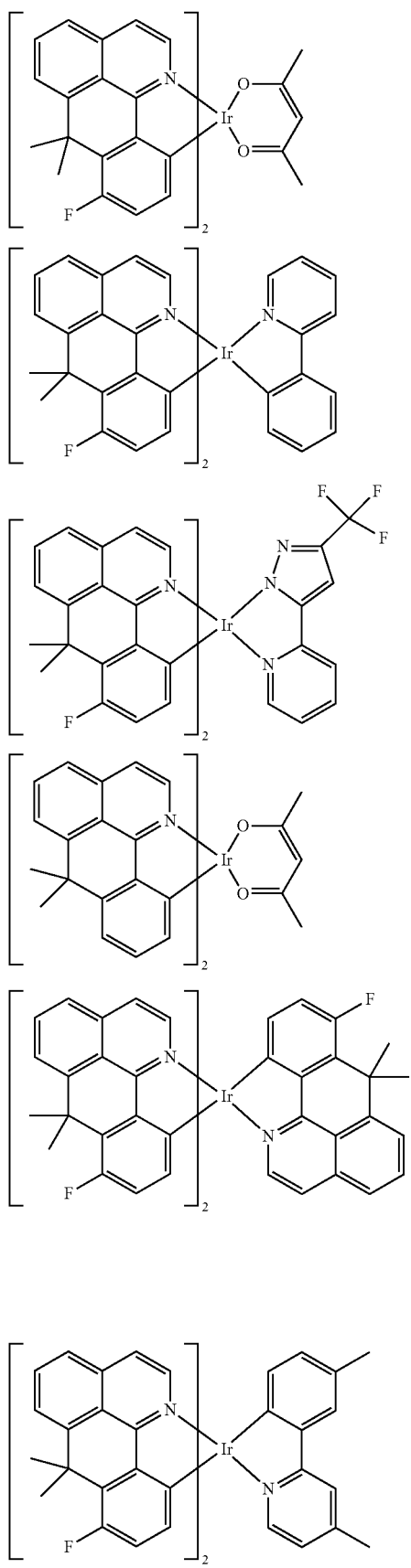
-continued
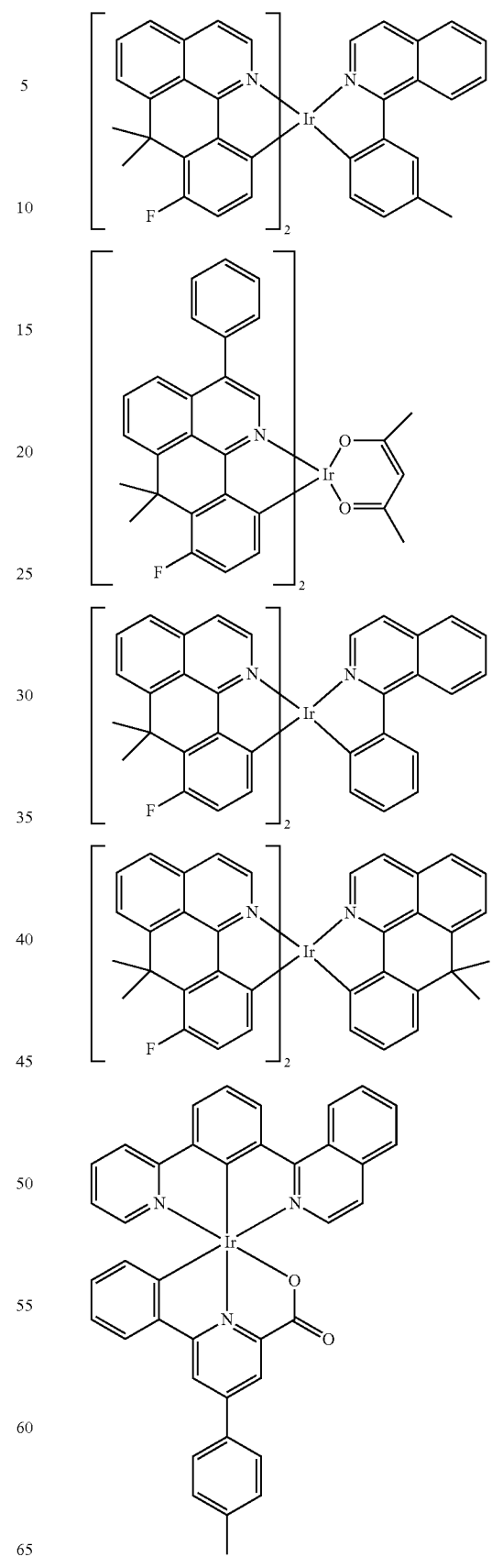

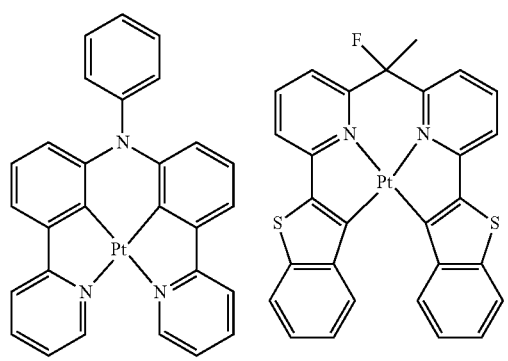
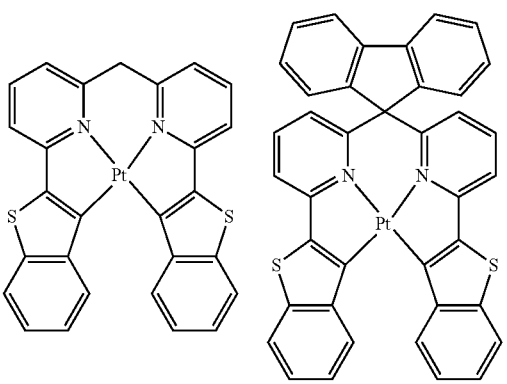
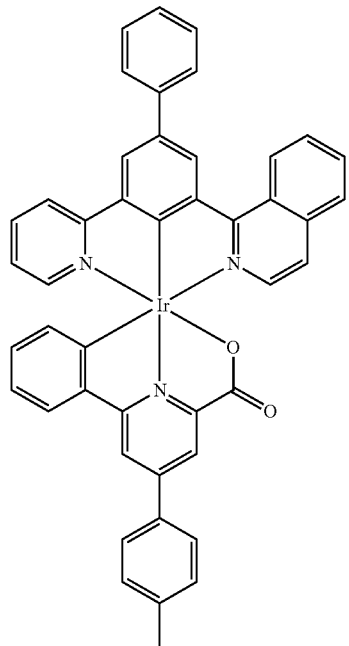
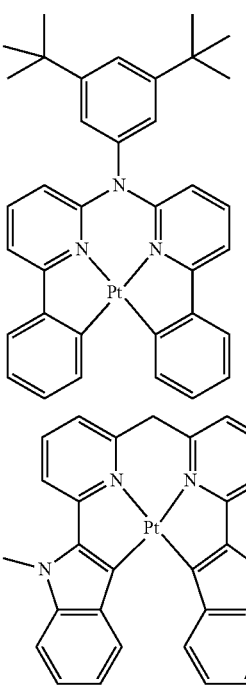
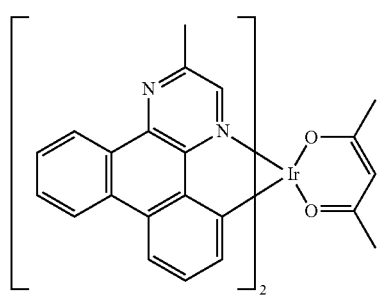
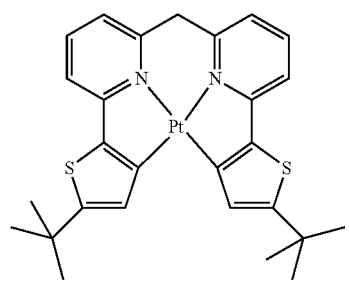
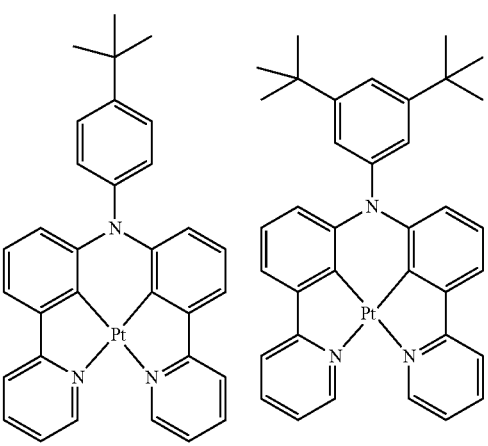

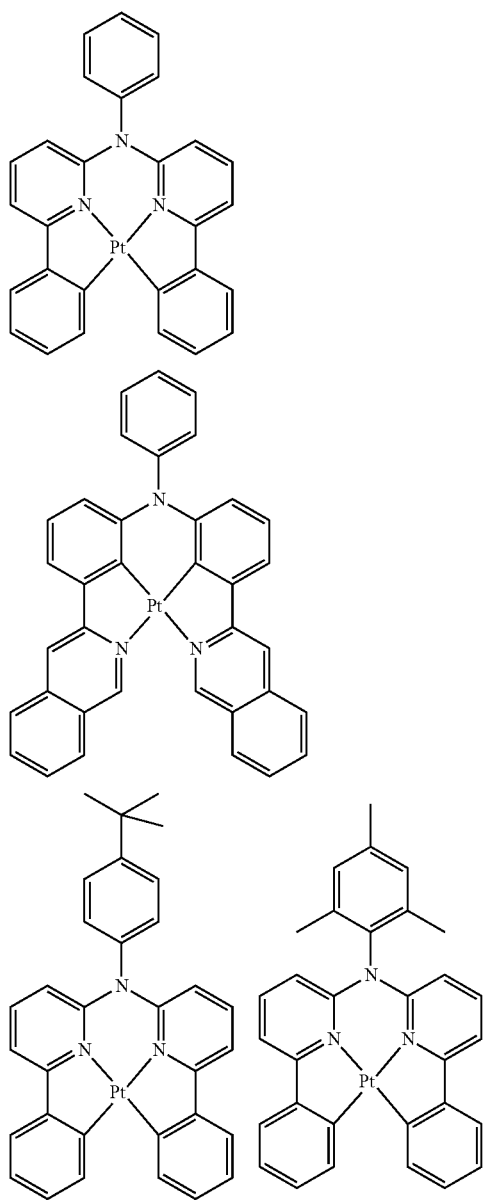
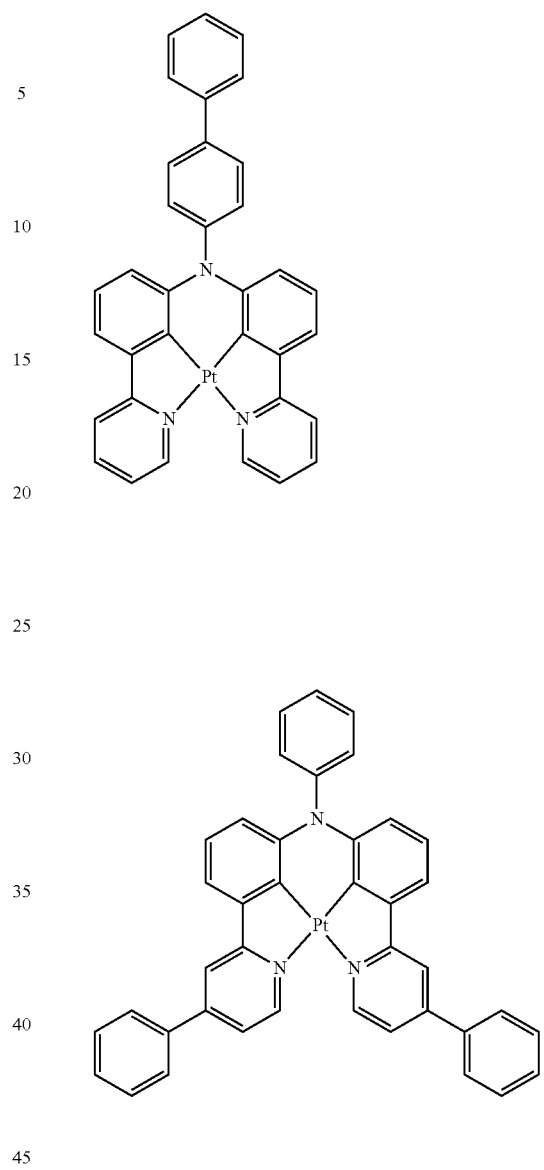
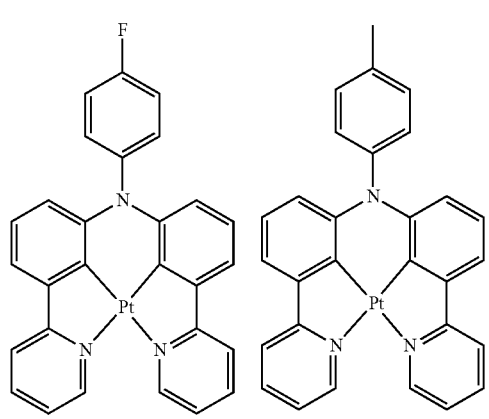
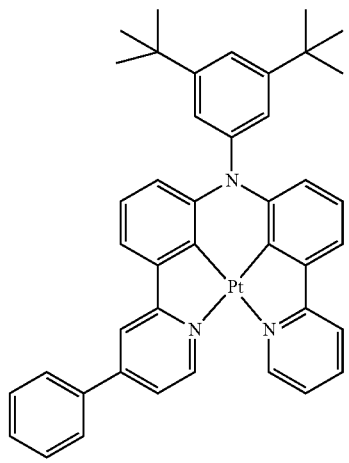

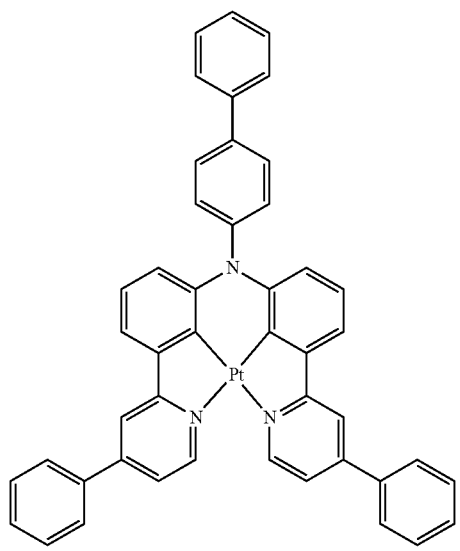
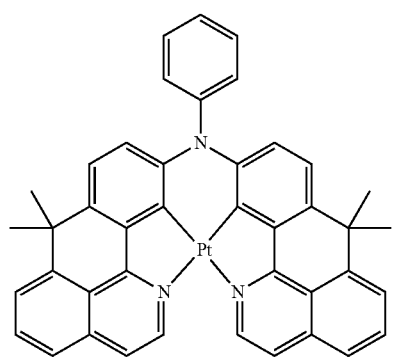
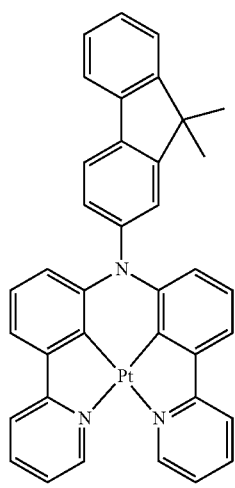
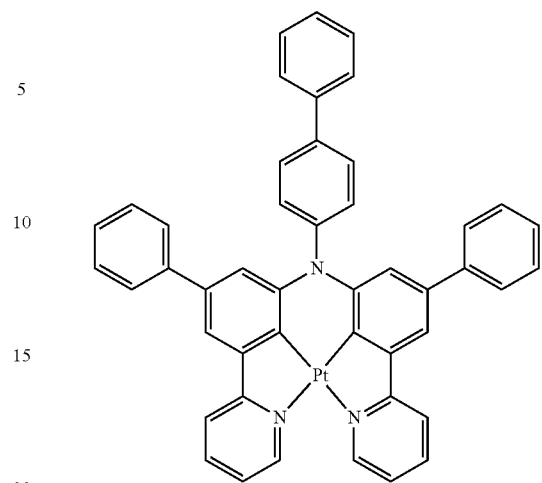
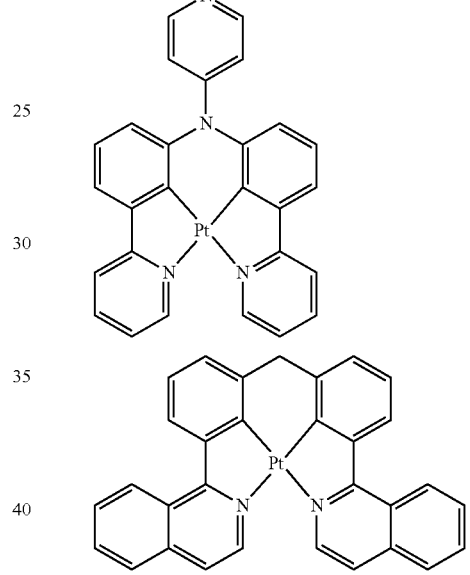
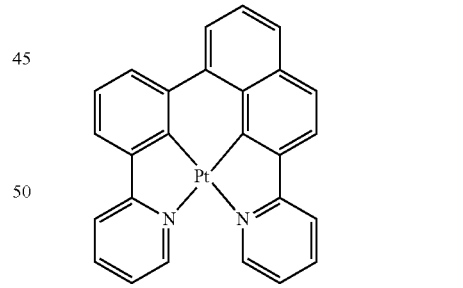
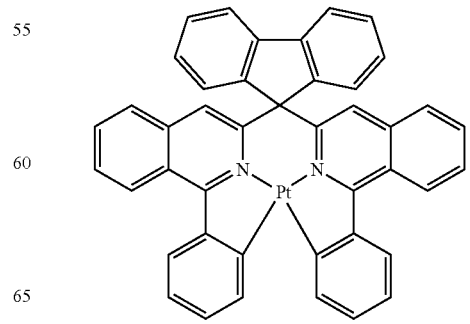

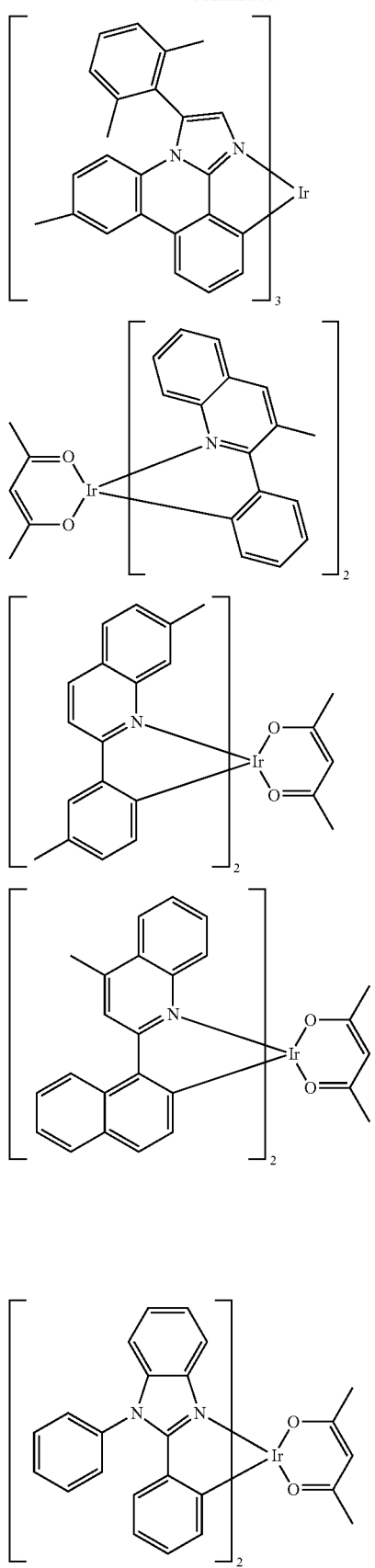
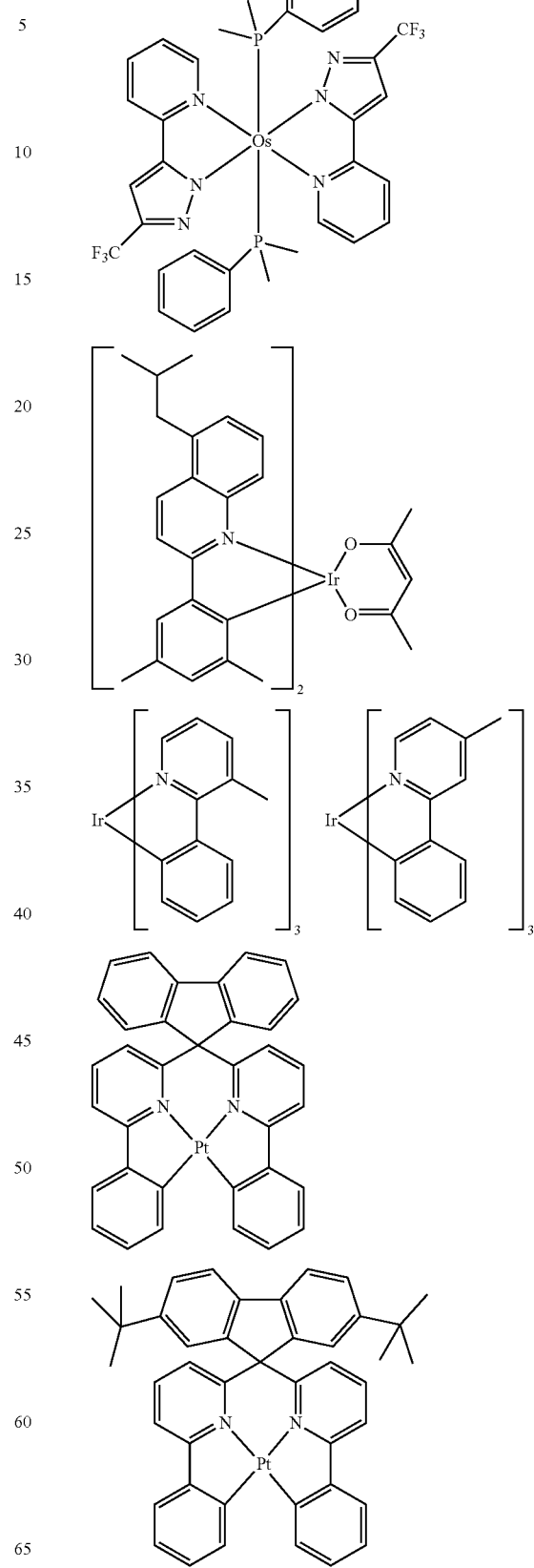

-continued
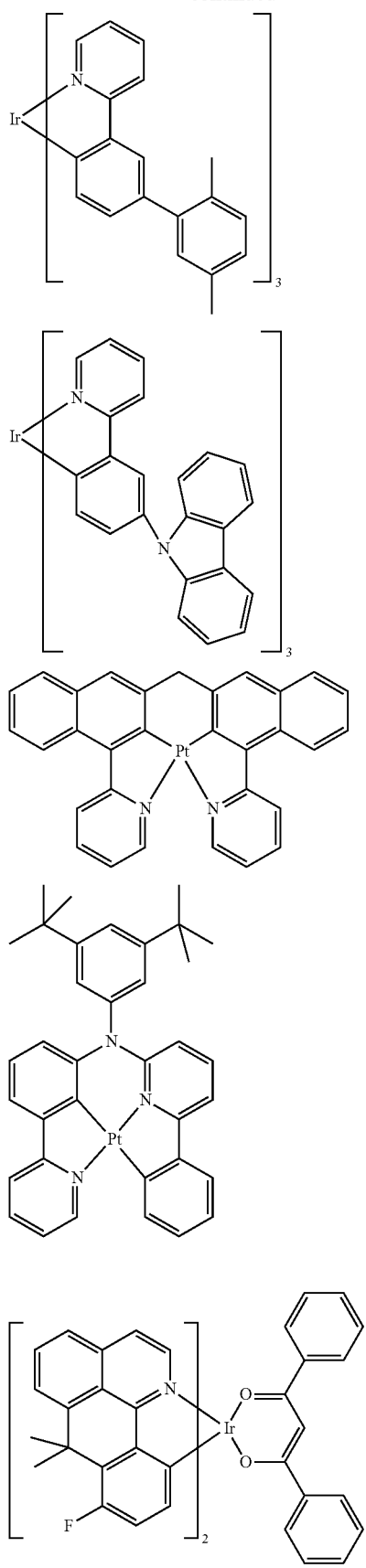
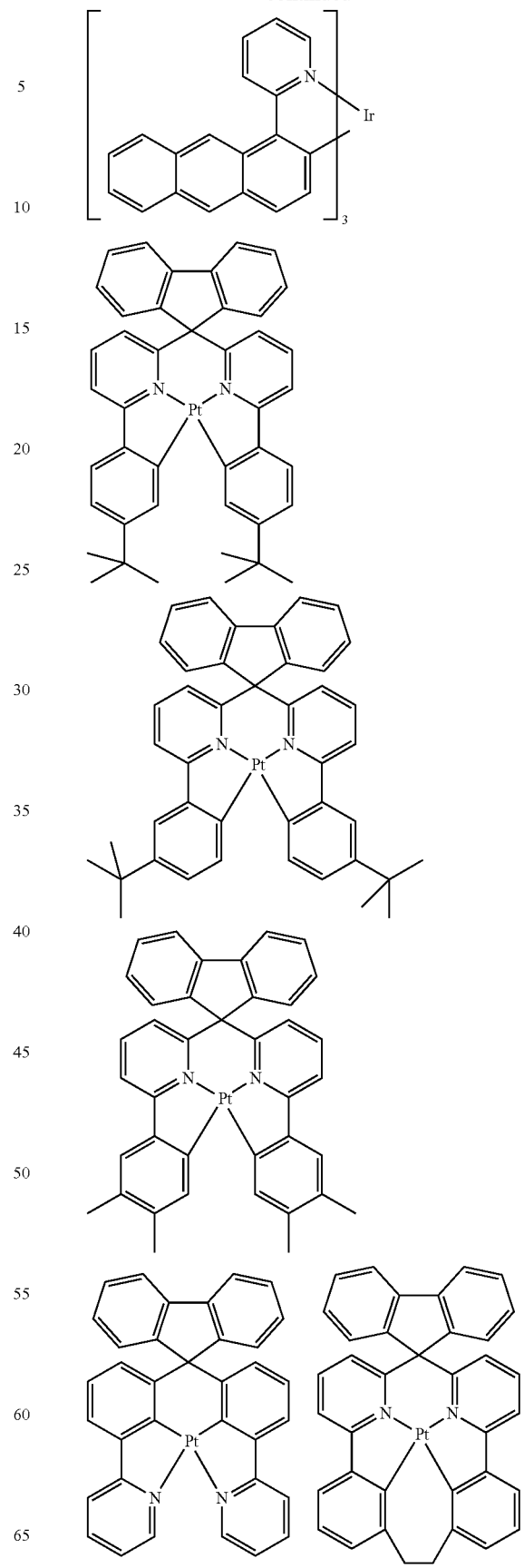

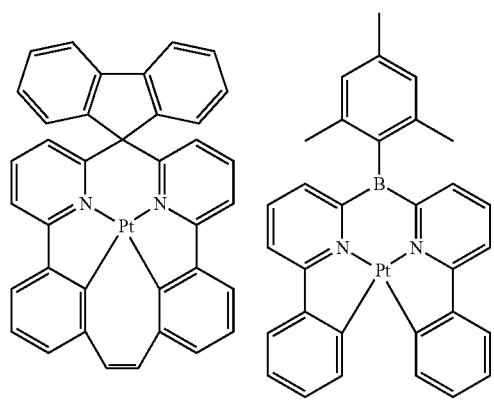
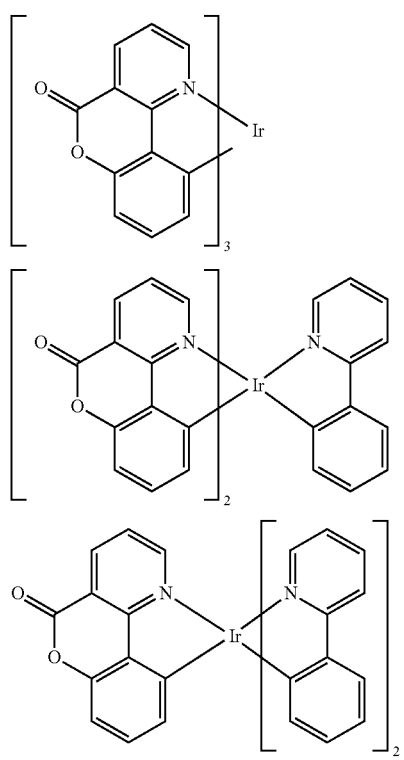
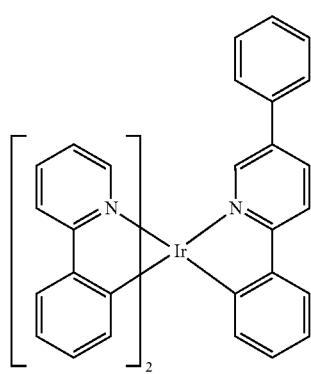
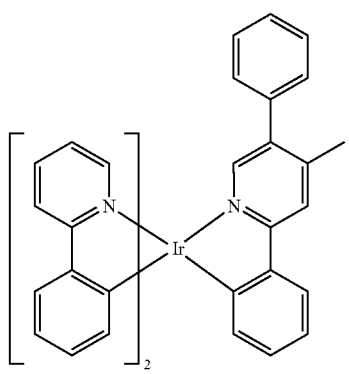
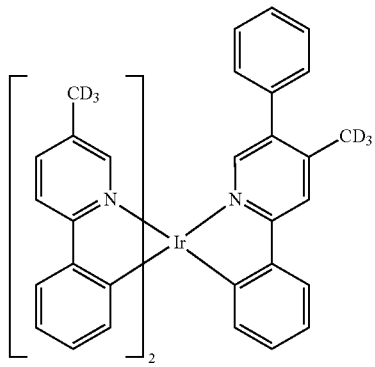
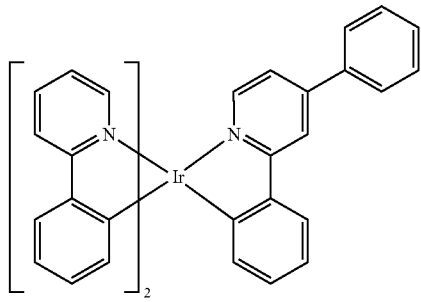
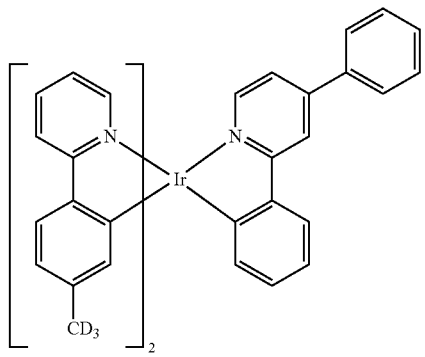
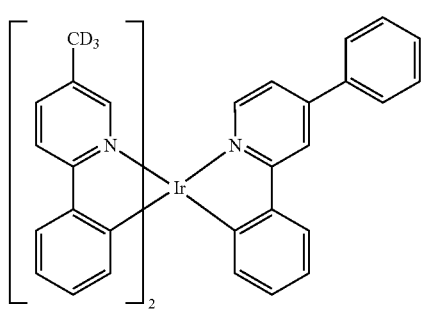

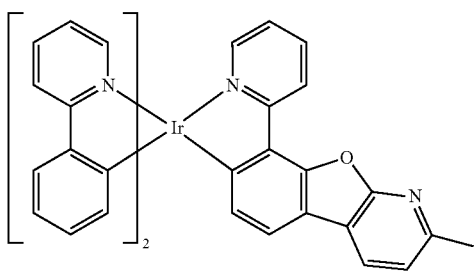
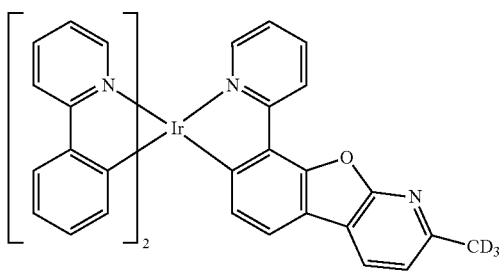
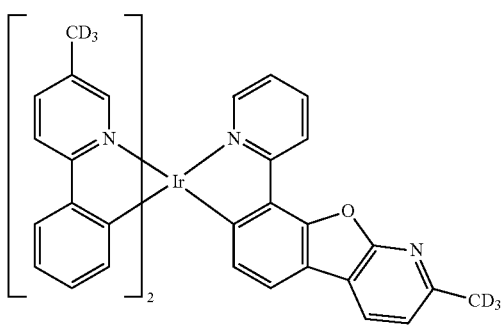
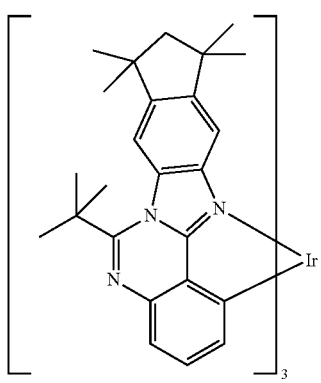
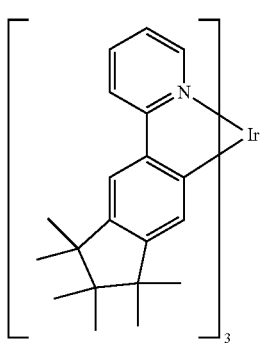
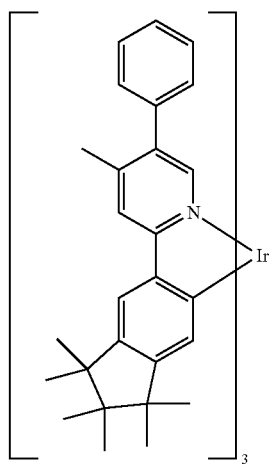
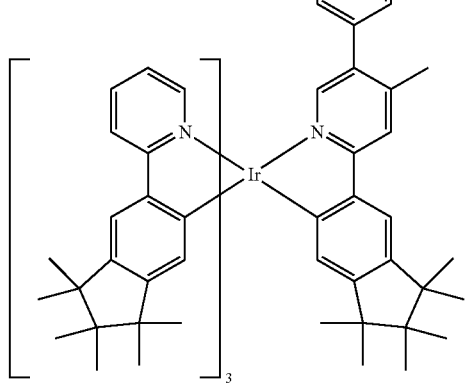
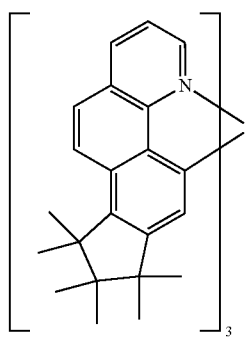
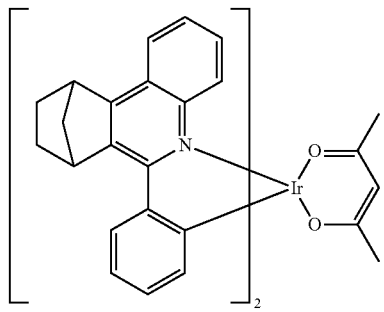

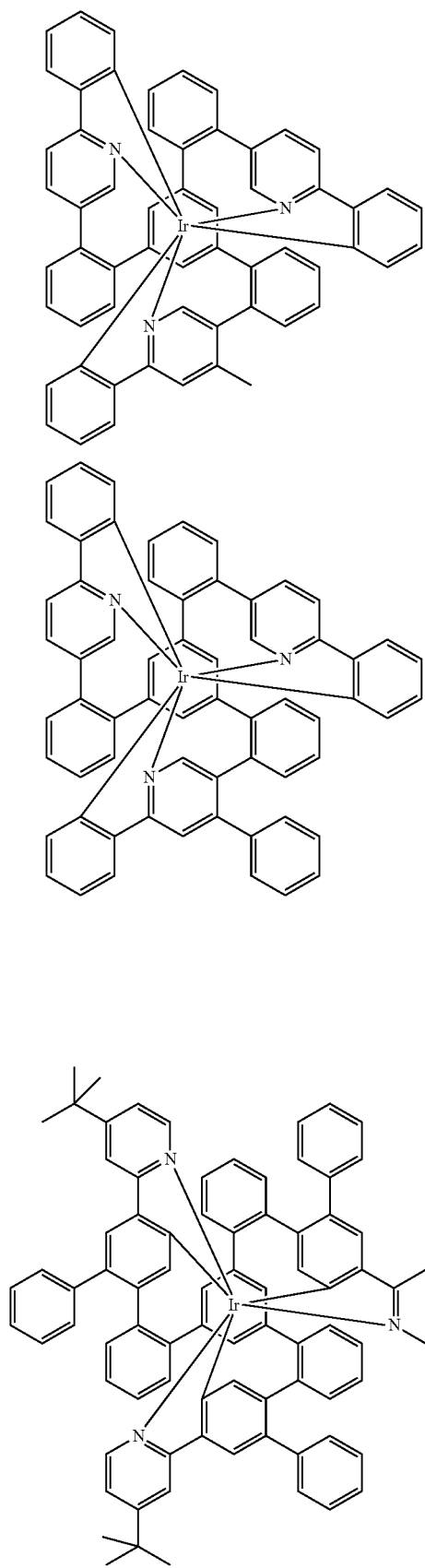
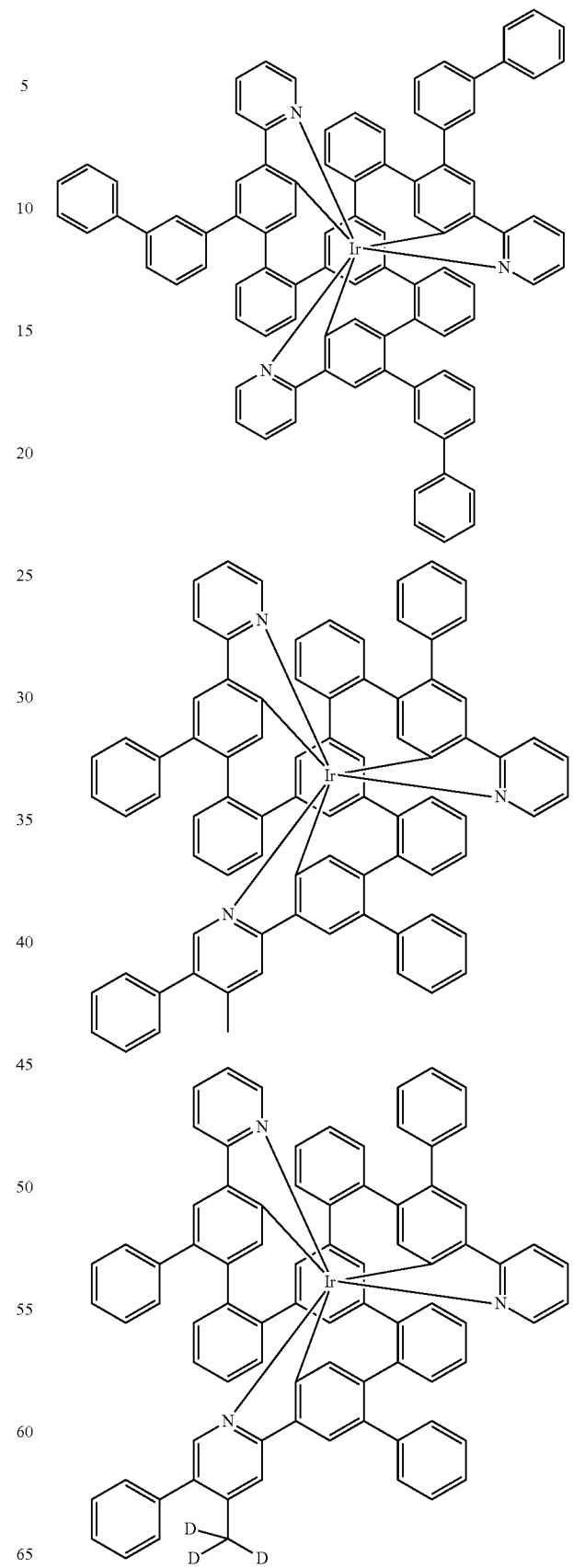

Further explicit examples of phosphorescent sensitizers are iridium complexes and platinum complexes containing carbene ligands, and the structures detailed in the overviews that follow, with homoleptic and heteroleptic complexes and meridional and facial isomers being suitable:

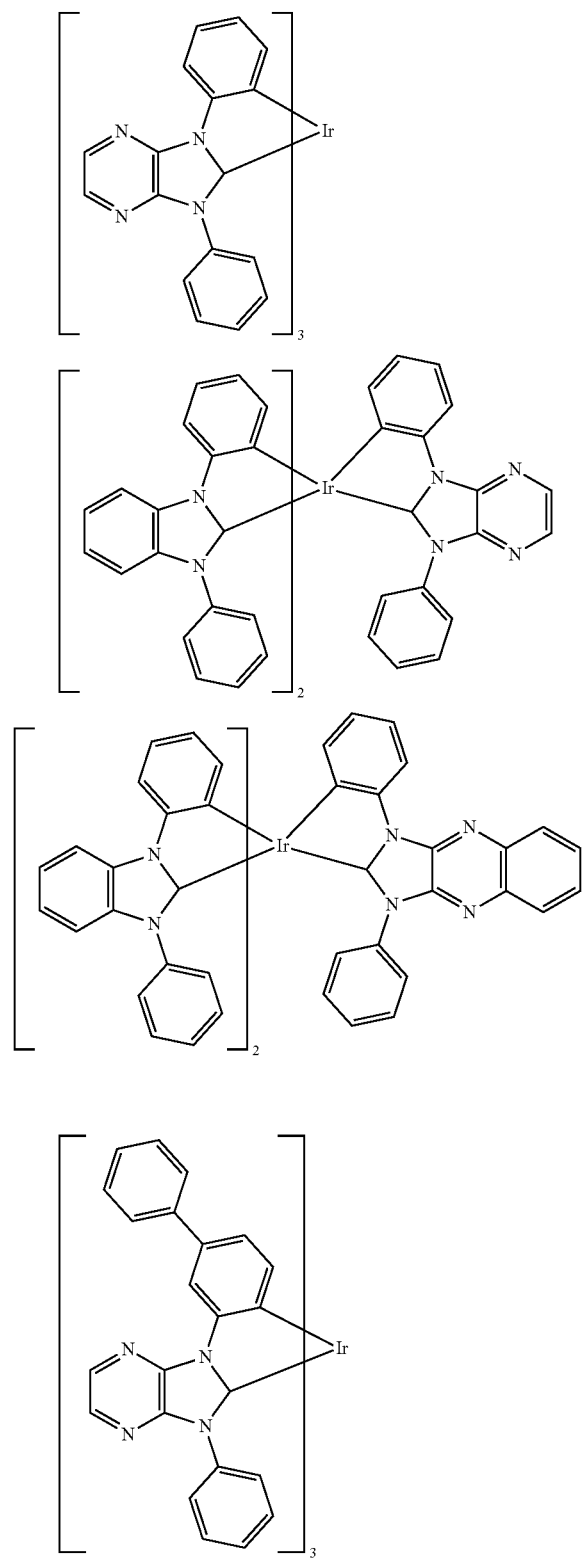

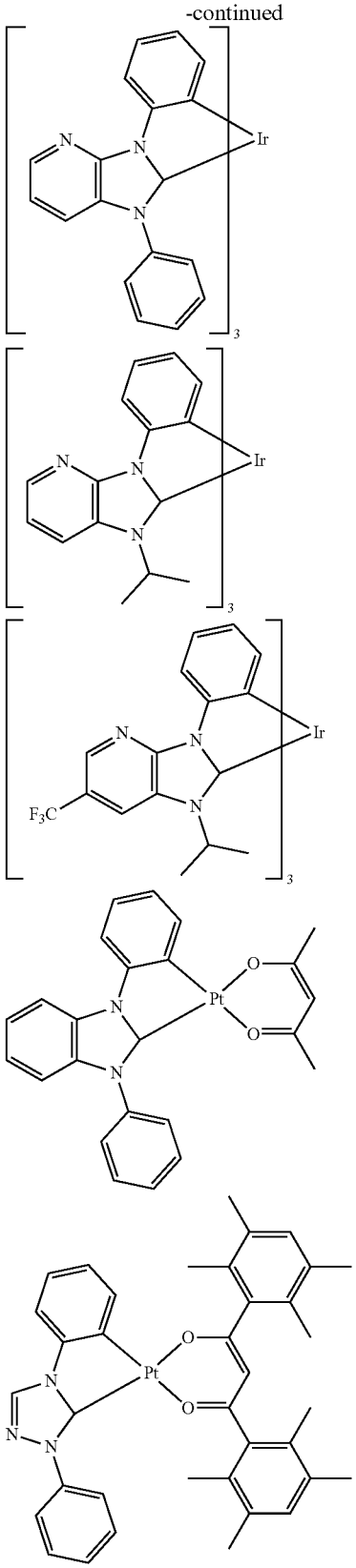

Further explicit examples of phosphorescent sensitizers are copper complexes and the structures detailed in the following overviews:

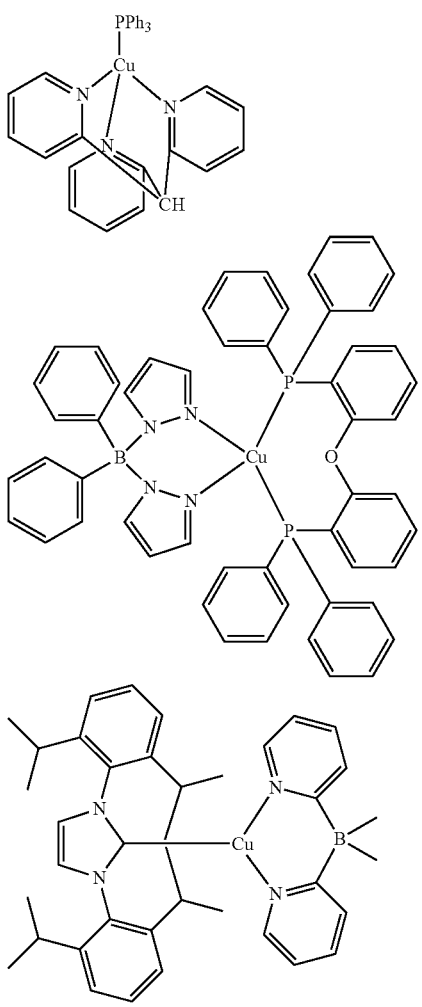

The fluorescent emitter of the present invention may in principle be any fluorescent compound. The person skilled in the art will have no difficulty in selecting the suitable emitters from a multitude of fluorescent emitters without great effort.

The fluorescent emitters are preferably purely organic compounds that do not contain any metal or metal ion or fluorescent metal complexes. If the fluorescent emitters are fluorescent metal complexes, these are more preferably the aluminium or copper complexes.

In one embodiment, the fluorescent emitters are fluorescent copper or aluminium complex which, in a further preference, is sterically shielded.

Very preferably, the fluorescent emitters are purely organic compounds devoid of metals or metal ions which, in a further preference, are sterically shielded.

There follows a more detailed description of the fluorescent emitter, also called fluorescent compound.

The fluorescent emitter is preferably an organic compound. An organic compound in the context of the present invention is a carbonaceous compound that does not contain any metals. More particularly, the organic compound is formed from the elements C, H, D, B, Si, N, P, O, S, F, Cl, Br and I. In a further embodiment of the invention, the fluorescent emitter may also be a fluorescent metal complex, for example an aluminium or copper complex.

A fluorescent compound in the context of the present invention is a compound capable of emitting light at room temperature under optical excitation in an environment as exists in the organic electroluminescent device, the emission being effected from an excited singlet state. This compound preferably has a luminescence quantum efficiency of at least 60%, more preferably of at least 80%, even more preferably of at least 90% and especially preferably of at least 95%. The luminescence quantum efficiency is determined in a solution in toluene. The way in which the determination of the luminescence quantum yield is conducted in the context of the present invention is described in detail in general terms in the "General description of the determination of the relevant parameters Part 4" of WO 2015/135624 A1.

In a preferred embodiment, the peak emission wavelength of the fluorescent compound is between 430 and 650 nm. The way in which the determination of the peak emission wavelength is conducted in the context of the present invention is described in the examples of the present invention.

Because of the difference in production of the organic electroluminescent device, the dopant concentration of the fluorescent compound in the case of production of the emitting layer by vapour deposition is reported in % by volume, and in the case of production of the emitting layer from solution in by weight.

In a preferred embodiment of the invention, in the case of production of the emitting layer by vapour deposition, the fluorescent compound is present in a dopant concentration of 0.1% to 25% by volume in the emitting layer, preferably of 1% to 20% by volume, more preferably of 3% to 10% by volume.

In a preferred embodiment of the invention, in the case of production of the emitting layer from solution, the fluorescent compound is present in a dopant concentration of 0.1% to 25% by weight in the emitting layer, preferably of 1% to 20% by weight, more preferably of 3% to 10% by weight.

It is possible here that, especially in the case of a low dopant concentration of the fluorescent compound, the OLED exhibits mixed emission composed of the fluorescent compound and residual emission of the phosphorescent compound. This can also be utilized in a controlled manner to generate mixed colors.

Base structures used for the fluorescent compound may be any compounds as used according to prior art for fluorescent OLEDs.

The fluorescent emitter is preferably selected from the following group of fluorescent compounds: styrylamines, indenofluorenes, polyaromatic compounds, anthracenes, tetracenes, xanthenes, perylenes, phenylenes, fluorenes, arylpyrenes, arylenevinylenes, rubrenes, coumarins, rhodamines, quinacridones, dicyanomethylenepyrans, thiopyrans, polymethines, pyrylium and thiapyrylium salts, periflanthenes, indenoperylenes, bis(azinyl)imineborons, bis(azinyl)methines, carbostyryls, monostyrylamines, distyrylamines, tristyrylamines, tetrastyrylamines, styrylphosphines, styryl ethers, arylamines, indenofluoreneamines and indenofluorenediamines, benzoindenofluoreneamines, benzoindenofluorenediamines, dibenzoindenofluoreneamines, dibenzoindenofluorenediamines, substituted or unsubstituted tristilbeneamines, distyrylbenzenes and distyrylbiphenyls, triarylamines, triazolo compounds, naphthalenes, phenanthrenes, pyrenes, triazines, chrysenes, decacyclenes, coronenes, tetraphenylcyclopentadienes, pentaphenylcyclopentadienes, spirofluorenes, pyrans, oxazones, benzoxazoles, benzothiazoles, benzimidazoles, pyrazines, cinnamic esters, diketopyrrolopyrroles and acridones.

Further preferred fluorescent emitters are disclosed, for example, in C. H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

The steric shielding of these compounds is accomplished by electronically inert, sterically demanding substituents which surround the electronically active core of the fluorescent compound and thus shield it substantially from contact with adjacent molecules in the layer.

The degree of steric shielding can be determined by means of a shielding parameter SF.

As described above, the fluorescent core used in the fluorescent compound may be any base structure as used customarily as a fluorescent emitter in organic electroluminescent devices. Preferred fluorescent compounds are rigid π systems substituted by large aliphatic or cycloaliphatic radicals. In addition, aromatic substituents which may be substituted by aliphatic or cycloaliphatic radicals are also an option when they are arranged in steric terms such that they are not active groups in the context of the present invention, i.e. the proportion thereof in the relevant molecular orbitals is below a limit as described below. By contrast, for example, arylamino substituents or heteroaryl groups are too highly involved in HOMO (highest occupied molecular orbital) or LUMO (lowest unoccupied molecular orbital) and are therefore unsuitable as shielding groups.

Examples of suitable aromatic base skeletons of fluorescent compounds are the groups of the formulae (1) to (50) shown below:

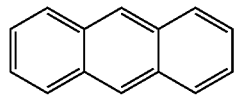

Formula (1)

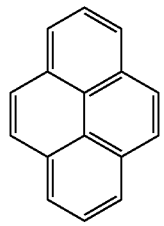

Formula (2)

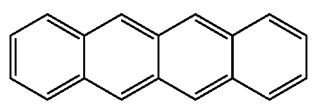

Formula (3)

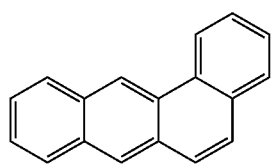

Formula (4)

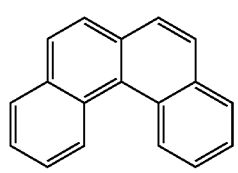

Formula (5)

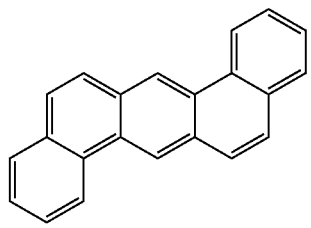

Formula (6)

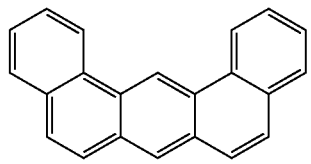

Formula (7)

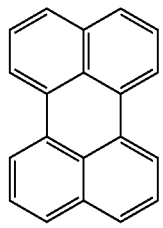

Formula (8)

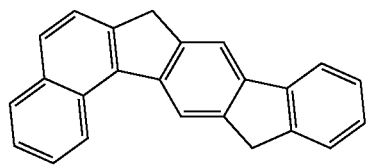

Formula (9)

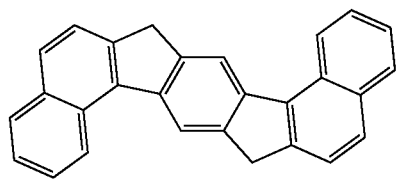

Formula (10)

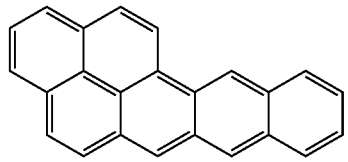

Formula (11)

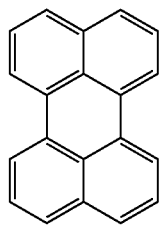

Formula (12)

Formula (13)
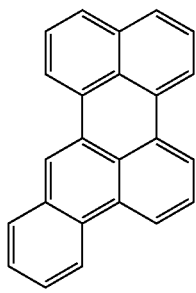
Formula (14)
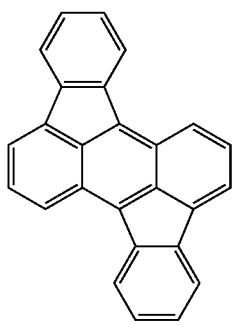
Formula (15)
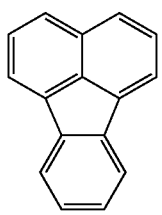
Formula (16)
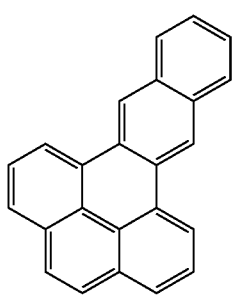
Formula (17)
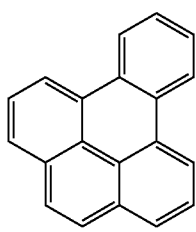
Formula (18)
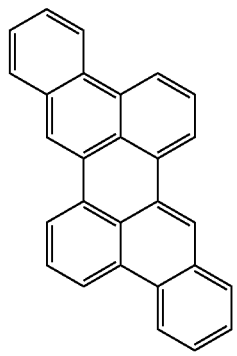
Formula (19)
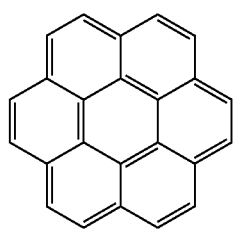
Formula (20)
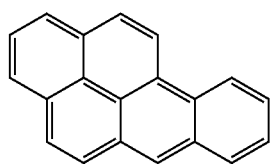
Formula (21)
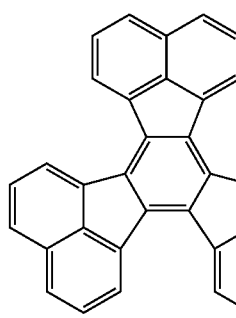
Formula (22)
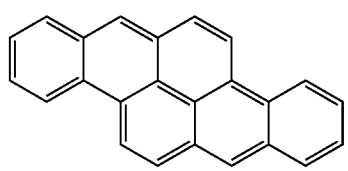
Formula (23)
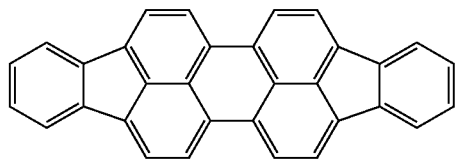
Formula (24)
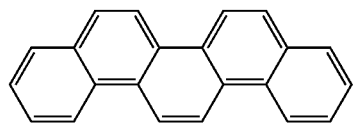

Formula (25)
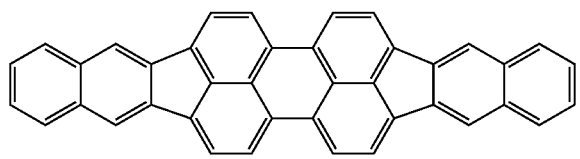
Formula (26)
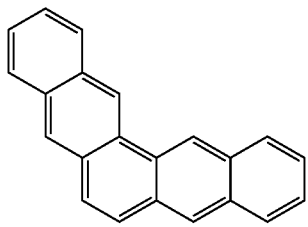
Formula (27)
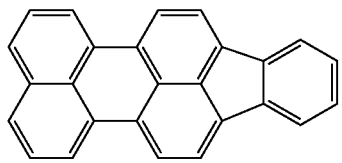
Formula (28)
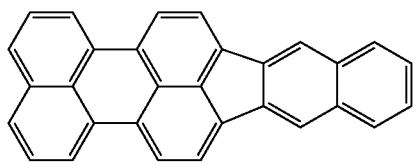
Formula (29)
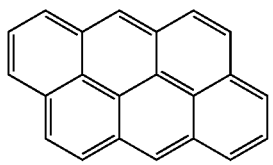
Formula (30)
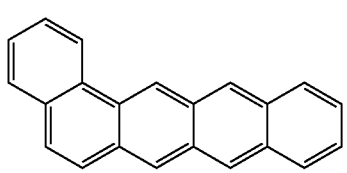
Formula (31)
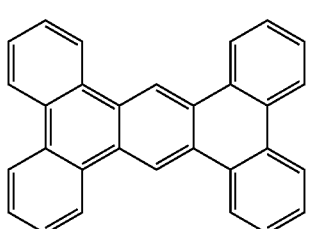
Formula (32)
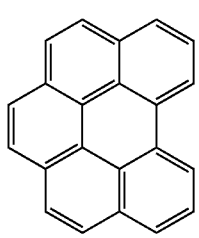
Formula (33)
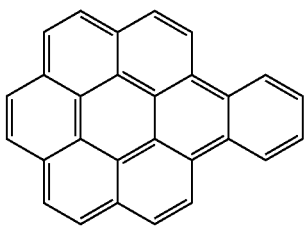
Formula (34)
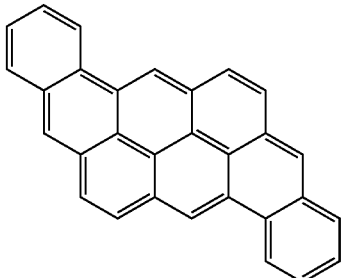
Formula (35)
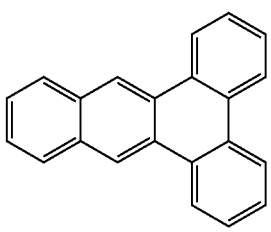
Formula (36)
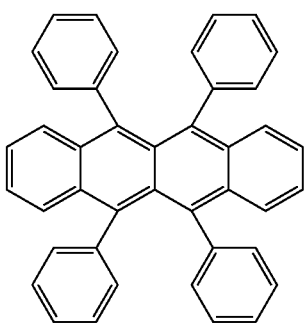
Formula (37)
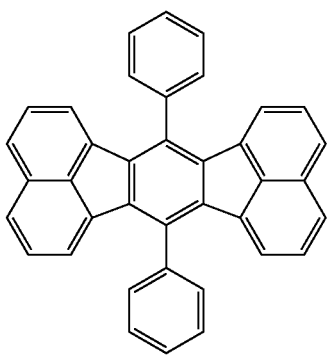

Formula (38)
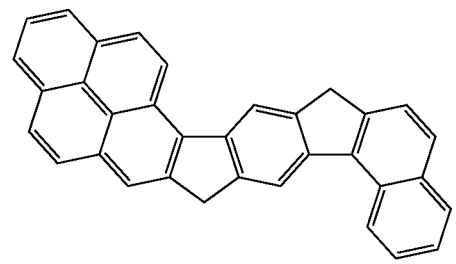
Formula (39)
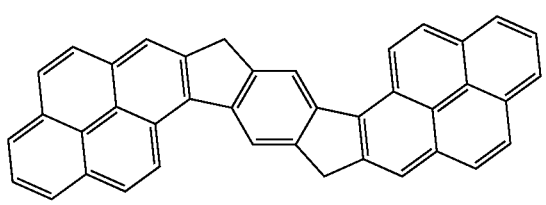
Formula (40)
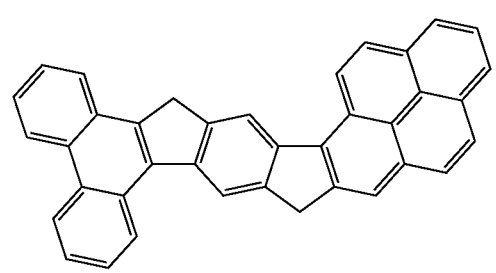
Formula (41)
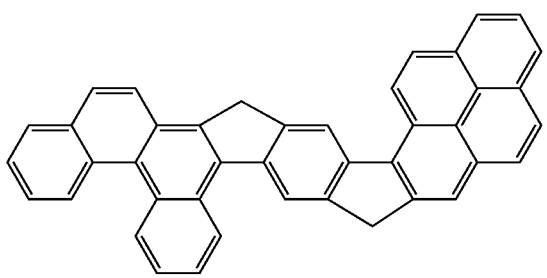
Formula (42)
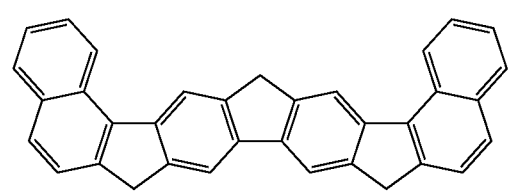
Formula (43)
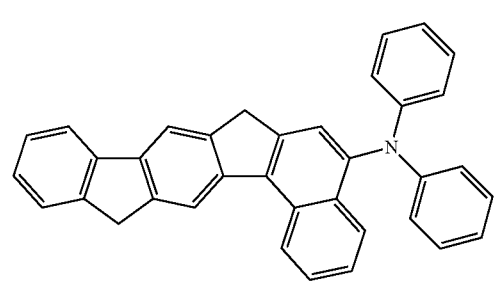
Formula (44)
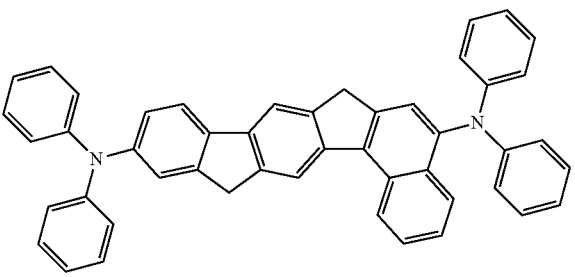
Formula (45)
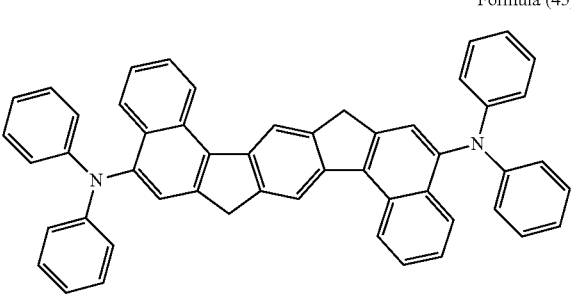
Formula (46)
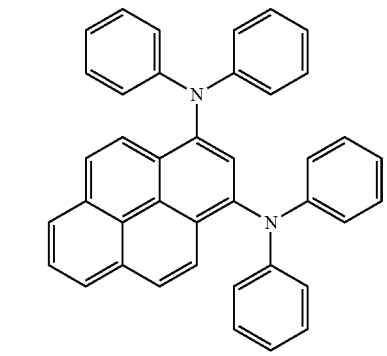
Formula (47)
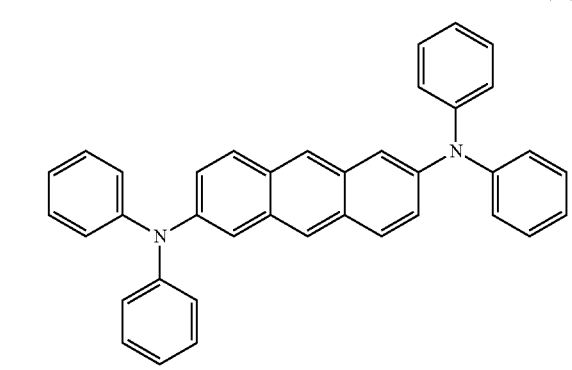
Formula (48)

Formula (49)

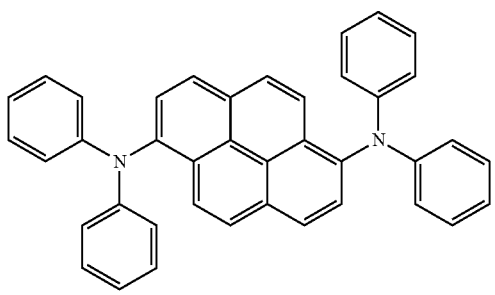

Formula (50)

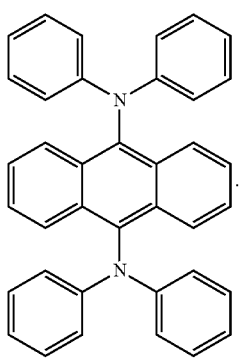

Examples of suitable heteroaromatic base skeletons of fluorescent compounds are the abovementioned groups of the formulae (1) to (50) in which one, two, three or four carbon atoms in the fused aromatic nucleus are replaced by nitrogen. Preferably, one, two or three carbon atoms are replaced by nitrogen, oxygen or boron, more preferably one or two carbon atoms and most preferably exactly one carbon atom.

Examples of suitable heteroaromatic base skeletons of fluorescent compounds are additionally the groups of the formulae (51) to (73) shown below:

Formula (51)

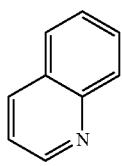

Formula (52)

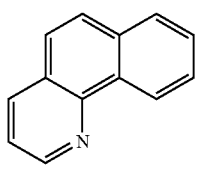

Formula (53)

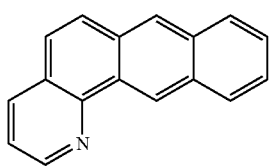

Formula (54)

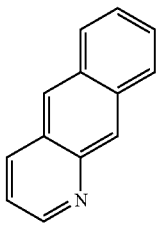

Formula (55)

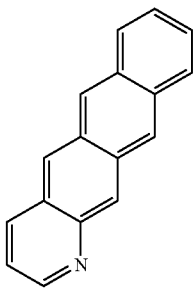

Formula (56)

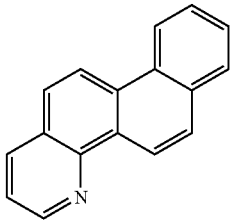

Formula (57)

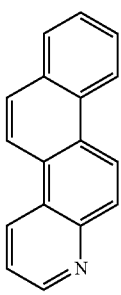

Formula (58)

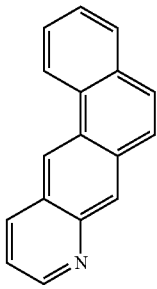

Formula (59)

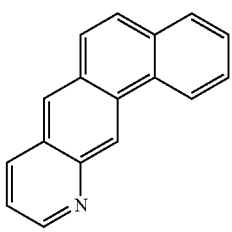

Formula (60)
Formula (61)
Formula (62)
Formula (63)
Formula (64)
Formula (65)
Formula (66)
Formula (67)
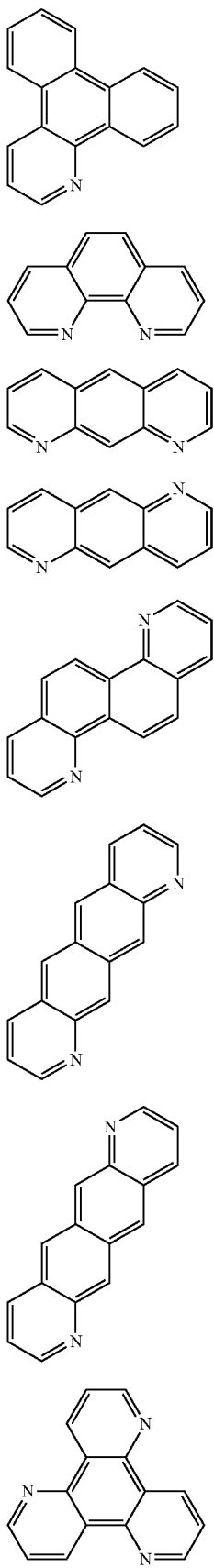
Formula (68)
Formula (69)
Formula (70)
Formula (71)
Formula (72)
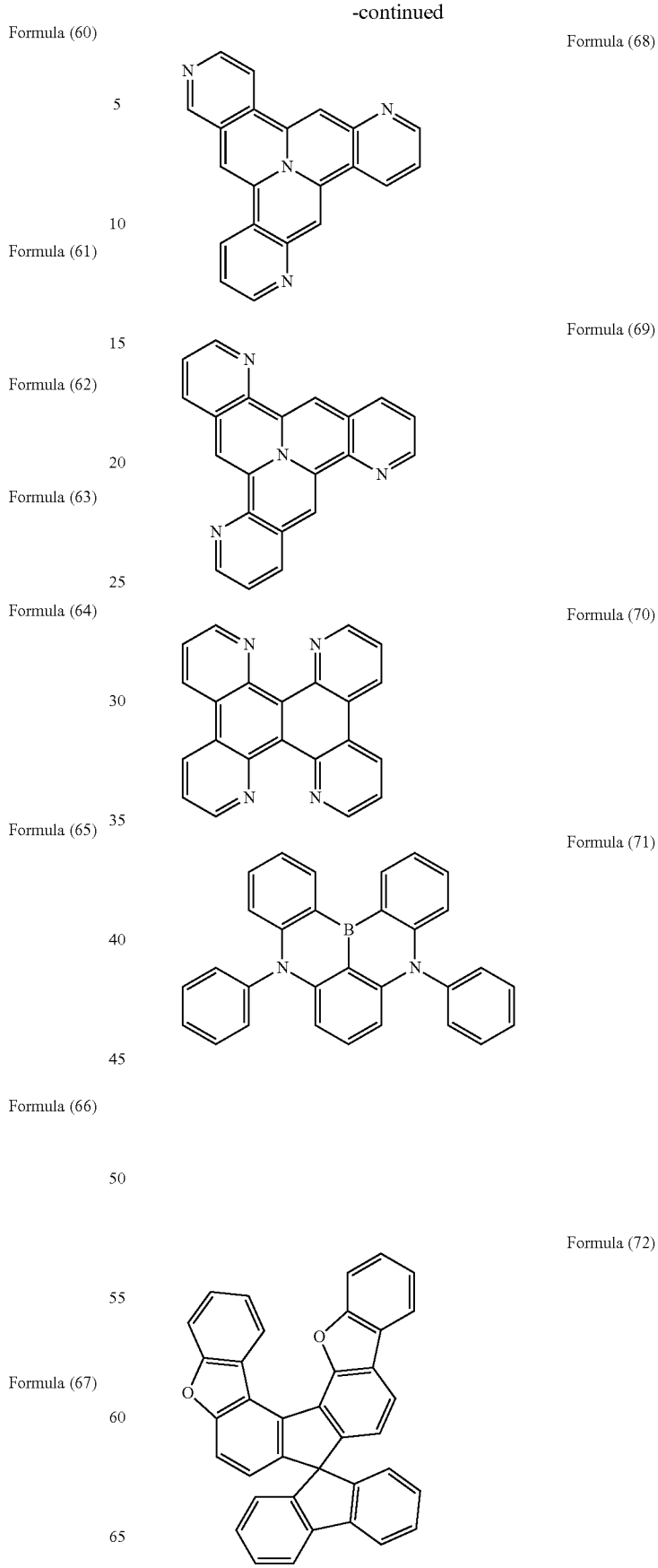

Formula (73)

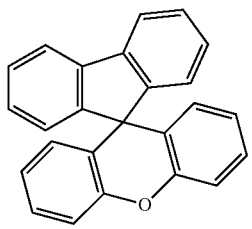

These structures, as described above, are substituted by sterically demanding substituents and may also be substituted by further substituents that can not be regarded as being sterically demanding, provided that these substituents are not electronically active or are substituted in turn by sterically shielded substituents.

There follows a description of suitable sterically demanding substituents which can be used in order to substitute the fluorescent cores, for example the abovementioned aromatics and heteroaromatics, and hence to arrive at sterically shielded fluorescent compounds.

Suitable sterically demanding substituents are, for example, alkyl groups, especially having 3 to 20 carbon atoms, preferably having 4 to 10 carbon atoms, in which hydrogen atoms may also be replaced by F, alkoxy groups, especially having 3 to 20 carbon atoms, preferably having 4 to 10 carbon atoms, aralkyl groups, especially having 7 to 30 carbon atoms, and aromatic ring systems, especially having 6 to 30 carbon atoms, where it is also possible for the aryl groups in the aralkyl groups and aromatic ring systems to be substituted by one or more alkyl groups having 1 to 10 carbon atoms. It is also possible here for a plurality of adjacent substituents to form a ring system with one another.

When the substituent is an aralkyl group or an aromatic ring system, it is preferable when these do not have any fused aryl groups having more than 10 carbon atoms in which aryl groups are fused directly to one another via a common edge. More preferably, it does not have any fused aryl groups at all in which aryl groups are fused directly to one another via a common edge. Thus, it is preferable when the aromatic ring system, for example, does not have any anthracene or pyrene groups, and particularly preferable when the aromatic ring system does not have any naphthalene groups either. By contrast, it may have, for example, biphenyl or terphenyl groups, since these do not have any fused aryl groups. In addition, it may also have, for example, fluorene or spirobifluorene groups, since no aryl groups are fused directly to one another via a common edge in these groups.

When the sterically demanding substituent is an alkyl group, this alkyl group preferably has 4 to 10 carbon atoms. Preference is given to a secondary, tertiary or cyclic alkyl group in which the secondary or tertiary carbon atom is either bonded to the fluorescent base skeleton directly or bonded to the fluorescent base skeleton via a CH$_2$ group. More preferably, this alkyl group is selected from the structures of the following formulae (R-1) to (R-33):

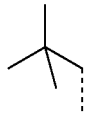

(R-1)

(R-2)

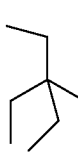

(R-3)

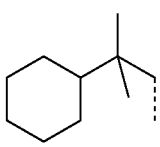

(R-4)

(R-5)

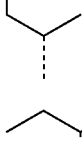

(R-6)

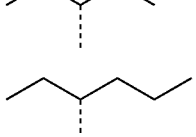

(R-7)

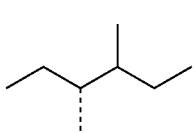

(R-8)

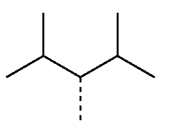

(R-9)

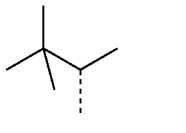

(R-10)

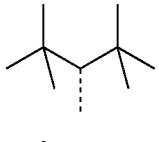

(R-11)

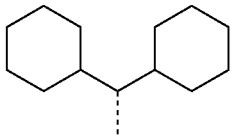

(R-12)

(R-13)

(R-14)

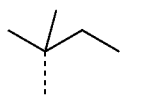 (R-15)

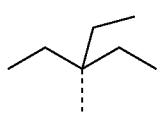 (R-16)

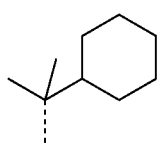 (R-17)

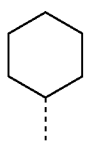 (R-18)

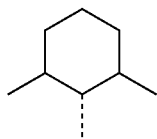 (R-19)

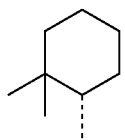 (R-20)

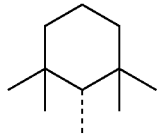 (R-21)

 (R-22)

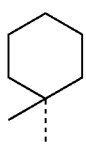 (R-23)

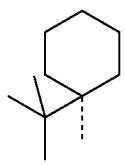 (R-24)

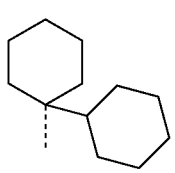 (R-25)

 (R-26)

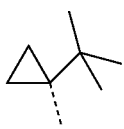 (R-27)

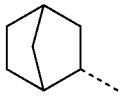 (R-28)

 (R-29)

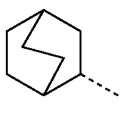 (R-30)

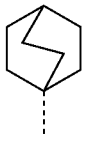 (R-31)

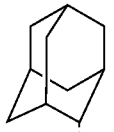 (R-32)

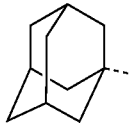 (R-33)

where the dotted bond indicates the linkage of these groups to the fluorescent base skeleton.

When the sterically demanding substituent is an alkoxy group, this alkoxy group preferably has 3 to 10 carbon atoms and is preferably branched or cyclic. Preferably, this alkoxy group is selected from the structures of the following formulae (R-34) to (R-47):

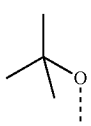 (R-34)

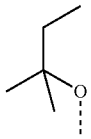 (R-35)

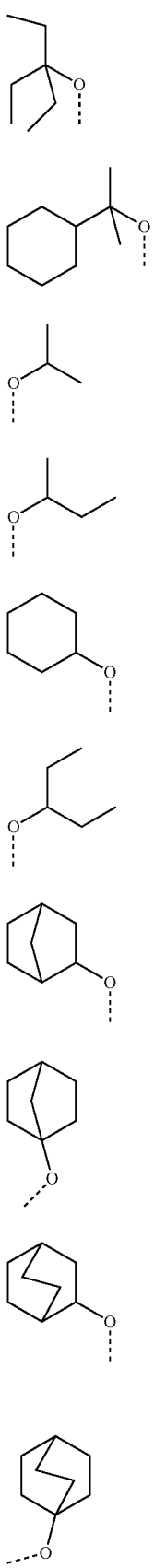
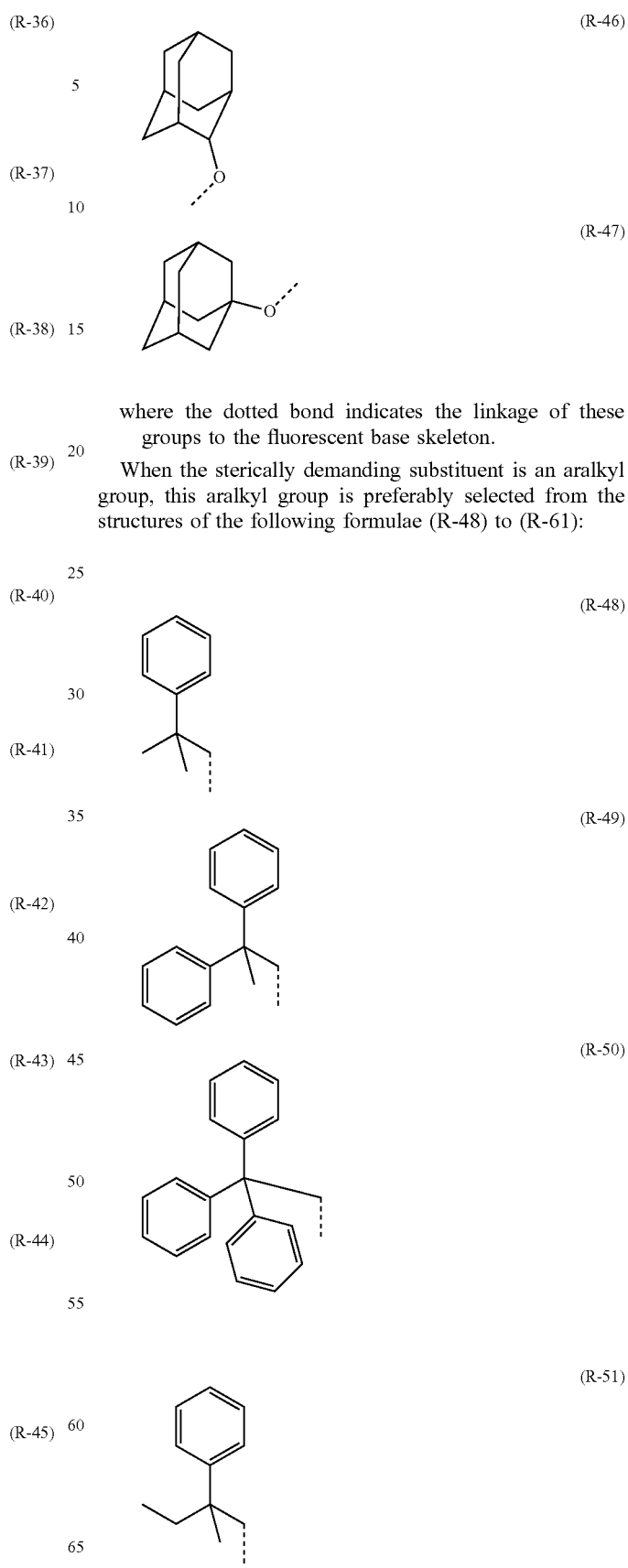
where the dotted bond indicates the linkage of these groups to the fluorescent base skeleton.
When the sterically demanding substituent is an aralkyl group, this aralkyl group is preferably selected from the structures of the following formulae (R-48) to (R-61):

(R-52)

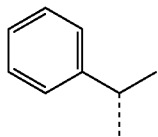

where the dotted bond indicates the linkage of these groups to the fluorescent base skeleton and the phenyl groups may each be substituted by one or more $R^a$ radicals, where:

$R^a$ is the same or different at each instance and is selected from the group consisting of H, D, F, a straight-chain alkyl group having 1 to 40 carbon atoms or a branched or cyclic alkyl group having 3 to 40 carbon atoms, each of which may be substituted by one or more $R^b$ radicals, an aromatic ring system having 5 to 60 aromatic ring atoms, each of which may be substituted by one or more $R^b$ radicals, or an aralkyl group which has 5 to 60 aromatic ring atoms and may be substituted by one or more $R^b$ radicals, where it is optionally possible for two or more adjacent $R^a$ substituents to form a ring system which may be substituted by one or more $R^b$ radicals;

$R^b$ is selected from the group consisting of H, D, F, an aliphatic hydrocarbyl radical having 1 to 20 carbon atoms, an aromatic ring system having 5 to 30 aromatic ring atoms, where two or more adjacent $R^b$ substituents together may form a ring system;

Particularly good performance data of electronic devices, especially very good efficiencies, are achieved when the fluorescent compound is sterically shielded with an aromatic ring system. When the sterically demanding substituent is an aromatic ring system, this aromatic ring system has 6 to 60 and preferably 6 to 30 aromatic ring atoms, more preferably 6 to 24 aromatic ring atoms. In addition, this aromatic ring system contains preferably only phenyl groups. In this case, the aromatic ring system is preferably selected from the structures of the following formulae (R-62) to (R-76):

(R-62)

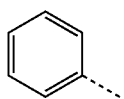

(R-63)

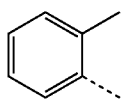

(R-64)

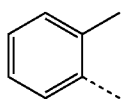

(R-65)

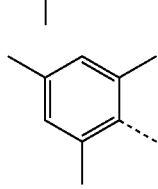

(R-66)

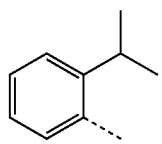

(R-67)

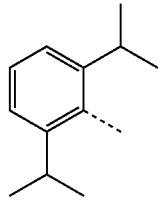

(R-68)

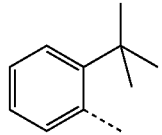

(R-69)

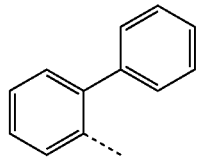

(R-70)

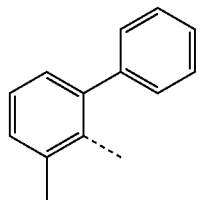

(R-71)

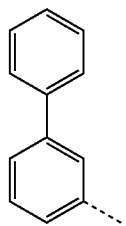

(R-72)

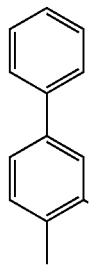

(R-73) 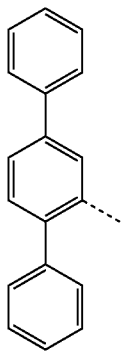

(R-74) 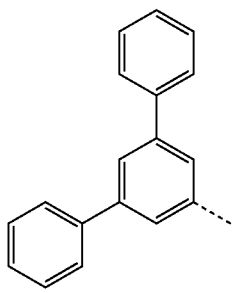

(R-75) 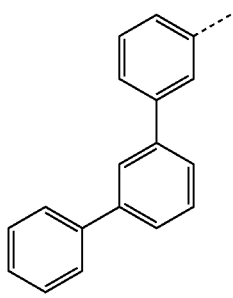

(R-76) 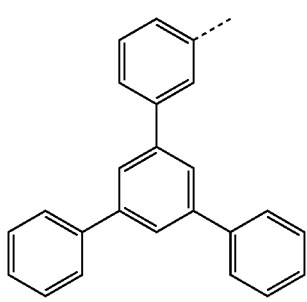

(R-77) 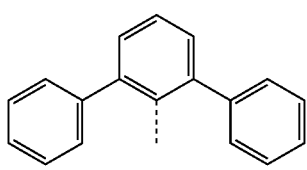

(R-78) 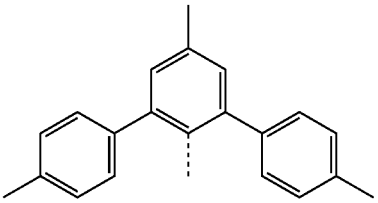

(R-79) 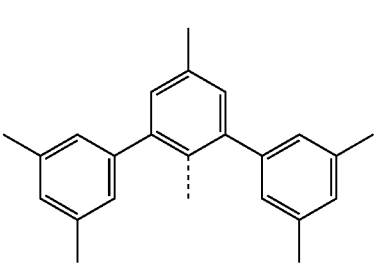

(R-80) 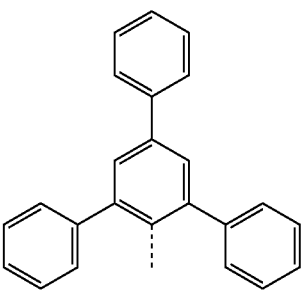

where the dotted bond indicates the linkage of these groups to the fluorescent base skeleton and the phenyl groups may each be substituted by one or more $R^a$ radicals, where $R^a$ is as defined above.

Further examples of groups that are suitable for steric shielding of the fluorescent compound and preferred embodiments of the substituents $R^a$ and $R^b$ are disclosed in WO 2015/135624.

In a very particularly preferred embodiment of the present invention, the fluorescent emitter is a purely organic compound devoid of metals or metal ions, selected from the group of the polycyclic fused aromatics having 6 to 60 aromatic ring atoms.

Among the polycyclic fused aromatics, preference is given here especially to pyrenes, perylenes, rubrenes, anthracenes, tetracenes, phenanthrenes, fluorenes and indenofluorenes, where the aromatic systems may preferably be substituted by aromatic ring systems as already set out in detail elsewhere. The perylenes and rubrenes are the most preferred in the context of the present invention.

Some preferred substituted perylenes that are particularly suitable for use as shielded fluorescent emitters are shown by way of example hereinafter:

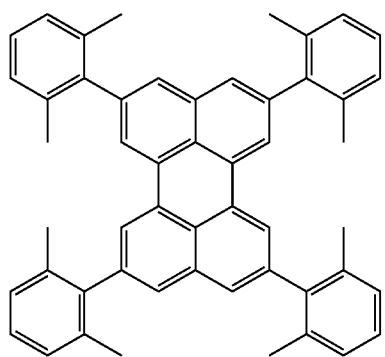
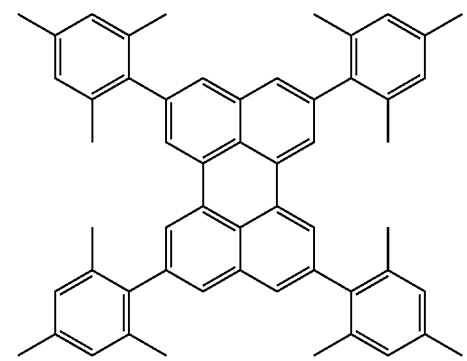
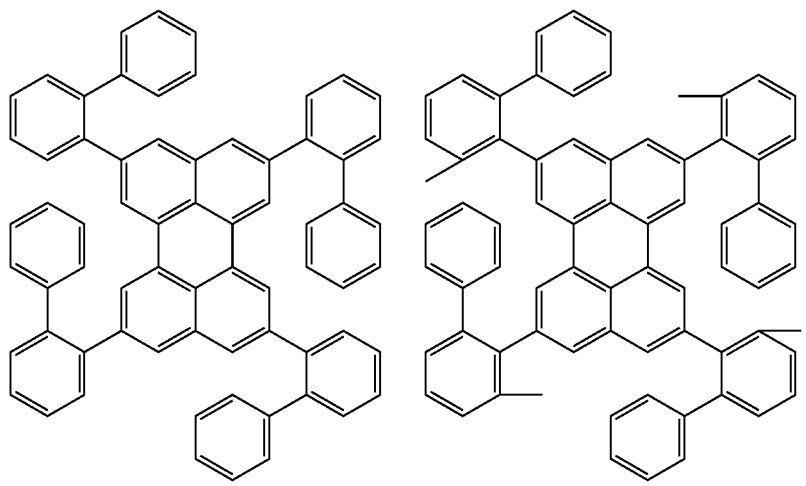
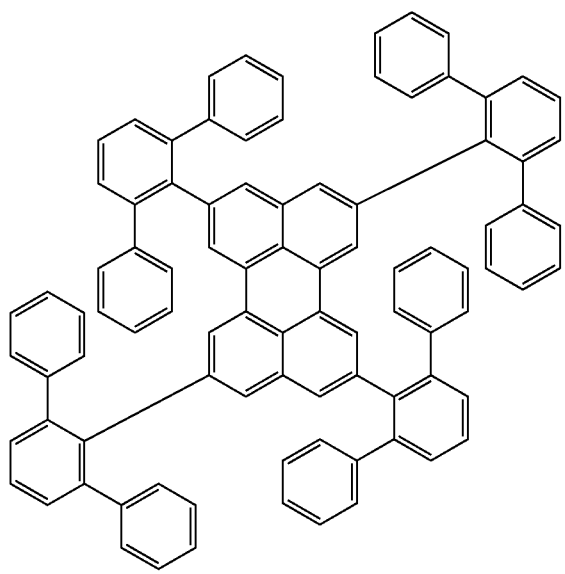

-continued
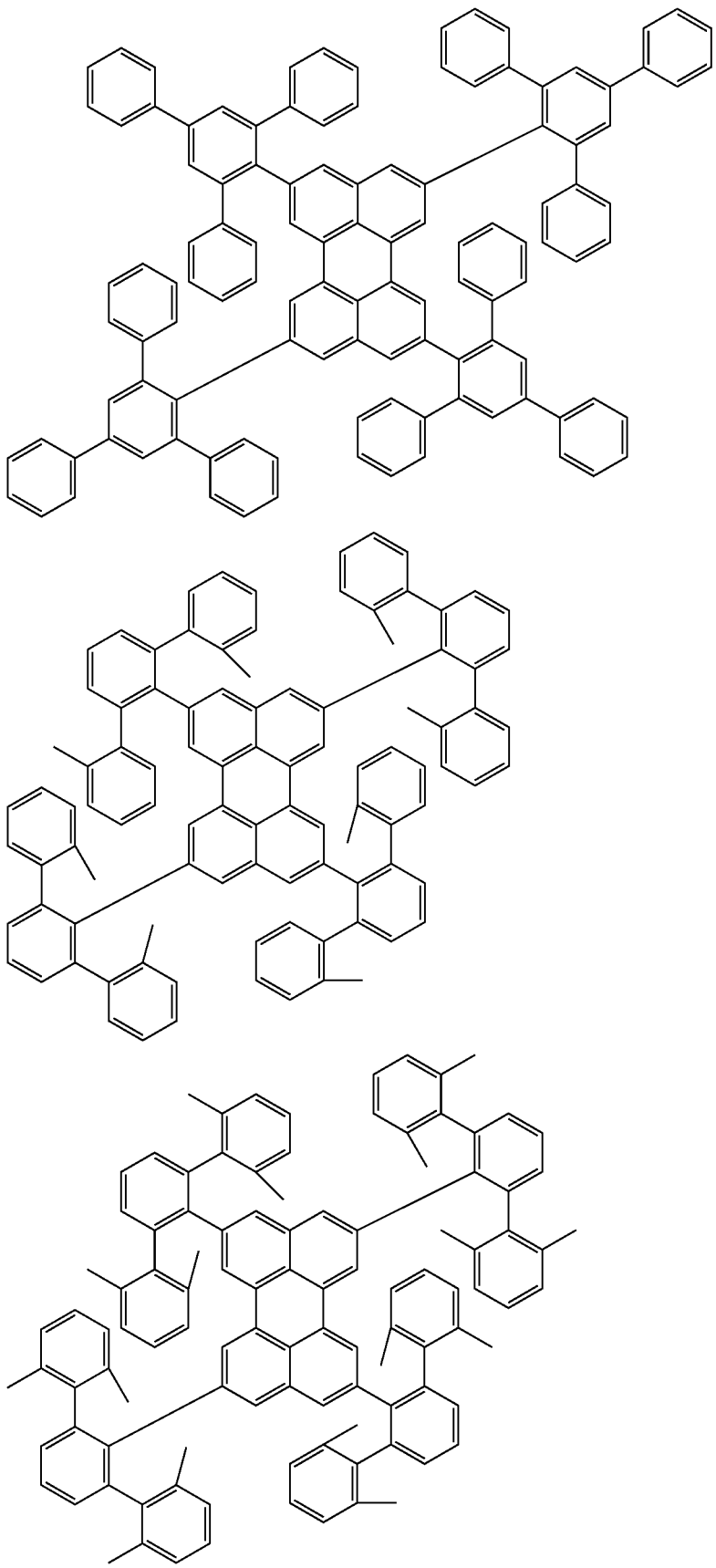

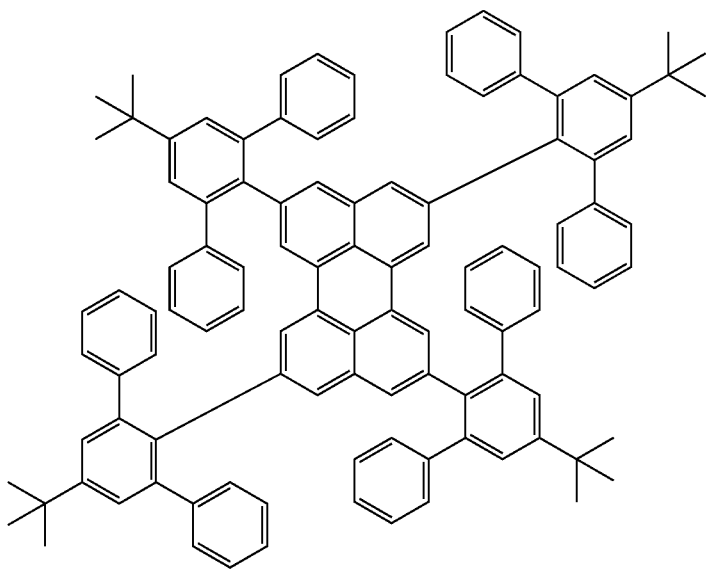
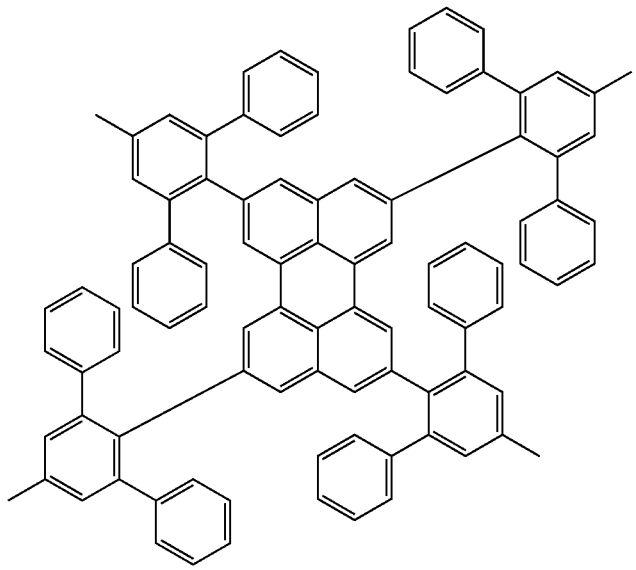
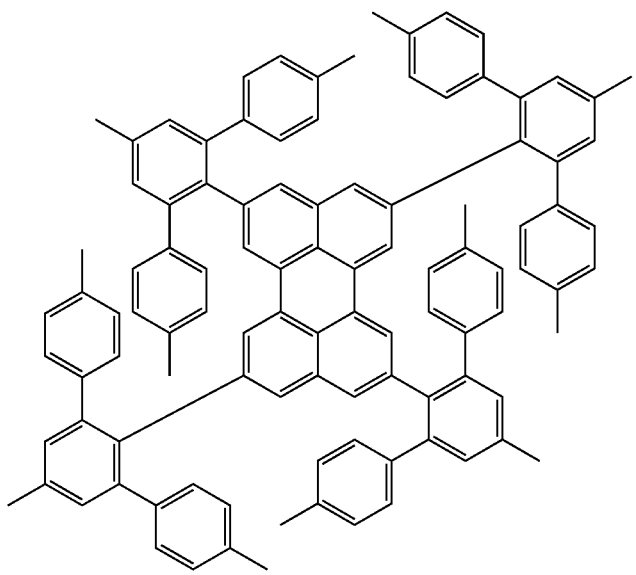

-continued
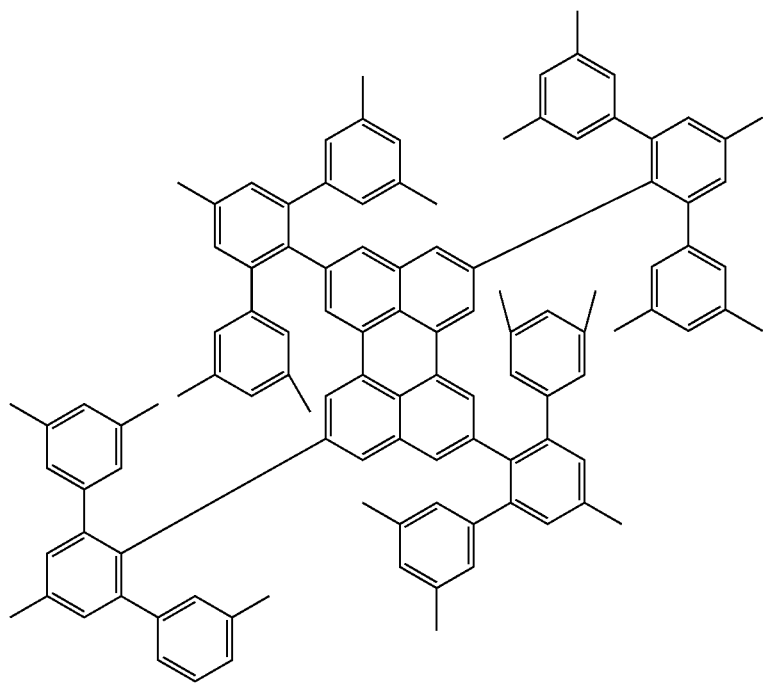
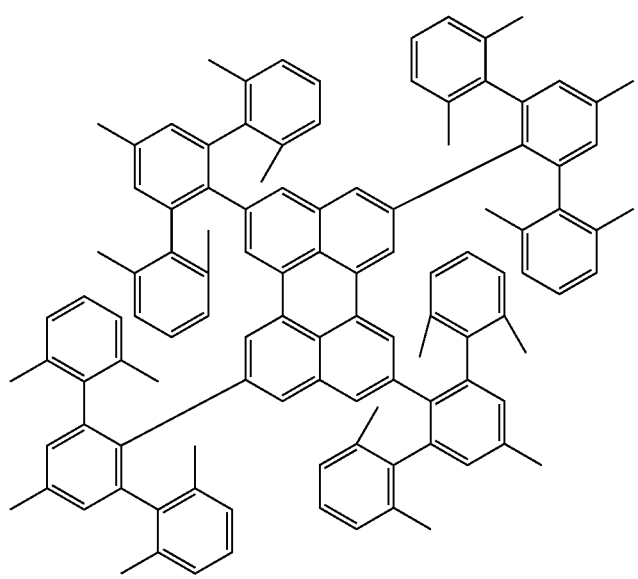

-continued
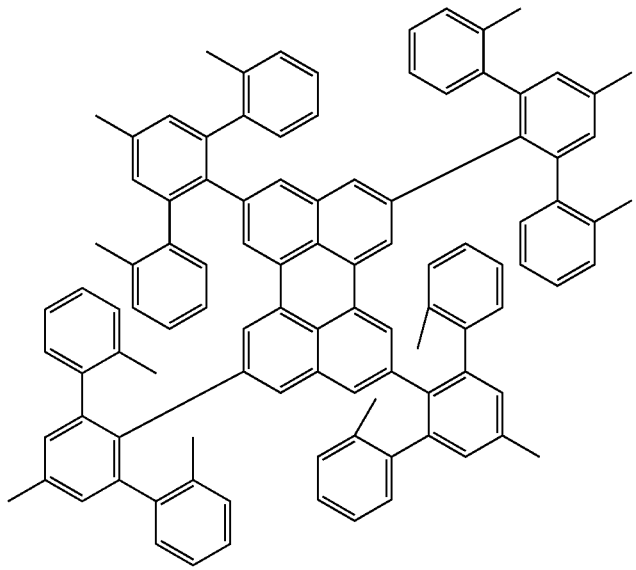
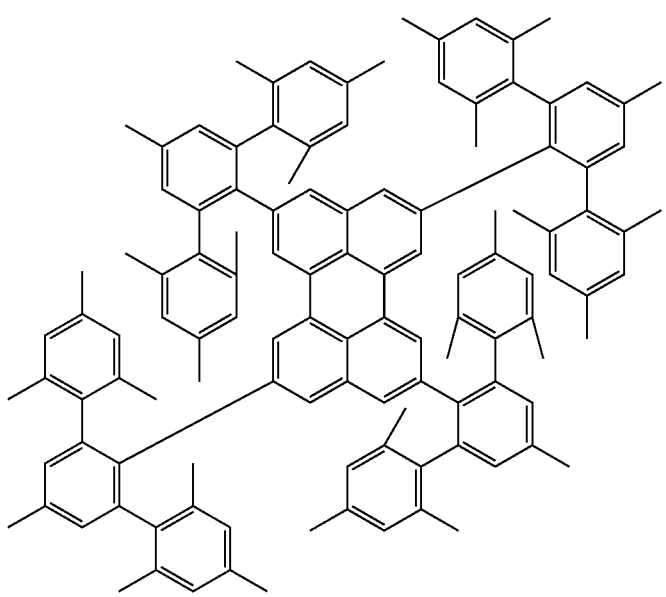

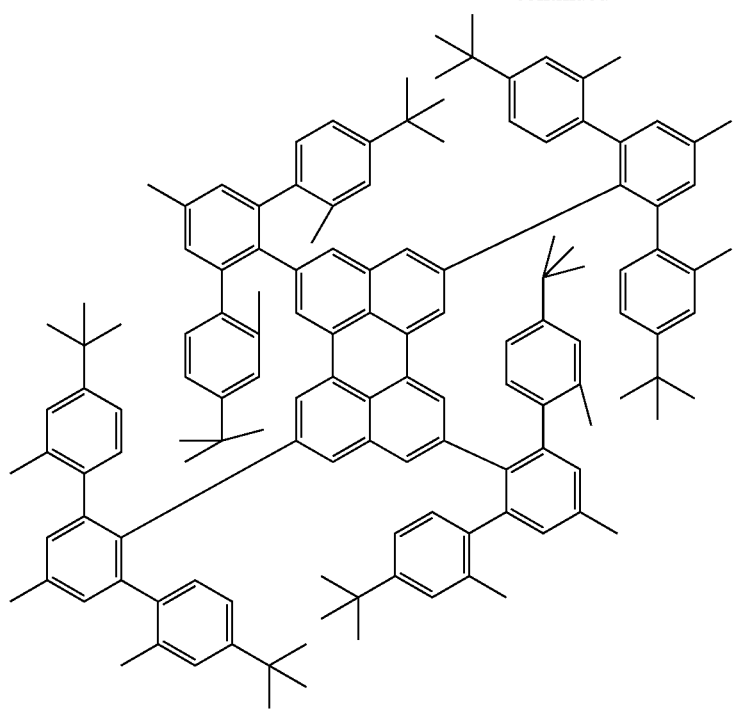
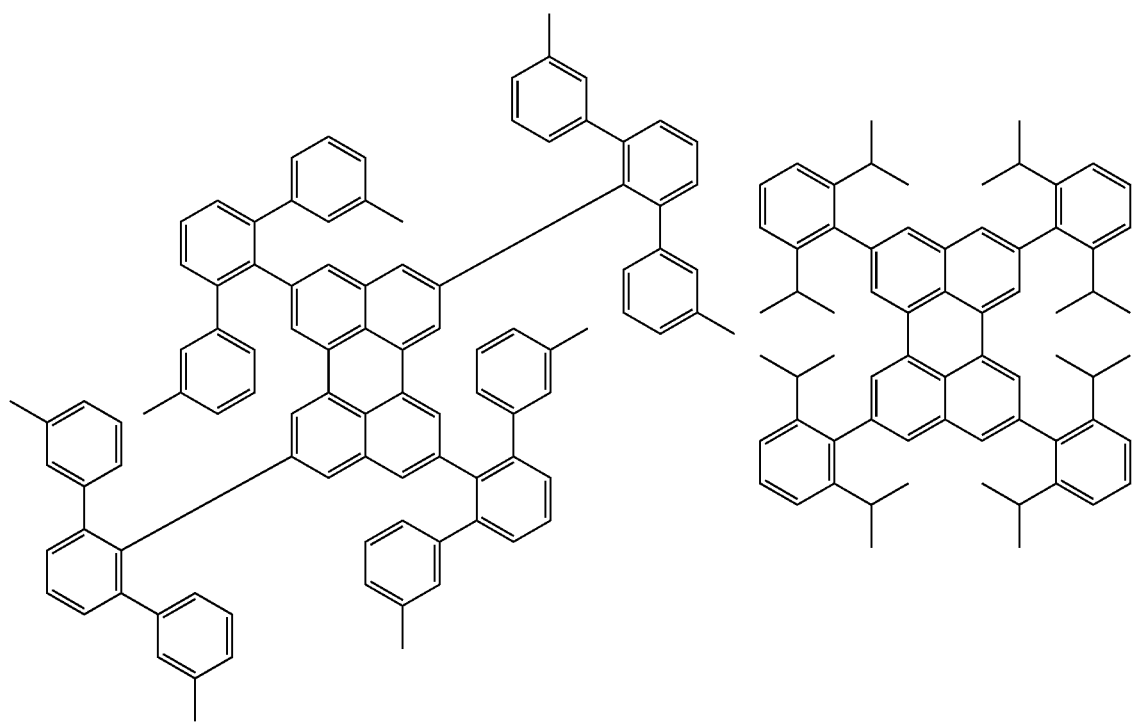

-continued
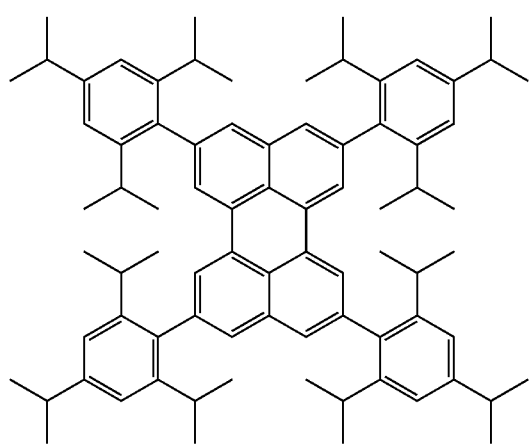
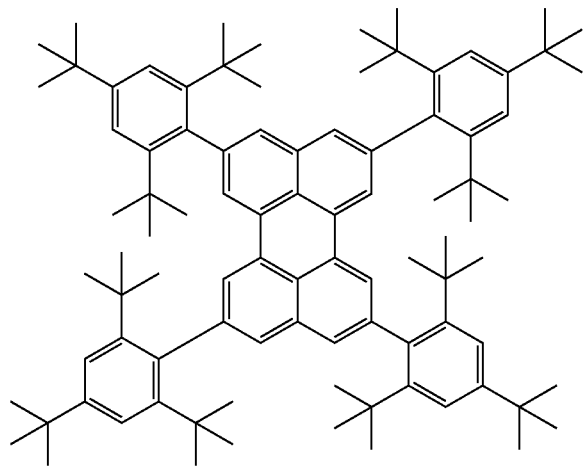
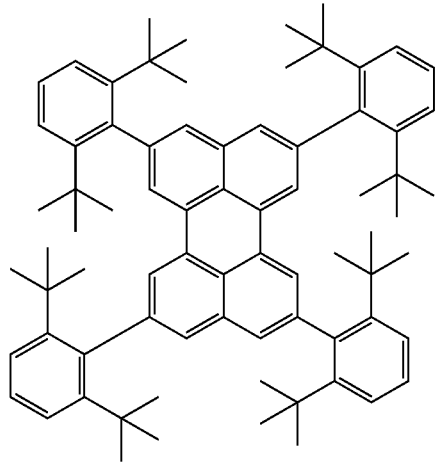
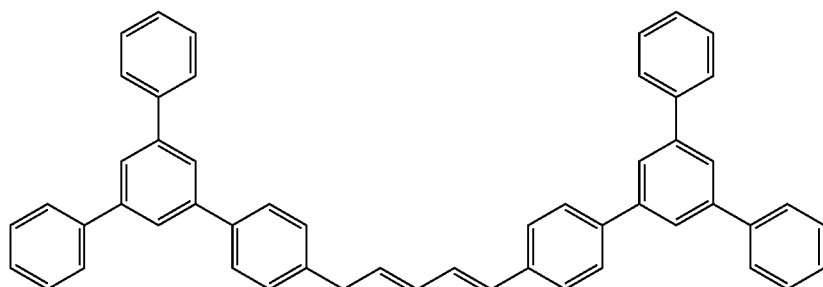
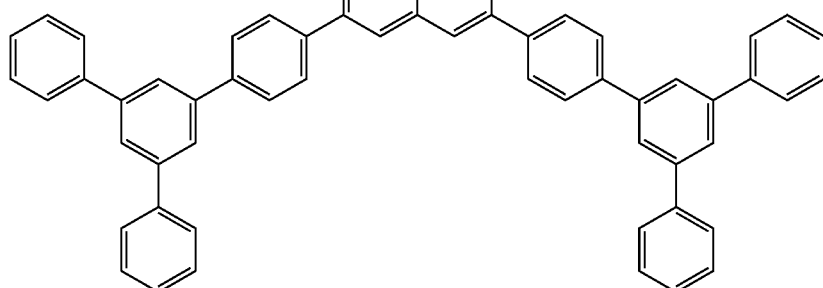

-continued
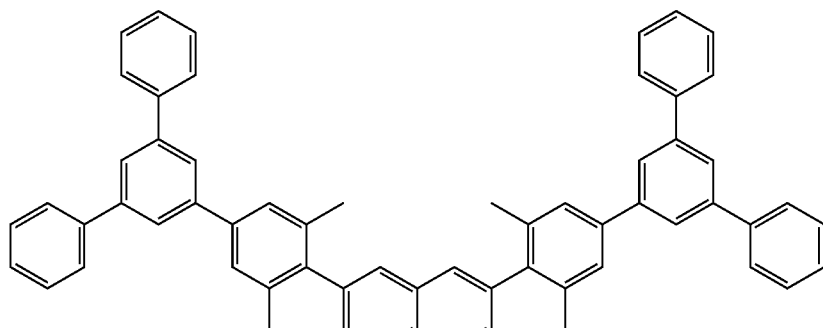
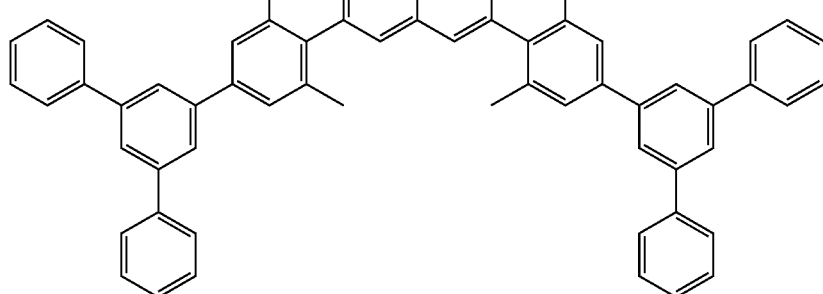
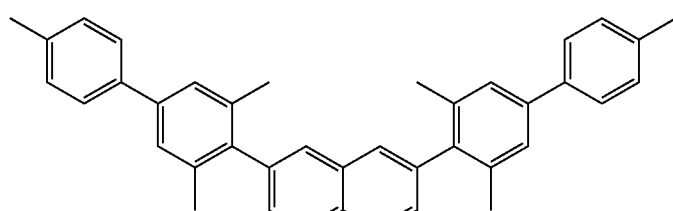
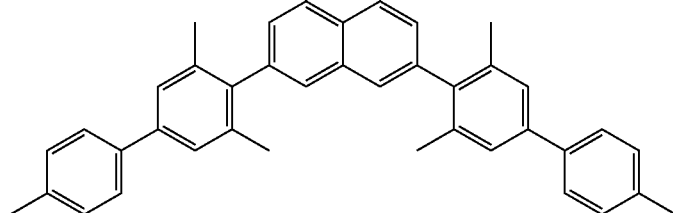
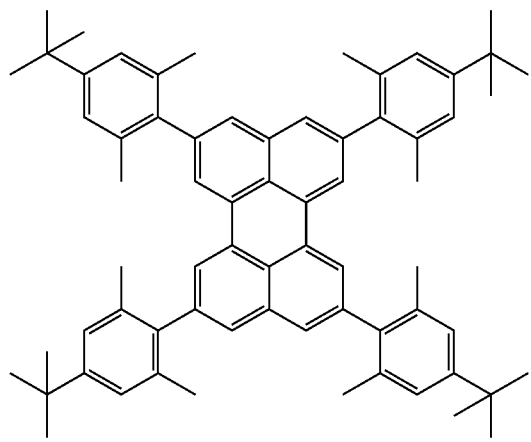
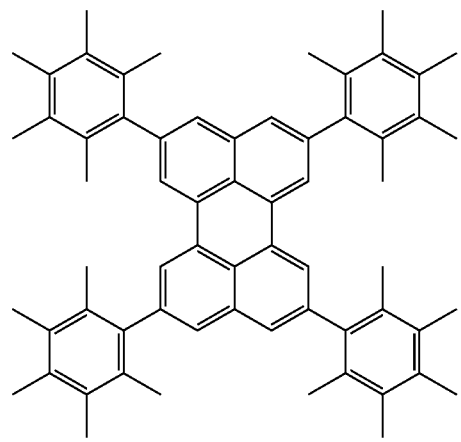

-continued
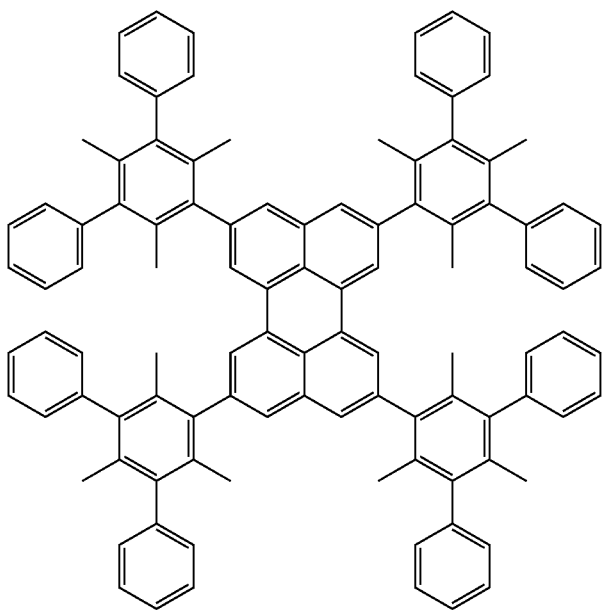
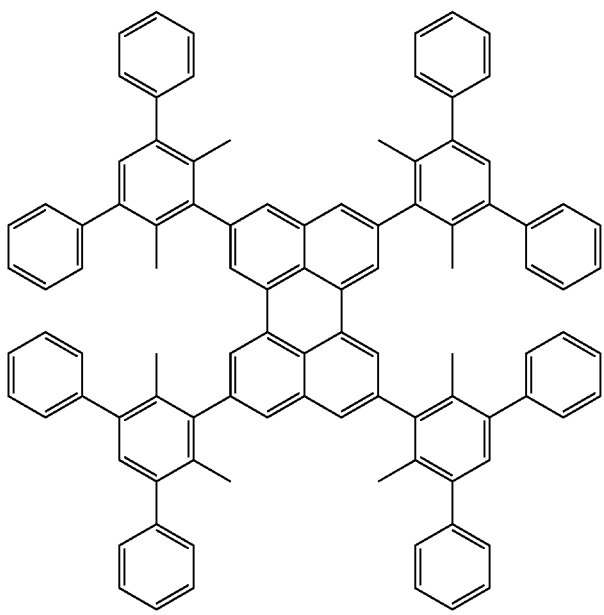

-continued
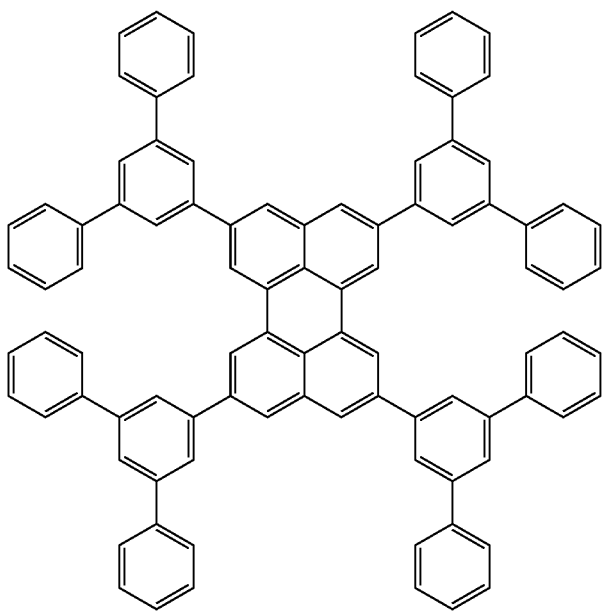
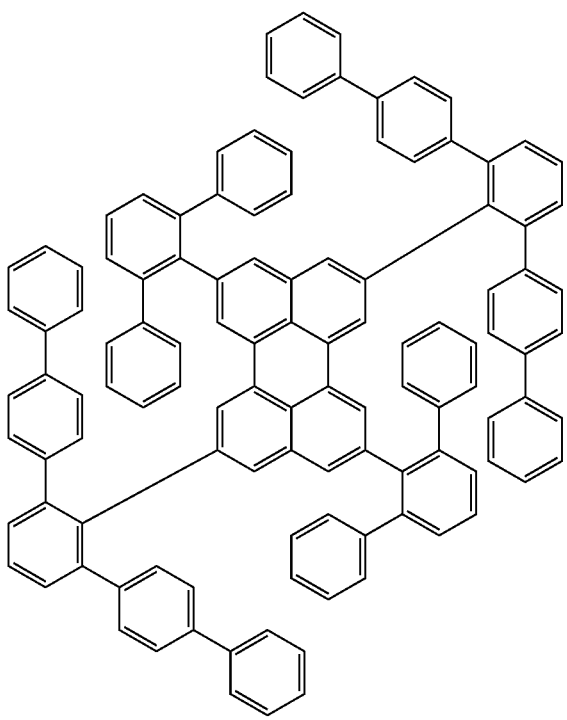

-continued
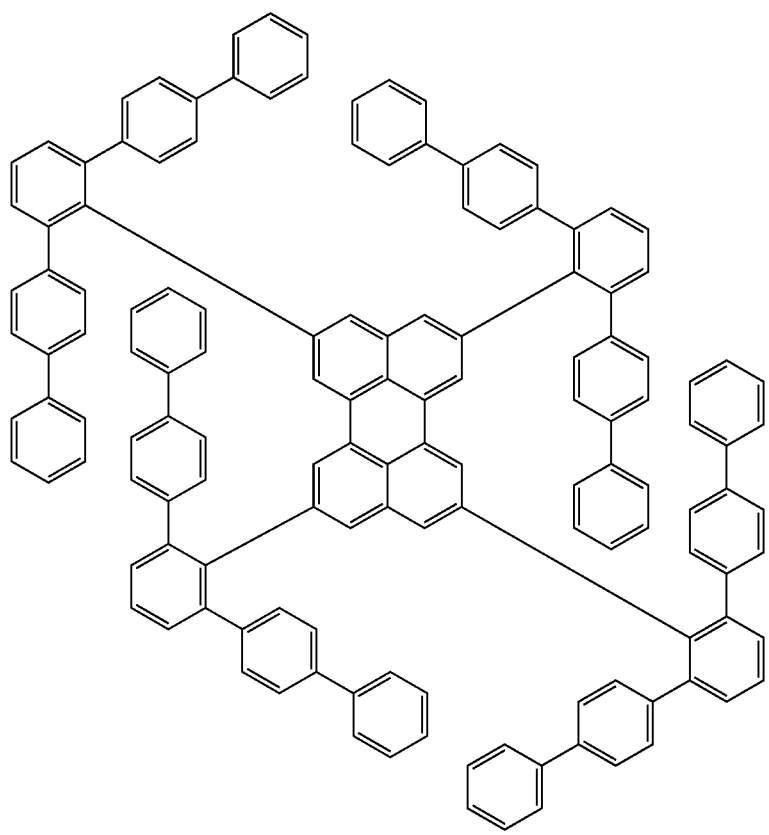
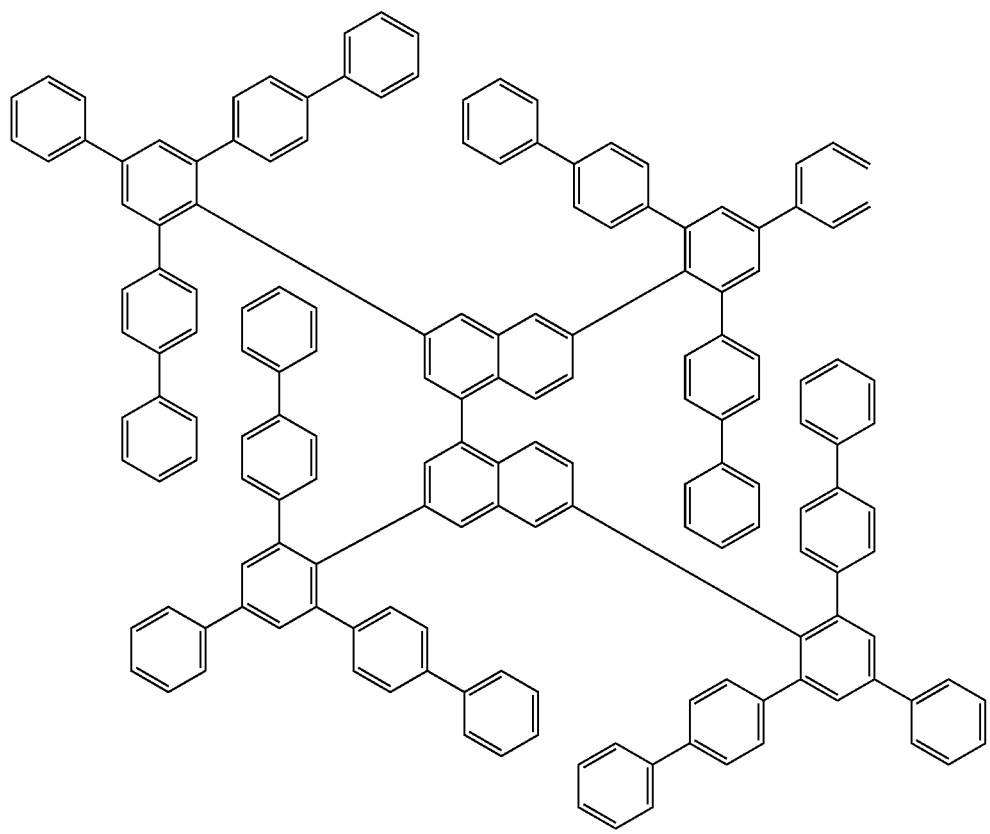

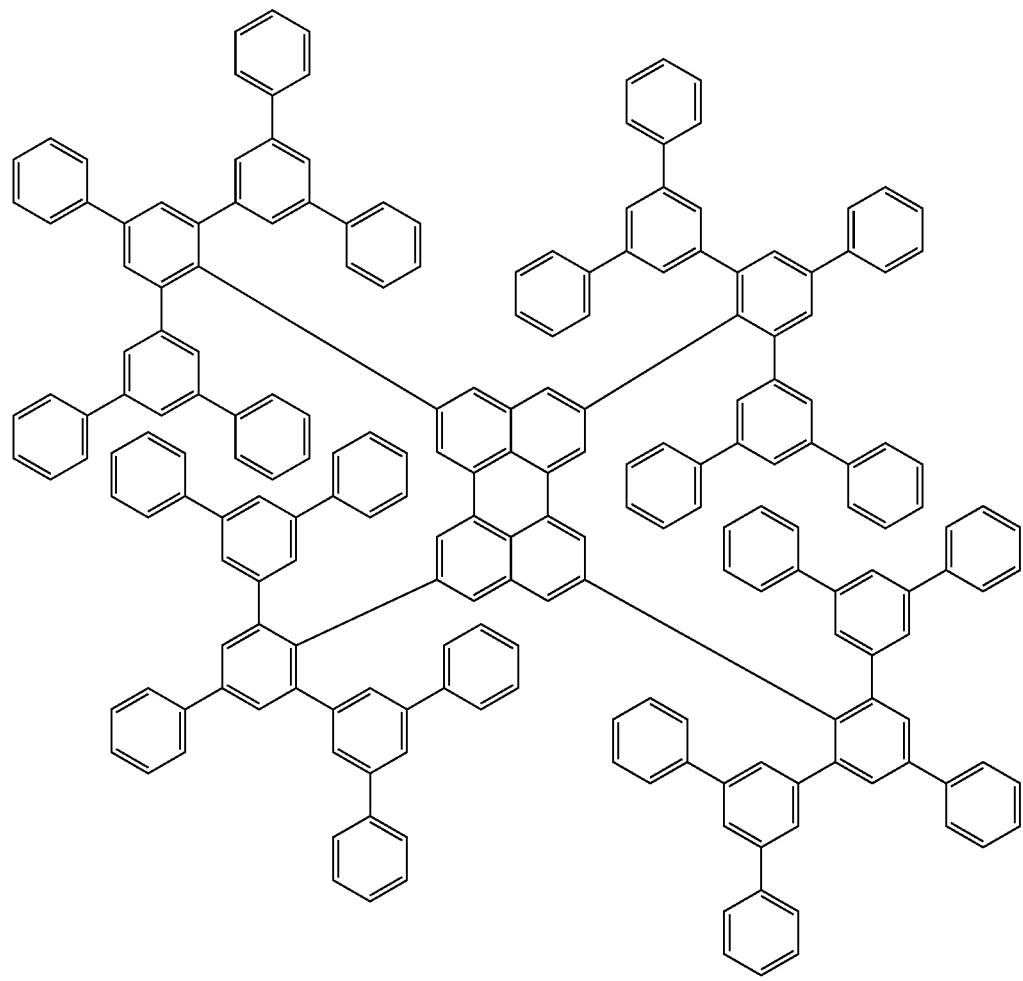

-continued

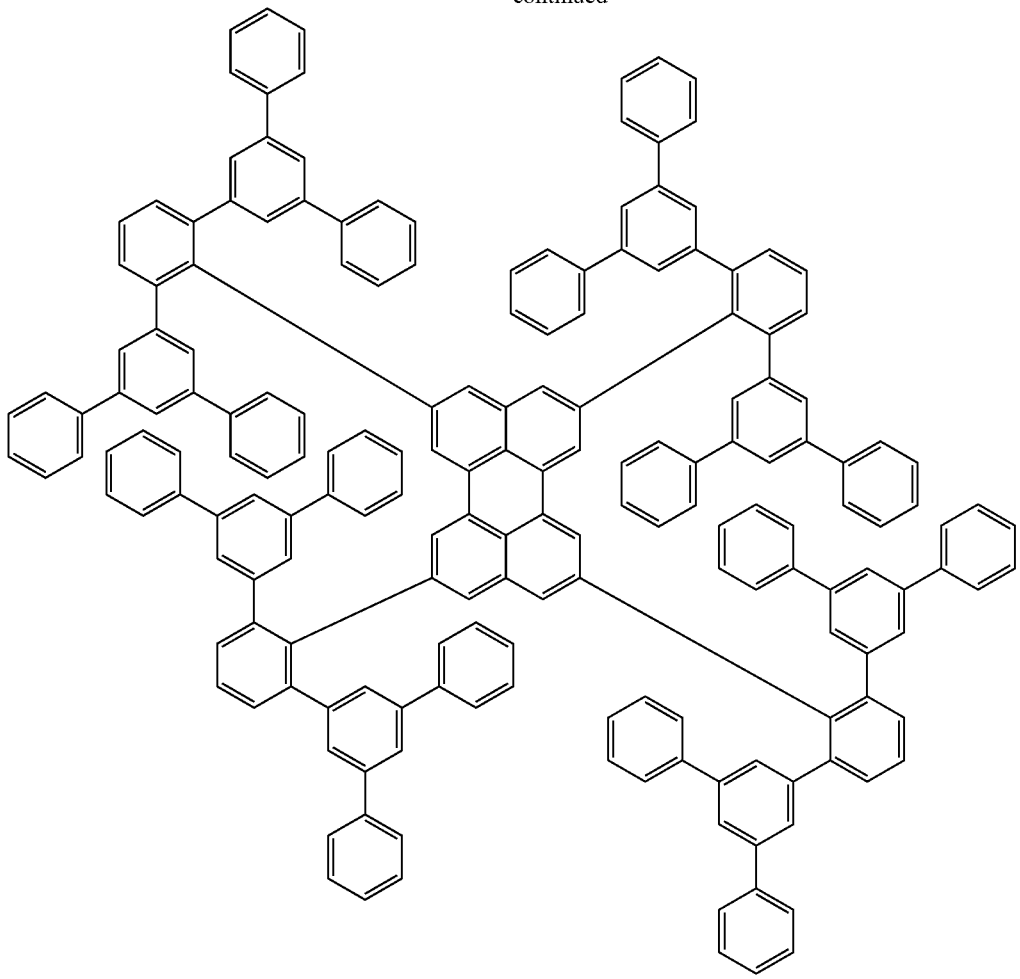 [SMILES: c1ccc(-c2cc(-c3ccccc3)cc(-c3cccc(-c4cc(-c5ccccc5)cc(-c5ccccc5)c4)c3-c3cc4cc(-c5c(-c6cc(-c7ccccc7)cc(-c7ccccc7)c6)cccc5-c5cc(-c6ccccc6)cc(-c6ccccc6)c5)cc5c6cc(-c7c(-c8cc(-c9ccccc9)cc(-c9ccccc9)c8)cccc7-c7cc(-c8ccccc8)cc(-c8ccccc8)c7)cc7cc(-c8c(-c9cc(-c%10ccccc%10)cc(-c%10ccccc%10)c9)cccc8-c8cc(-c9ccccc9)cc(-c9ccccc9)c8)cc(c(c3)c45)c76)c2)cc1]

Details of the perylenes as fluorescent emitters can also be found in patent application EP18194083.4.

The teaching of the invention covers the entire colour palette of emissions, both with regard to the fluorescent emitter (in the photoluminescence spectrum) and to the emission of the electronic device of the invention (in the electroluminescence spectrum).

It is preferable when the fluorescent emitters have a blue emission, where blue emission of the fluorescent emitter is preferably understood to mean an emission where the global emission maximum in the photoluminescence spectrum of the fluorescent emitters is in the range from 380 to 500 nm.

It is also preferable when the electronic devices of the invention have a blue emission, where blue emission of the electronic device is preferably understood to mean an emission where the global emission maximum in the electroluminescence spectrum of the electronic device of the invention is in the range from 380 to 500 nm.

It is further preferable when the fluorescent emitters have a green emission, where green emission of the fluorescent emitter is preferably understood to mean an emission where the global emission maximum in the photoluminescence spectrum of the fluorescent emitters is in the range from 501 to 570 nm.

It is also preferable when the electronic devices of the invention have a green emission, where green emission of the electronic device is preferably understood to mean an emission where the global emission maximum in the electroluminescence spectrum of the electronic device of the invention is in the range from 501 to 570 nm.

It is additionally preferable when the fluorescent emitters have a yellow emission, where yellow emission of the fluorescent emitter is preferably understood to mean an emission where the global emission maximum in the photoluminescence spectrum of the fluorescent emitters is in the range from 571 to 590 nm.

It is also preferable when the electronic devices of the invention have a yellow emission, where yellow emission of the electronic device is preferably understood to mean an emission where the global emission maximum in the electroluminescence spectrum of the electronic device of the invention is in the range from 571 to 590 nm.

Finally, it is also preferable when the fluorescent emitters have a red emission, where red emission of the fluorescent emitter is preferably understood to mean an emission where the global emission maximum in the photoluminescence spectrum of the fluorescent emitters is in the range from 591 to 750 nm.

It is also preferable when the electronic devices of the invention have a red emission, where red emission of the electronic device is preferably understood to mean an emission where the global emission maximum in the electroluminescence spectrum of the electronic device of the invention is in the range from 591 to 750 nm.

The sensitizer and the fluorescent emitter may be in the same layer of an electronic device or in different layers.

In one embodiment of the present invention, sensitizer and fluorescent emitter are in the same layer, where this layer is preferably the emission layer of an electroluminescent device.

The layer or the composition of the invention mentioned below comprising the sensitizer and the fluorescent emitter preferably comprises at least one further material from the group of the electron transport materials, hole conductor materials, quantum materials (preferably quantum dots), bipolar hosts, host materials having a large band gap (wide band gap materials), phosphorescent compounds, fluorescent compounds and materials having delayed fluorescence.

Wide band gap materials here mean those materials having a large band gap between the HOMO and the LUMO energy level. Particular preference is given to those materials having a band gap of 2.5 eV or more, even more preferably of 3.0 eV or more and especially preferably of 3.5 eV or more. The HOMO and LUMO values should be calculated by the quantum-chemical method specified hereinafter.

Materials having delayed fluorescence are preferably those that have thermally induced time-delayed fluorescence (TADF). TADF materials have a small gap between the $S_1$ and $T_1$ energy levels, which is preferably 0.3 eV or less, very preferably 0.2 eV or less and most preferably 0.1 eV or less. The $S_1$ and $T_1$ energies should be calculated by the quantum-chemical method specified hereinafter. Examples of standard TADF materials can be found in the prior art (e.g. Y. Liu et al., Nature Reviews Materials, Vol. 3, 18020, 2018; Z. Yang et al., Chem. Soc. Rev., 2017, 46, 915).

Energy levels and the energy of the lowest triplet state $T_1$ and of the lowest excited singlet state $S_1$ of the materials, unless stated otherwise, are determined via quantum-chemical calculations. For calculation of organic substances without metals, an optimization of geometry is first conducted by the "Ground State/Semi-empirical/Default Spin/AM1/Charge 0/Spin Singlet" method. Subsequently, an energy calculation is effected on the basis of the optimized geometry. This is done using the "TD-SCF/DFT/Default Spin/B3PW91" method with the "6-31G(d)" basis set (charge 0, spin singlet). For metal-containing compounds, the geometry is optimized via the "Ground State/Hartree-Fock/Default Spin/LanL2 MB/Charge 0/Spin Singlet" method. The energy calculation is effected analogously to the above-described method for the organic substances, except that the "LanL2DZ" basis set is used for the metal atom and the "6-31G(d)" basis set for the ligands. The HOMO energy level HEh or LUMO energy level LEh is obtained from the energy calculation in Hartree units. This is used to determine the HOMO and LUMO energy levels in electron volts, calibrated by cyclic voltammetry measurements, as follows:

$$HOMO(eV)=((HEh*27.212)-0.9899)/1.1206$$

$$LUMO(eV)=((LEh*27.212)-2.0041)/1.385$$

These values are to be regarded as HOMO and LUMO energy levels of the materials in the context of this application.

The lowest triplet state $T_1$ is defined as the energy of the triplet state having the lowest energy, which is apparent from the quantum-chemical calculation described.

The lowest excited singlet state $S_1$ is defined as the energy of the excited singlet state having the lowest energy, which is apparent from the quantum-chemical calculation described.

Suitable preferred matrix materials that can be used in combination with the sensitizer and the fluorescent emitter in the emission layer of the electronic device or the compositions of the invention mentioned below are aromatic ketones, aromatic phosphine oxides or aromatic sulfoxides or sulfones, for example according to WO 2004/013080, WO 2004/093207, WO 2006/005627 or WO 2010/006680, triarylamines, especially monoamines, for example according to WO 2014/015935, carbazole derivatives, e.g. CBP (N,N-biscarbazolylbiphenyl) or the carbazole derivatives disclosed in WO 2005/039246, US 2005/0069729, JP 2004/288381, EP 1205527 or WO 2008/086851, indolocarbazole derivatives, for example according to WO 2007/063754 or WO 2008/056746, indenocarbazole derivatives, for example according to WO 2010/136109 and WO 2011/000455, azacarbazole derivatives, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, triazine derivatives, for example according to WO 2010/015306, WO 2007/063754 or WO 2008/056746, zinc complexes, for example according to EP 652273 or WO 2009/062578, diazasilole or tetraazasilole derivatives, for example according to WO 2010/054729, diazaphosphole derivatives, for example according to WO 2010/054730, bridged carbazole derivatives, for example according to US 2009/0136779, WO 2010/050778, WO 2011/042107, WO 2011/088877 or WO 2012/143080, triphenylene derivatives, for example according to WO 2012/048781, lactams, for example according to WO 2011/116865, WO 2011/137951 or WO 2013/064206, 4-spirocarbazole derivatives, for example according to WO 2014/094963 or WO 2015/192939, or dibenzofuran derivatives, for example according to WO 2015/169412, WO 2016/015810, WO 2016/023608 or the as yet unpublished applications EP16158460.2 and EP16159829.7. It is likewise possible for a further phosphorescent emitter which emits at a shorter wavelength than the actual emitter to be present in the emission layer or the composition.

The further material is preferably selected from the group of the electron transport materials, and from those especially selected from the group of the pyridines, pyrimidines, pyrazines, pyridazines, triazines, quinazolines, quinoxalines, quinolines, isoquinolines, imidazoles, lactams, dibenzofurans, dibenzothiophenes and/or benzimidazoles, very particular preference being given to pyrimidines and triazines.

It is further preferable when the further material is selected from the group of the hole transport materials, very particular preference being given here to the carbazoles, biscarbazoles, arylamines, triarylamines, indenocarbazoles and indolocarbazoles.

It is further preferable when the layer comprising the sensitizer and the fluorescent emitter and the further material comprises at least one fourth material, where that may again be selected from the group of the preferred further materials already mentioned above.

In a further embodiment of the present invention, the layer comprising the sensitizer and the fluorescent emitter consists exclusively of the sensitizer and the fluorescent emitter, the layer preferably being the emission layer.

In a further embodiment of the present invention, sensitizer and fluorescent emitter are in different layers, where the two layers directly adjoin one another.

It is also possible for multiple layers respectively comprising a sensitizer and a fluorescent emitter to adjoin one another in alternating form. The present invention therefore also provides an electronic device containing a region having the layer sequence [SL/FEL]$_n$-SL where n is an integer from 1 to 5, SL is a layer containing the sensitizer and FEL is a layer containing the fluorescent emitter, and wherein the sensitizers in the different SL layers may be different from one another and wherein the fluorescent emitters in different FEL layers may be different from one another.

The electronic device of the invention is preferably an organic electronic device and very preferably an organic electronic device from the group of the organic electroluminescent devices, organic integrated circuits, organic field-effect transistors, organic thin-film transistors, organic light-emitting transistors, organic solar cells, organic optical detectors, organic photoreceptors, organic field quench devices, light-emitting electrochemical cells or organic laser diodes.

Most preferably, the electronic device is an organic electroluminescent device. It is even more preferable when the electronic device is an organic electroluminescent device from the group of the OLEDs and OLECs, the OLEDs being the most preferred.

A preferred embodiment of the invention is organic electroluminescent devices. The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. At the same time, it is possible that one or more hole transport layers are p-doped, for example with metal oxides such as $MoO_3$ or $WO_3$ or with (per)fluorinated electron-deficient aromatic systems, and/or that one or more electron transport layers are n-doped. It is likewise possible for interlayers to be introduced between two emitting layers, these having, for example, an exciton-blocking function and/or controlling the charge balance in the electroluminescent device. However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. Preference is further given to tandem OLEDs as well. The system may also be a hybrid system wherein one or more layers fluoresce and one or more other layers phosphoresce.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O-SC) or the emission of light (OLED/PLED, O-LASER). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled. Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The present invention further relates to a composition comprising at least one sensitizer and at least one fluorescent emitter, where the sensitizer and the fluorescent emitter are the compounds specified in the present invention. Moreover, in respect of the embodiments of the two components of the composition that are preferred in the context of the present invention, i.e. in respect of the sensitizer and fluorescent emitter, the same preferences already disclosed herein that have been described in connection with the electronic device are applicable.

Thus, it is preferable when the fluorescent emitter and the sensitizer of the composition satisfy at least one of the abovementioned conditions (I) or (II), it being preferable when condition (I) is satisfied, and where the abovementioned preferences are applicable here too, for example with regard to X and Y.

It is therefore also further preferable when the fluorescent emitter of the composition is a sterically shielded compound having a shielding factor (SF) of not less than 0.45, preferably not less than 0.5, very preferably not less than 0.6 and especially preferably not less than 0.65.

Another very preferred composition in this context is therefore, for example, one comprising at least one sensitizer, a phosphorescent organometallic complex containing Ir or Pt and a sterically shielded fluorescent emitter having one of the above-detailed shielding factors.

Another very preferred composition in this context is therefore one comprising at least one sensitizer, a phosphorescent organometallic complex containing Ir or Pt and a fluorescent emitter, where at least one of the two conditions (I) and (II) must be met.

Said compositions preferably comprise at least one further material preferably selected from the group of the electron transport materials, electron injection materials, electron blocker materials, hole transport materials, hole injection materials, hole blocker materials, n-dopants, p-dopants, quantum materials (preferably quantum dots), host or matrix materials, wide band gap materials, phosphorescent emitters, fluorescent emitters or emitters having delayed fluorescence, the materials being the materials mentioned in connection with the electronic device.

The materials mentioned are well known to the person skilled in the art. The person skilled in the art is able to choose here from a multitude of readily available materials that are known to him.

The composition of the invention contains the sensitizer preferably in a concentration of 5% to 99.9% by weight, very preferably of 5% to 60% by weight, especially preferably of 10% to 50% by weight, most preferably 20% to 40% by weight, where the figures are based on the overall composition.

The composition of the invention contains the fluorescent emitter preferably in a concentration of 0.1% to 25% by weight, very preferably of 1% to 20% by weight, especially preferably of 3% to 10% by weight, where the figures are based on the overall composition.

The present invention also provides a formulation comprising the composition mentioned and at least one solvent.

Suitable solvents are preferably organic solvents, for example alcohols, aldehydes, ketones, ethers, esters, amides, di-$C_1$-$C_2$-alkylformamides, sulfur compounds, nitrogen compounds, hydrocarbons, halogenated hydrocarbons (e.g. chlorinated hydrocarbons), aromatic or heteroaromatic hydrocarbons and halogenated aromatic or heteroaromatic hydrocarbons.

Preferred solvents may be selected from the following group: substituted and unsubstituted aromatic or linear esters, e.g. ethyl benzoate, butyl benzoate, octyl octanoate, diethyl sebacate; substituted and unsubstituted aromatic or linear ethers, e.g. 3-phenoxytoluene, 3,4-dimethylanisole, phenetole or anisole; substituted and unsubstituted arenes such as toluene, xylene, pentylbenzene, hexylbenzene, cyclohexylbenzene, 2-methylbiphenyl, 2,2'-dimethylbiphenyl; indanes, e.g. hexamethylindane; substituted and unsubstituted aromatic or linear ketones; substituted and unsubstituted heterocycles, e.g. pyrrolidinones, cyclic or noncyclic siloxanes, pyridines, pyrazines; or other fluorinated or chlorinated aromatic hydrocarbons.

Particularly preferred solvents are, for example, 1,2,3,4-tetramethylbenzene, 1,2,3,5-tetramethylbenzene, 1,2,3-trimethylbenzene, 1,2,4,5-tetramethylbenzene, 1,2,4-trichlorobenzene, 1,2,4-trimethylbenzene, 1,2-dihydronaphthalene, 1,2-dimethylnaphthalene, 1,3-benzodioxolane, 1,3-diisopropylbenzene, 1,3-dimethylnaphthalene, 1,4-benzodioxane, 1,4-diisopropylbenzene, 1,4-dimethylnaphthalene, 1,5-dimethyltetralin, 1-benzothiophene, thianaphthalene, 1-bromonaphthalene, 1-chloromethylnaphthalene, 1 ethylnaphthalene, 1-methoxynaphthalene, 1-methylnaphthalene, 1-methylindole, 2,3-benzofuran, 2,3-dihydrobenzofuran, 2,3-dimethylanisole, 2,4-dimethylanisole, 2,5-dimethylanisole, 2,6-dimethylanisole, 2,6-dimethylnaphthalene, 2-bromo-3-bromomethylnaphthalene, 2-bromomethylnaphthalene, 2-bromonaphthalene, 2-ethoxynaphthalene, 2-ethylnaphthalene, 2-isopropylanisole, 2-methylanisole, 2-methylindole, 3,4-dimethylanisole, 3,5-dimethylanisole, 3-bromoquinoline, 3-methylanisole, 4-methylanisole, 5-decanolide, 5-methoxyindane, 5-methoxyindole, 5-tert-butyl-m-xylene, 6-methylquinoline, 8-methylquinoline, acetophenone, anisole, benzonitrile, benzothiazole, benzyl acetate, bromobenzene, butyl benzoate, butyl phenyl ether, cyclohexylbenzene, decahydronaphthol, dimethoxytoluene, 3-phenoxytoluene, diphenyl ether, propiophenone, ethylbenzene, ethyl benzoate, hexylbenzene, indane, hexamethylindane, indene, isochromane, cumene, m-cymene, mesitylene, methyl benzoate, o-, m-, p-xylene, propyl benzoate, propylbenzene, o-dichlorobenzene, pentylbenzene, phenetole, ethoxybenzene, phenyl acetate, p-cymene, propiophenone, sec-butylbenzene, t-butylbenzene, thiophene, toluene, veratrole, monochlorobenzene, o-dichlorobenzene, pyridine, pyrazine, pyrimidine, pyrrolidinone, morpholine, dimethylacetamide, dimethyl sulfoxide, decalin and/or mixtures of these solvents.

The present invention also provides an electronic device, preferably the abovementioned electronic devices and preferences thereof, comprising the composition, especially in the emission layer of an organic electroluminescent device.

The present invention further provides a process for producing an electronic device, wherein the formulation of the invention is used to produce at least one layer of the electronic device from solution.

The present invention also provides a process for producing an electronic device, wherein the composition of the invention is used to vapour-deposit at least one layer of the electronic device from vacuum.

The device is correspondingly (according to the application) structured, contact-connected and finally hermetically sealed, since the lifetime of such devices is severely shortened in the presence of water and/or air.

Additionally preferred is an electronic device, especially an organic electroluminescent device, which is characterized in that one or more layers are coated by a sublimation process. In this case, the materials are applied by vapour deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an electronic device, especially an organic electroluminescent device, which is characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example M. S. Arnold et al., *Appl. Phys. Lett.* 2008, 92, 053301).

Preference is additionally given to an electronic device, especially an organic electroluminescent device, which is characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution.

The electronic device, especially the organic electroluminescent device, can also be produced as a hybrid system by applying one or more layers from solution and applying one or more other layers by vapour deposition. For example, it is thus possible to apply an emitting layer comprising a composition of the invention from solution, and to apply a hole blocker layer and/or an electron transport layer thereto by vapour deposition under reduced pressure.

The person skilled in the art is aware of these methods in general terms and is able to apply them without difficulty to the electronic devices of the invention, especially organic electroluminescent devices.

FIGURES

FIG. 1 shows the photoluminescence spectra of the compounds FE-03 and PS-01.

FIG. 2 shows the electroluminescence spectrum from Experiment 6.

The devices of the invention and devices comprising the compositions of the invention feature the following surprising advantages over the prior art:
1. The devices of the invention and the devices comprising the compositions of the invention have improved performance data, especially efficiency, lifetime and operating voltage, compared to compounds and compositions from the prior art.
2. The devices of the invention and the devices comprising the compositions of the invention enable use of a practicable or somewhat elevated concentration of the fluorescent emitter compared to the prior art, which has the advantage of better processibility of the emitting layer.
3. The compositions and formulations of the invention enable simple inexpensive processing of electronic devices, for example including simple processing from solution. They are therefore suitable for commercial utilization and mass production.
4. The compositions of the invention and formulations of the invention have improved stability, which facilitates the storage of the compositions and formulations.

It should be pointed out that variations of the embodiments described in the present invention are covered by the scope of this invention. Any feature disclosed in the present invention may, unless this is explicitly ruled out, be exchanged for alternative features which serve the same purpose or an equivalent or similar purpose. Thus, any feature disclosed in the present invention, unless stated otherwise, should be considered as an example of a generic series or as an equivalent or similar feature.

All features of the present invention may be combined with one another in any manner, unless particular features and/or steps are mutually exclusive. This is especially true of preferred features of the present invention. Equally, features of non-essential combinations may be used separately (and not in combination).

It should also be pointed out that many of the features, and especially those of the preferred embodiments of the present invention, should themselves be regarded as inventive and not merely as some of the embodiments of the present invention. For these features, independent protection may be sought in addition to or as an alternative to any currently claimed invention.

The technical teaching disclosed with the present invention may be abstracted and combined with other examples.

The invention is illustrated in more detail by the examples which follow, without any intention of restricting it thereby.

The person skilled in the art will be able to use the details given, without exercising inventive skill, to produce further electronic devices of the invention and hence to execute the invention over the entire scope claimed.

EXAMPLES

Example 1: Photophysical Measurements 1.1) Determination of $S_1^{max}$ from the Peak Emission Wavelength $\lambda_{max}$ To determine the peak emission wavelength of the sensitizer and the fluorescent emitter, the particular material is dissolved in toluene. A concentration of 1 mg/100 ml is used here. The solution is excited in a Hitachi F-4500 fluorescence spectrometer with a wavelength adapted to the material to be analysed in each case. The measurement is effected at room temperature. The peak emission wavelength $\lambda_{max}$ is the wavelength at which the emission spectrum obtained attains its first maximum proceeding from short wavelengths (FIG. 1). The first maximum here is typically also the global maximum of the spectrum. But if the first maximum of the emission spectrum does not correspond to the global maximum, however, the first maximum has a high intensity in the normalized emission spectrum, the intensity of the first maximum in that case being at least 0.5 or more.

1.2) Determination of $S_1^K$ from the Emission Edge

To determine the emission edge of the sensitizer and the fluorescent emitter, a tangent to the normalized photoluminescence spectrum is drawn at the steepest rise before the first maximum at short wavelengths. The point of intersection of this tangent with the x axis gives the wavelength of the emission edge $\lambda_{edge}$ (as shown in FIG. 1).

The above-described photophysical measurements give the peak emission wavelengths and emission edges for the sensitizer and fluorescent emitter in Table 1. The shielding factor (SF) is likewise listed for the fluorescent emitter.

TABLE 1

Emission wavelengths, energies of the excited states and shielding factors

| Sensitizer | $\lambda_{max}$ [nm] | $\lambda_{edge}$ [nm] | $S_1^{max}$ (eV) | $S_1^K$ (eV) | SF |
|---|---|---|---|---|---|
| PS-01 | 465 | 442 | 2.67 | 2.81 | |
| PS-02 | 473 | 458 | 2.62 | 2.71 | |
| PS-03 | 509 | 486 | 2.44 | 2.55 | |
| PS-04 | 494 | 448 | 2.51 | 2.77 | |
| PS-05 | 460 | 408 | 2.70 | 3.04 | |
| FE-01 | 459 | 441 | 2.70 | 2.81 | 0.41 |
| FE-02 | 457 | 443 | 2.71 | 2.8 | 0.55 |
| FE-03 | 469 | 455 | 2.64 | 2.73 | 0.72 |
| FE-04 | 556 | 527 | 2.23 | 2.35 | 0.47 |
| FE-05 | 566 | 529 | 2.19 | 2.34 | 0.60 |
| FE-06 | 575 | 535 | 2.16 | 2.32 | 0.67 |
| FE-07 | 573 | 535 | 2.16 | 2.32 | 0.65 |

Example 2: Synthesis of Fluorescent Emitters
The perylenes used here can be prepared by the principle detailed below.
Synthesis Scheme:
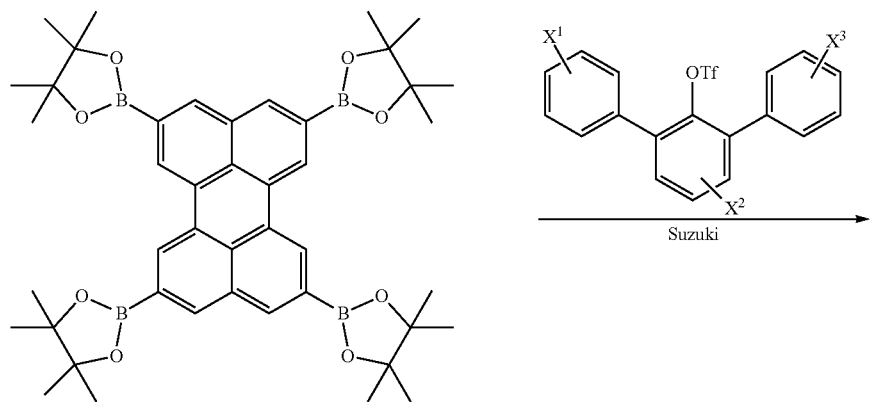
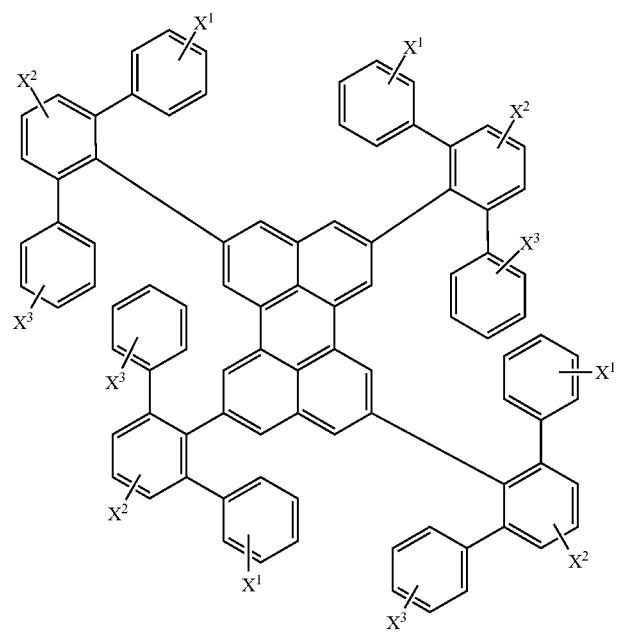
where $X^1$ to $X^3$ represent any substituents.

Synthesis of the Triflate:

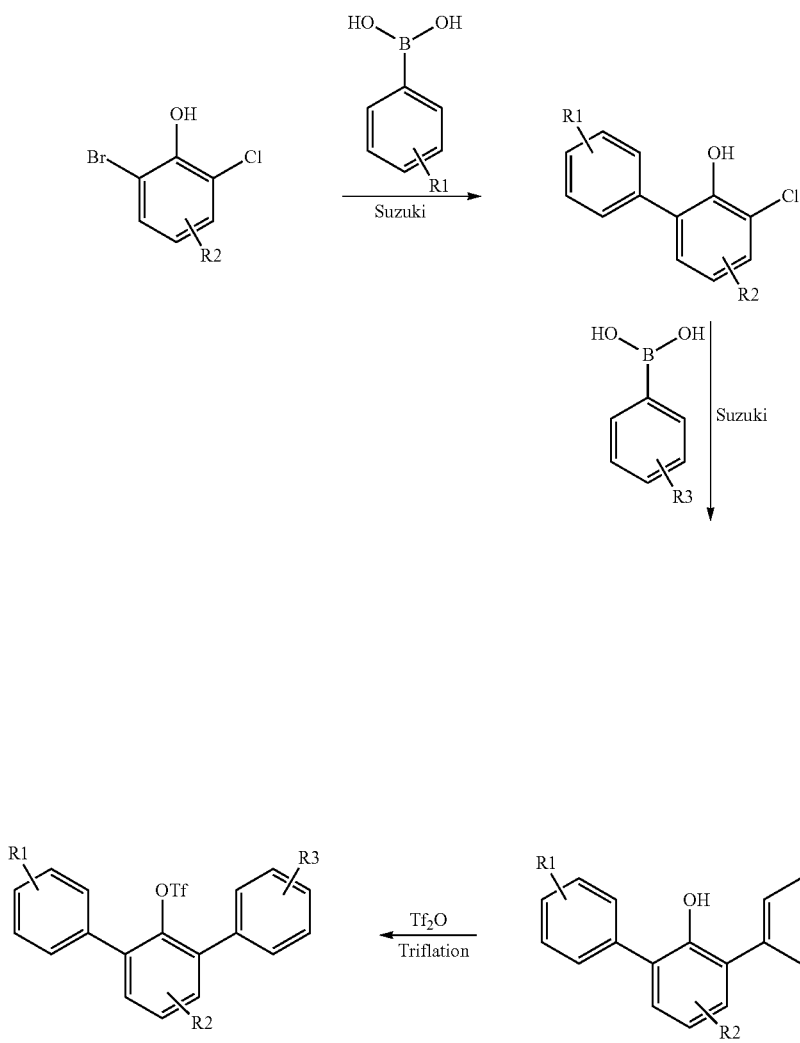

where the $R^1$ to $R^3$ groups have the same meaning as the $X^1$ to $X^3$ groups.

A baked-out flask flooded with Ar and equipped with a precision glass stirrer is initially charged with 2,5,8,11-tetra-(4,4,5,5-tetramethyl-1,3,2-dioxaborolan-2-yl)perylene (38.0 g, 50.3 mmol, 1.0 equiv.), 3-phenyl-[1,1'-biphenyl]-2-yl trifluoromethanesulfonate (95.1 g, 251.3 mmol, 5.0 equiv.), tetrakis(triphenylphosphine)palladium (5.81 g, 5.0 mmol, 0.1 equiv.) and sodium metaborate tetrahydrate (69.3 g, 502.5 mmol, 10.0 equiv.). THF (1500 ml) and water (500 ml) are added thereto and the reaction mixture is stirred under reflux for 3 d. The crude product is purified by means of column chromatography. The desired product is isolated as a yellow solid (16 g, 13.7 mmol, 27.3%).

Synthesis of 2,5,8,11-tetrakis(2,6-dimethylphenyl)perylene [FE-02]

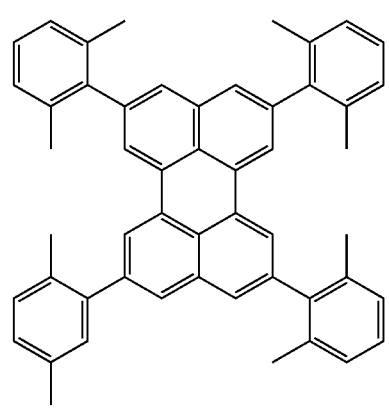 [SMILES: Cc1ccc(C)c(-c2cc3cc(-c4c(C)cccc4C)cc4c5cc(-c6c(C)cccc6C)cc6cc(-c7c(C)cccc7C)cc(c(c2)c34)c65)c1]

A baked-out four-neck flask flooded with Ar and equipped with a precision glass stirrer is initially charged with 2,5,8,11-tetra-(4,4,5,5-tetramethyl-1,3,2-dioxaborolan-2-yl) perylene (40.0 g, 52.9 mmol, 1.0 equiv.), 2-bromo-1,3-dimethylbenzene (293.7 g, 212.8 ml, 1587.0 mmol, 30.0 equiv.) and caesium carbonate (137.9 g, 423.2 mmol, 8.0 equiv.). Toluene (2000 ml) is added and the reaction mixture is degassed with Ar for 20 min. Subsequently, tetrakis(triphenylphosphine)palladium (6.11 g, 5.3 mmol, 0.1 equiv.) is added and the reaction mixture is degassed for a further 20 min. Subsequently, the reaction is stirred under reflux for 72 h. The reaction mixture is filtered. The mother liquor is concentrated, the resulting suspension is filtered, and methanol (1000 ml) is added to the resultant mother liquor. In the course of this, a solid precipitates out. All the solids are combined and subjected to hot extraction with toluene three times over AlOx. Yet another hot extraction is conducted over AlOx with a mixture of toluene and heptane (1:1). The resulting solid is recrystallized twice from toluene and once from 1,4-dioxane. The desired product is isolated as a yellow solid (5.0 g, 7.47 mmol, 14.1%). Subsequently, the solids are sublimed (4.5 g, 6.73 mmol, 12.7%).

Synthesis of
2,5,8,11-tetrakis(2,6-diphenylphenyl)perylene
[FE-03]

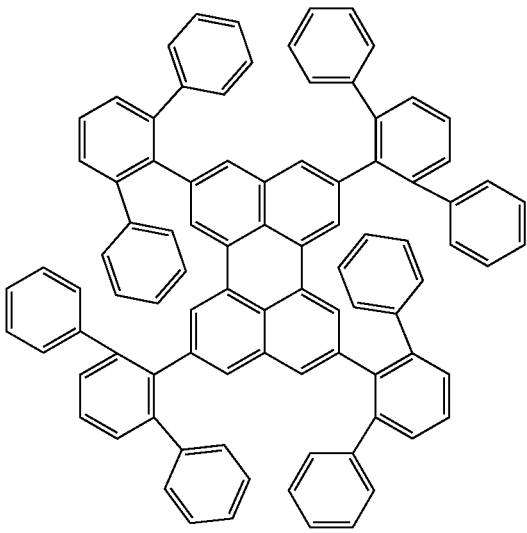 [SMILES: c1ccc(-c2cccc(-c3ccccc3)c2-c2cc3cc(-c4c(-c5ccccc5)cccc4-c4ccccc4)cc4c5cc(-c6c(-c7ccccc7)cccc6-c6ccccc6)cc6cc(-c7c(-c8ccccc8)cccc7-c7ccccc7)cc(c(c2)c34)c65)cc1]

A baked-out four-neck flask flooded with Ar and equipped with a precision glass stirrer is initially charged with 2,5,8,11-tetra-(4,4,5,5-tetramethyl-1,3,2-dioxaborolan-2-yl) perylene (38.0 g, 50.3 mmol, 1.0 equiv.), 1,3-diphenylphenyl triflate (95.1 g, 251.3 mmol, 5.0 equiv.) and sodium metaborate tetrahydrate (69.3 g, 502.5 mmol, 10.0 equiv.). THF (1500 ml) and water (500 ml) are added and the reaction mixture is degassed with Ar for 20 min. Subsequently, tetrakis(triphenylphosphine)palladium (5.81 g, 5.0 mmol, 0.1 equiv.) is added and the reaction mixture is degassed with Ar for a further 20 min. Subsequently, the reaction is stirred under reflux for 72 h. The reaction mixture is cooled down and subjected to hot extraction with toluene over AlOx. This operation is repeated twice more, before the solids are recrystallized from toluene (700 ml). The recrystallization is conducted five times more before the desired product can be isolated as a yellow solid (16 g, 13.7 mmol, 27.3%). Subsequently, the solids are sublimed (6.8 g, 5.8 mmol, 11.6%).

Example 3: Organic Electroluminescent Devices

Production of the OLEDs

Glass plaques which have been coated with structured ITO (indium tin oxide) in a thickness of 50 nm are subjected to wet cleaning (dishwasher, Merck Extran detergent). The substrates are then treated with UV/ozone for 15 minutes. Thereafter, a 20 nm PEDOT:PSS layer is spun onto the substrates (2800 rpm). The substrates are baked once again on a hotplate at 180° C. for 10 minutes. After the production, the OLEDs are encapsulated for protection against oxygen and water vapour. The exact layer construction of the electroluminescent OLEDs (organic light-emitting diodes) can be found in the examples. The materials required for production of the OLEDs are shown in Table 4.

All materials are applied by thermal vapour deposition in a vacuum chamber. The emission layer(s) here always consist(s) of at least one matrix material (host material), a (phosphorescent) sensitizer (PS) and a fluorescent emitter (FE). Sensitizers and fluorescent emitters (FE) are added to the host material (H) in a particular proportion by volume by coevaporation. Details given in such a form as H-01:PS-01 (5%):FE-01 (3%) mean here that the material H-01 is present in the layer in a proportion by volume of 92%, PS-01 in a proportion of 5% and FE-01 in a proportion of 3%. Analogously, the electron transport layer may also consist of a mixture of two materials.

The OLEDs are characterized in a standard manner. For this purpose, the electroluminescence spectra (EL) and current-voltage-luminance (UIL) characteristics are measured, from which it is possible to determine the external quantum efficiency (EQE, measured in %) assuming Lambertian emission characteristics. The parameter U100 refers to the voltage which is required for a luminance of 100 cd/m$^2$. EQE100 refers to the external quantum efficiency at an operating luminance of 100 cd/m$^2$.

The lifetime LD is defined as the time after which the luminance drops from the starting luminance to a certain proportion L1 in the course of operation with constant current. A figure of j0=10 mA/cm$^2$, L1=80% means that the luminance in the course of operation at 10 mA/cm$^2$ falls to 80% of its starting value after the time LD.

Phosphorescent sensitizers used are the compounds PS-01, PS-02, PS-03, PS-04 and PS-05. Fluorescent emitters used are the materials FE-01, FE-02, FE-03, FE-04, FE-05, FE-06 and FE-07.

OLEDs with Blue Emission:

The OLEDs consist of the following layer sequence which is applied to the substrate after the PEDOT:PSS treatment:

For Exp. 1-16: 20 nm HTM:p-D (95%:5%), 30 nm HTM, 10 nm H-02, 25 nm H-01:PS:FE, 10 nm H-01, 20 nm ETM:LiQ (50%:50%), aluminium (100 nm).

For Exp. 17-22: 20 nm HTM:p-D (95%:5%), 20 nm HTM, 10 nm H-03, 30 nm H-01:PS:FE, 10 nm H-01, 20 nm ETM:LiQ (50%:50%), 3 nm LiQ, aluminium (100 nm).

For Exp. 23-28, substrates with 50 nm of ITO that have been subjected to wet cleaning (dishwasher, Merck Extran detergent) are used. Thereafter, the substrates are baked at 250° in a nitrogen atmosphere for 15 min. The OLEDs consist of the following layer sequence which is applied to the substrate after baking: 20 nm HTM:p-D (95%:5%), 180 nm HTM, 20 nm H-03, 25 nm H-01:PS-04:FE, 10 nm H-01, 20 nm ETM:LiQ (50%:50%), aluminium (100 nm).

Table 2 lists the results for various combinations of host, sensitizer and fluorescent emitter. EQE and voltage at 100 cd/m² are reported for the corresponding experiments. X here represents $S_1^K(FE)-S_1^K(S)$ and Y represents $S_1^{max}(FE)-S_1^{max}(S)$.

TABLE 2

Experiments with blue-emitting OLEDs

| Exp. | Host | Sensitizer | FE | EQE100 [%] | U100 [V] | LD [h] | X [eV] | Y [eV] | SF |
|---|---|---|---|---|---|---|---|---|---|
| 1 | H-01 | PS-01 (15%) | FE-01 (1%) | 10.16 | 3.78 | 3.5 | 0.0 | 0.03 | 0.41 |
| 2 | H-01 | PS-01 (15%) | FE-01 (2%) | 6.77 | 3.91 | 7 | 0.0 | 0.03 | 0.41 |
| 3 | H-01 | PS-01 (15%) | FE-01 (3%) | 5.34 | 4 | 12.5 | 0.0 | 0.03 | 0.41 |
| 4 | H-01 | PS-01 (15%) | FE-02 (2%) | 9.32 | 3.89 | 3.5 | −0.1 | 0.04 | 0.55 |
| 5 | H-01 | PS-01 (15%) | FE-02 (3%) | 7.7 | 4.06 | 4 | −0.1 | 0.04 | 0.55 |
| 6 | H-01 | PS-01 (15%) | FE-03 (1%) | 19.67 | 3.63 | 1.8 | −0.08 | −0.03 | 0.72 |
| 7 | H-01 | PS-01 (15%) | FE-03 (2%) | 17.93 | 3.67 | 2.75 | −0.08 | −0.03 | 0.72 |
| 8 | H-01 | PS-01 (15%) | FE-03 (3%) | 14.77 | 3.68 | 4 | −0.08 | −0.03 | 0.72 |
| 9 | H-01 | PS-02 (5%) | FE-01 (1%) | 13 | 3.33 | 12.5 | 0.1 | 0.08 | 0.41 |
| 10 | H-01 | PS-02 (5%) | FE-01 (2%) | 9.5 | 3.37 | 26 | 0.1 | 0.08 | 0.41 |
| 11 | H-01 | PS-02 (5%) | FE-01 (3%) | 8.4 | 3.4 | 34 | 0.1 | 0.08 | 0.41 |
| 12 | H-01 | PS-02 (5%) | FE-02 (2%) | 12.3 | 3.28 | 12 | 0.09 | 0.09 | 0.55 |
| 13 | H-01 | PS-02 (5%) | FE-02 (3%) | 11.2 | 3.28 |  | 0.09 | 0.09 | 0.55 |
| 14 | H-01 | PS-02 (5%) | FE-03 (1%) | 18.7 | 3.23 | 8.5 | 0.02 | 0.02 | 0.72 |
| 15 | H-01 | PS-02 (5%) | FE-03 (2%) | 15.8 | 3.24 | 38 | 0.02 | 0.02 | 0.72 |
| 16 | H-01 | PS-02 (5%) | FE-03 (3%) | 13.5 | 3.28 | 16 | 0.02 | 0.02 | 0.72 |
| 17 | H-01 | PS-05 (20%) | FE-01 (1%) | 4.43 | 2.70 | 2.5 | −0.23 | 0.00 | 0.41 |
| 18 | H-01 | PS-05 (20%) | FE-01 (2%) | 3.52 | 2.78 | 4.5 | −0.23 | 0.00 | 0.41 |
| 19 | H-01 | PS-05 (20%) | FE-01 (3%) | 3.10 | 2.78 | 6.5 | −0.23 | 0.00 | 0.41 |
| 20 | H-01 | PS-05 (20%) | FE-03 (1%) | 8.14 | 2.56 | 1.4 | −0.31 | −0.06 | 0.72 |
| 21 | H-01 | PS-05 (20%) | FE-03 (2%) | 7.46 | 2.58 | 1.9 | −0.31 | −0.06 | 0.72 |
| 22 | H-01 | PS-05 (20%) | FE-03 (3%) | 7.01 | 2.59 | 2.5 | −0.31 | −0.06 | 0.72 |
| 23 | H-01 | PS-04 (20%) | FE-01 (1%) | 10.17 | 2.79 | 39 | 0.04 | 0.19 | 0.41 |
| 24 | H-01 | PS-04 (20%) | FE-01 (2%) | 7.42 | 2.85 | 72 | 0.04 | 0.19 | 0.41 |
| 25 | H-01 | PS-04 (20%) | FE-01 (3%) | 5.68 | 2.92 | 119 | 0.04 | 0.19 | 0.41 |
| 26 | H-01 | PS-04 (20%) | FE-03 (1%) | 15.54 | 2.73 | 29 | −0.04 | 0.13 | 0.72 |
| 27 | H-01 | PS-04 (20%) | FE-03 (2%) | 14.14 | 2.73 | 40 | −0.04 | 0.13 | 0.72 |
| 28 | H-01 | PS-04 (20%) | FE-03 (3%) | 12.95 | 2.75 | 54 | −0.04 | 0.13 | 0.72 |

Fluorescent Compounds with Higher Shielding Parameter SF in the Emission Layer Comprising a Phosphorescent Sensitizer By comparison with FE-01 having an SF value of only 0.41, the fluorescent emitter FE-02 (SF=0.55) gives a much higher efficiency (Exp. 4 with EQE100=9.32% vs. Exp. 2 with EQE100=6.77%). The rise in efficiency is even greater in the case of use of the fluorescent emitter FE-03 (SF=0.72) (Exp. 7 with EQE100=17.9%).

In a reference experiment with PS-01 and without use of FE, a phosphorescent device is obtained with EQE100=21.72% and U100=3.67 V. Astonishingly, the efficiency of the device of the invention is only a little lower than that of the phosphorescent device. Moreover, the lifetime can, however, be distinctly improved with an FE. In Experiment 6, the device of the invention gives a lifetime improved by a factor of 2 compared to the device without a fluorescent emitter at $j_0$=10 mA/cm², L1=80%.

A higher efficiency is also obtained at a higher shielding factor in the case of use of PS-05 as sensitizer. Comparing Examples 17 and 20 or 18 and 21 or 19 and 22, it can be seen that FE-03 in the same construction gives much better EQE100 values than FE-01.

Effect of the Concentration of the Fluorescent Emitter

With rising concentration of the fluorescent emitter, there is a significant rise in the lifetime of the OLED (for example Exp. 8 vs. Exp. 6)

If FE-01 is used as emitter together with another phosphorescent sensitizer (PS-02) as in Experiment 9, this gives an EQE100=13%, U100=3.33 V.

The results from Table 2 make it clear that there is an unexpected physically and statistically significant rise in the efficiency (EQE) when there is a rise in the shielding factor (Table 1). Moreover, it can surprisingly be stated that the efficiency (EQE) is still at a very high level even though the X value and the Y value becomes greater and even positive. Moreover, there is a rise in the lifetime with increasing X and Y values. This can also be shown with use of the sensitizer/emitter combinations PS-04 with FE-01 and FE-03 (Exp. 23-28).

OLEDs with Yellow Emission

The OLEDs consist of the following layer sequence which is applied to the substrate: 20 nm HTM:p-D (95%: 5%), 30 nm HTM, 10 nm H-02, 15 nm H-01:PS-03:FE, 10 nm H-01, 40 nm ETM:LiQ (50%:50%), aluminium (100 nm). The different combinations in the emission layer are compiled in Table 3:

TABLE 3

Experiments with yellow-emitting OLEDs

| Exp. | Host | Sensitizer | FE | EQE100 [%] | U100 [V] | LD [h] | X [eV]] | Y [eV] | SF |
|---|---|---|---|---|---|---|---|---|---|
| 17 | H-01 | PS-03 (10%) | FE-04 (1%) | 11.15 | 3.8 | 238 | −0.2 | −0.21 | 0.47 |
| 18 | H-01 | PS-03 (10%) | FE-04 (2%) | 7.44 | 3.86 | 509 | −0.2 | −0.21 | 0.47 |
| 19 | H-01 | PS-03 (10%) | FE-04 (3%) | 5.92 | 4 | 772 | −0.2 | −0.21 | 0.47 |
| 20 | H-01 | PS-03 (10%) | FE-05 (1%) | 20.17 | 3.75 | 207 | −0.21 | −0.25 | 0.6 |
| 21 | H-01 | PS-03 (10%) | FE-05 (2%) | 18.5 | 3.72 | 270 | −0.21 | −0.25 | 0.6 |
| 22 | H-01 | PS-03 (10%) | FE-05 (3%) | 18.7 | 3.79 | 302 | −0.21 | −0.25 | 0.6 |
| 23 | H-01 | PS-03 (10%) | FE-06 (1%) | 19.59 | 3.52 | 17 | −0.23 | −0.28 | 0.67 |
| 24 | H-01 | PS-03 (10%) | FE-06 (2%) | 19.17 | 3.75 | 26 | −0.23 | −0.28 | 0.67 |
| 25 | H-01 | PS-03 (10%) | FE-06 (3%) | 18.8 | 3.68 | 31 | −0.23 | −0.28 | 0.67 |
| 26 | H-01 | PS-03 (10%) | FE-07 (1%) | 23.1 | 3.73 | 90 | −0.23 | −0.28 | 0.65 |
| 27 | H-01 | PS-03 (10%) | FE-07 (2%) | 21.06 | 3.75 | 27 | −0.23 | −0.28 | 0.65 |
| 28 | H-01 | PS-03 (10%) | FE-07 (3%) | 19.6 | 3.75 | 25 | −0.23 | −0.28 | 0.65 |

Entirely analogously to the blue-emitting OLEDs, the same effects can be observed with the yellow-emitting OLEDs that contain a different class of fluorescent emitters.

TABLE 4

Structural formulae of the materials for the OLEDs

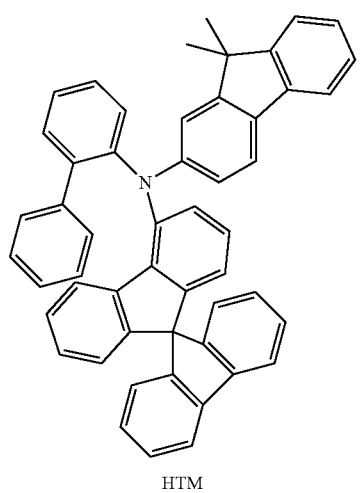

HTM

TABLE 4-continued

Structural formulae of the materials for the OLEDs

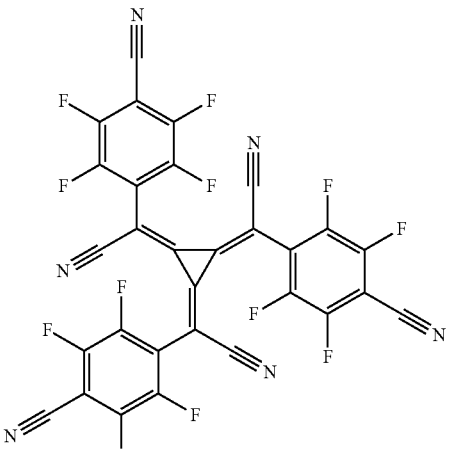

[US2010102709A1; WO2015007729A1]

p-D

TABLE 4-continued
Structural formulae of the materials for the OLEDs
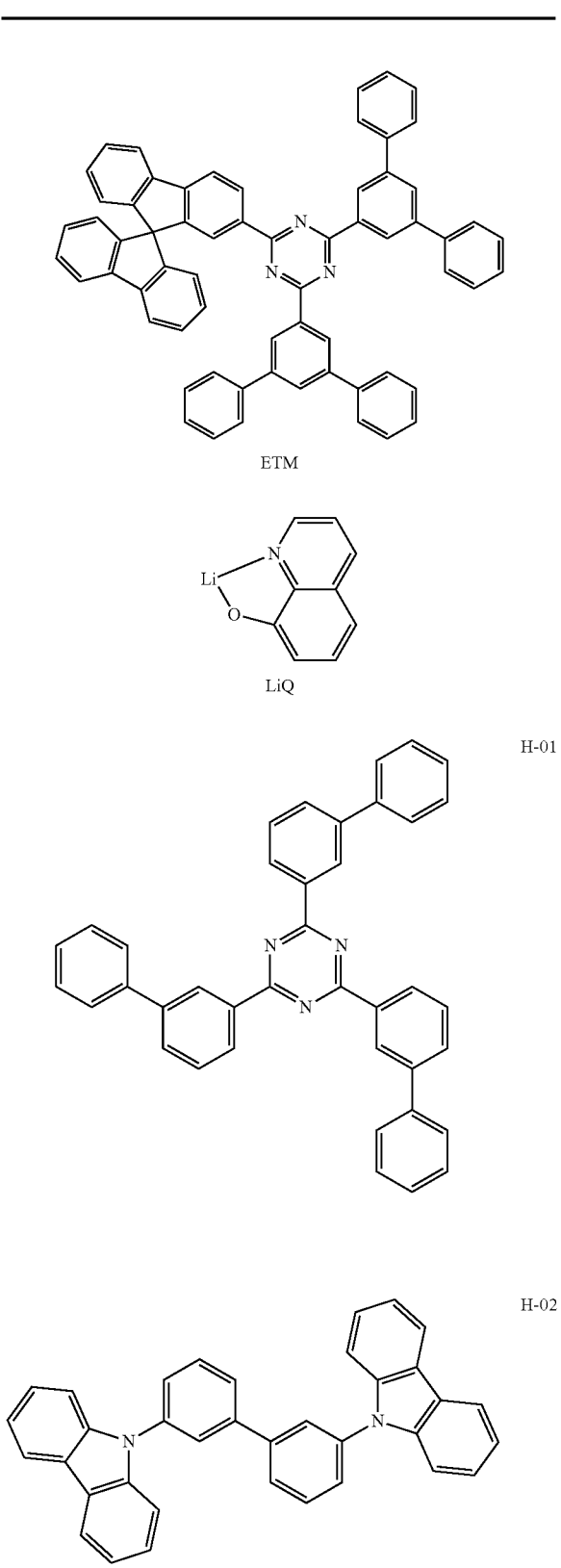
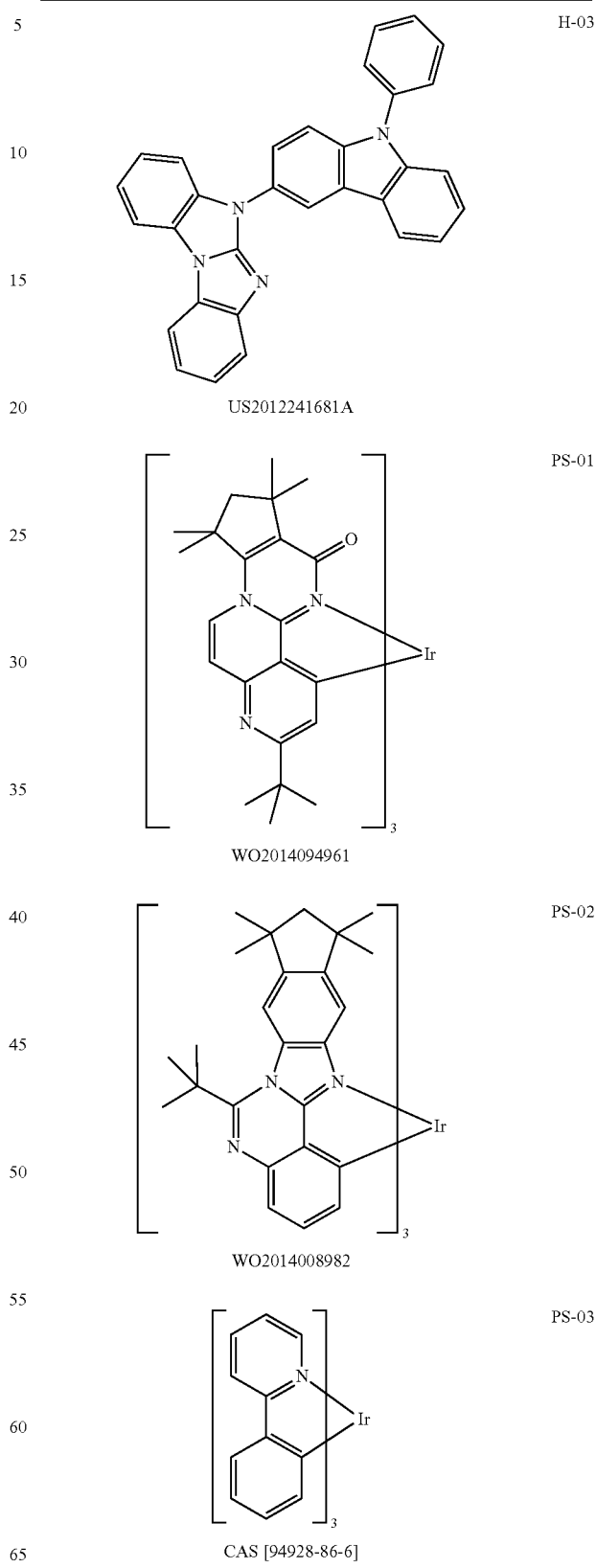

TABLE 4-continued
Structural formulae of the materials for the OLEDs
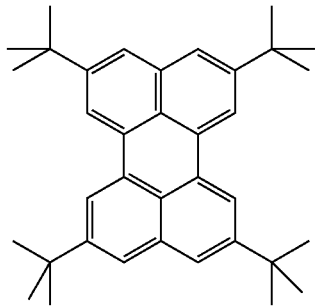
FE-01
CAS [80663-92-9]
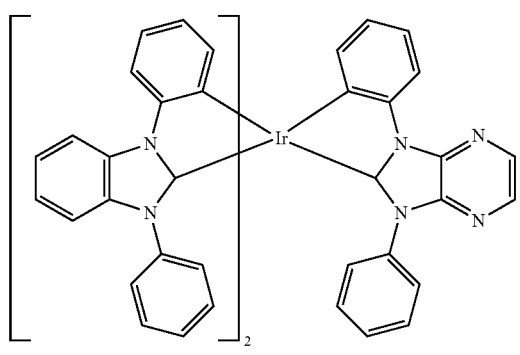
PS-04
WO11073149A1
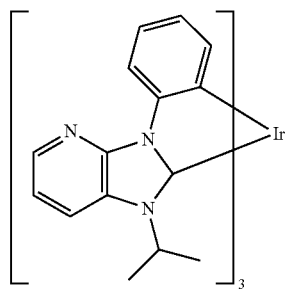
PS-05
WO12172482A1
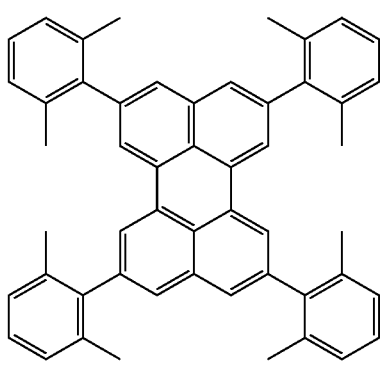 [SMILES: Cc1cccc(C)c1-c1cc2cc(-c3c(C)cccc3C)cc3c4cc(-c5c(C)cccc5C)cc5cc(-c6c(C)cccc6C)cc(c(c1)c23)c54]
FE-02
TABLE 4-continued
Structural formulae of the materials for the OLEDs
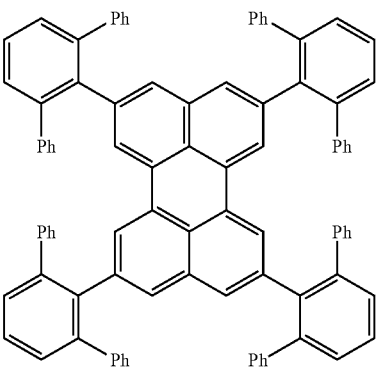 [SMILES: c1ccc(-c2cccc(-c3ccccc3)c2-c2cc3cc(-c4c(-c5ccccc5)cccc4-c4ccccc4)cc4c5cc(-c6c(-c7ccccc7)cccc6-c6ccccc6)cc6cc(-c7c(-c8ccccc8)cccc7-c7ccccc7)cc(c(c2)c34)c65)cc1]
FE-03
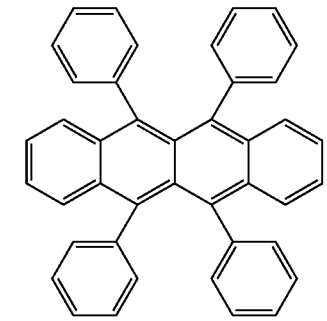
FE-04
CAS [517-51-1]
US2006/0025642
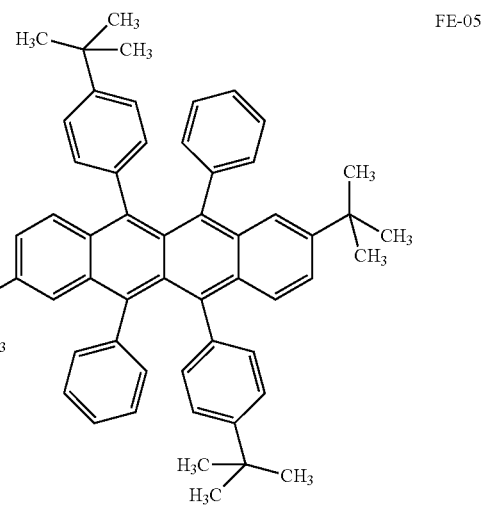
FE-05
CAS [682806-51-5]
Synthesis analogous to that in Eur. J. Org. Chem.
2011, 4160, from commercially available starting
materials.

TABLE 4-continued

Structural formulae of the materials for the OLEDs

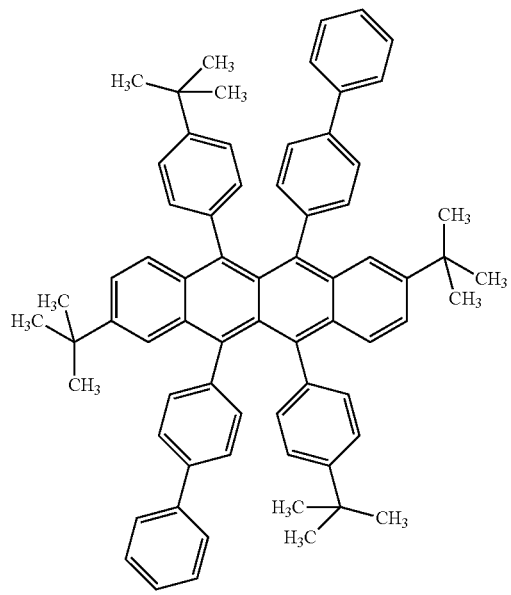

FE-06

CAS [850797-15-8]
US2006/0025617

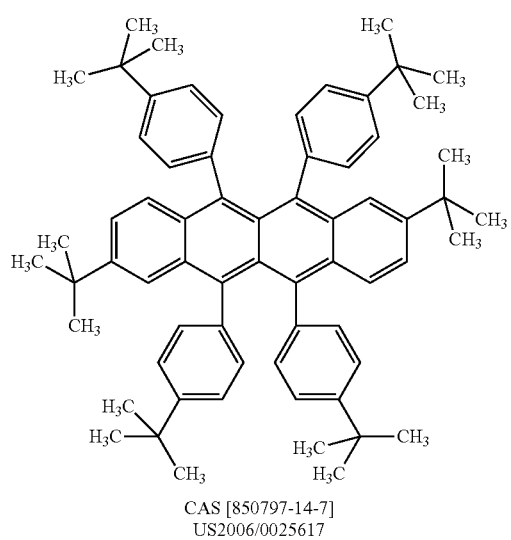 [SMILES: CC(C)(C)c1ccc(-c2c3ccc(C(C)(C)C)cc3c(-c3ccc(C(C)(C)C)cc3)c3c(-c4ccc(C(C)(C)C)cc4)c4ccc(C(C)(C)C)cc4c(-c4ccc(C(C)(C)C)cc4)c23)cc1]

FE-07

CAS [850797-14-7]
US2006/0025617

The invention claimed is:

1. A fluorescent electronic device comprising at least one layer, a sensitizer and a fluorescent emitter, wherein both the sensitizer and the fluorescent emitter are deposited by co-evaporation in the same one of at least one layer as a mixture, and wherein the sensitizer is a phosphorescent compound and wherein at least one of the two following conditions (I) or (II) must be satisfied:

$$S_1^{K}(FE) - S_1^{K}(S) \geq X \quad (I)$$

$$S_1^{max}(FE) - S_1^{max}(S) \leq Y \quad (II)$$

where the parameters used are as follows:
X, Y are each −0.5 eV or are each −0.4 eV,
$S_1^{K}(FE)$ is an energy of a first excited singlet state of the fluorescent emitter which is ascertained from an edge of a first maximum on a short-wavelength side of a normalized photoluminescence spectrum of the fluorescent emitter;
$S_1^{K}(S)$ is an energy of a first excited state of the sensitizer which is ascertained from an edge of a first maximum on a short-wavelength side of a normalized photoluminescence spectrum of the sensitizer;
$S_1^{max}(FE)$ is the energy of the first excited singlet state of the fluorescent emitter which is ascertained from a location of the first maximum at short wavelengths of a photoluminescence spectrum of the fluorescent emitter;
$S_1^{max}(S)$ is the energy of the first excited state of the sensitizer which is ascertained from a location of the first maximum at short wavelengths of a photoluminescence spectrum of the sensitizer;
wherein the photoluminescence spectra of the sensitizer and of the fluorescent emitter are determined from solution at a concentration of 1 mg in 100 ml of toluene at room temperature,
wherein the fluorescent emitter is a sterically shielded compound having a shielding factor (SF) of not less than 0.5;
wherein the photoluminescence emission spectrum of the sensitizer overlaps with an absorption spectrum of the fluorescent emitter; and
wherein the Forster radius is not more than 3 nm.

2. The device according to claim 1, wherein both conditions (I) and (II) are satisfied.

3. The device according to claim 1, wherein excitation energy is transferred from the sensitizer to the fluorescent emitter and the fluorescent emitter emits excitation energy absorbed by the sensitizer by fluorescence.

4. The device according to claim 1, wherein a metal-to-ligand charge transfer (MLCT) band of the photoluminescence spectrum of the sensitizer overlaps with an absorption spectrum of the fluorescent emitter.

5. The device according to claim 1, wherein a magnitude of a triplet metal-to-ligand charge transfer ($^3$MLCT) band of the photoluminescence spectrum of the sensitizer and an absorption maximum of the fluorescent emitter satisfies the following condition (III):

$$|\lambda_{em}^{3MLCT}(S) - \lambda_{abs}^{max}(FE)| \leq V \quad (III)$$

where V is 0.5 eV;
and where $\lambda_{em}^{3MLCT}(S)$ is the triplet metal-to-ligand charge transfer ($^3$MLCT) band of the photoluminescence spectrum of the sensitizer and is found from an edge in a photoluminescence spectrum of the sensitizer and $\lambda_{abs}^{max}(FE)$ is a peak absorption wavelength of a first maximum at long wavelengths of the fluorescent emitter, where the values are each calculated in electron volts.

6. The device according to claim 1, wherein the following condition (IV) is satisfied $$\lambda_{em}^{3MLCT}(S) - \lambda_{abs}^{max}(FE) \leq W \quad (IV)$$

where W is 0.5 eV;
and where $\lambda_{em}^{3MLCT}(S)$ is a triplet metal-to-ligand charge transfer ($^3$MLCT) band of a photoluminescence spectrum of the sensitizer and is found from an edge in the photoluminescence spectrum of the sensitizer and $\lambda_{abs}^{max}(FE)$ is a peak absorption wavelength of a first maximum at long wavelengths of the fluorescent emitter, where $\lambda_{em}^{3MLCT}(S)$ and $\lambda_{abs}^{max}(FE)$ are each calculated in electron volts.

7. The device according to claim 1, wherein the sensitizer is a phosphorescent compound comprising an organometallic complex.

8. The device according to claim 1, wherein the sensitizer is a phosphorescent compound from a group of organometallic complexes containing Cu, Ir, Pt, Rh, Ru, Os or Pd.

9. The device according to claim 1, wherein the fluorescent emitter is a purely organic compound devoid of metals or metal ions.

10. The device according to claim 1, wherein the fluorescent emitter is a purely organic compound devoid of metals or metal ions, selected from a group consisting of fused aromatics having 6 to 60 aromatic ring atoms.

11. The device according to claim 1, wherein the fluorescent emitter is a purely organic compound devoid of metals or metal ions, selected from a group consisting of the pyrenes, perylenes, anthracenes, fluorenes and indenofluorenes.

12. The device according to claim 1, wherein the fluorescent emitter is a purely organic compound devoid of metals or metal ions, with aromatic groups in substituted form.

13. The device according to claim 1, comprising an emission layer, and wherein the sensitizer and the fluorescent emitter are in the emission layer.

14. The device according to claim 1, wherein the layer in which the sensitizer and the fluorescent emitter are present contains a further material selected from a group consisting of electron transport materials, hole conductor materials, quantum materials, bipolar hosts, wide band gap materials, phosphorescent emitters, fluorescent emitters, and materials having delayed fluorescence.

15. The device according to claim 1, wherein the at least one layer in which the sensitizer and the fluorescent emitter are present does not contain any further material.

16. A composition comprising at least one sensitizer and at least one fluorescent emitter, wherein both the at least one sensitizer and the at least one fluorescent emitter are deposited by co-evaporation in the same one of at least one layer as a mixture, wherein the at least one sensitizer is a phosphorescent compound and wherein at least one of the two following conditions (I) and (II) must be satisfied:

$$S_1^K(FE) - S_1^K(S) \geq X \quad (I)$$

$$S_1^{max}(FE) - S_1^{max}(S) \leq Y \quad (II),$$

where the parameters used are as follows:
X, Y are each −0.5 eV or are each −0.4 eV,
$S_1^K(FE)$ is an energy of a first excited singlet state of the at least one fluorescent emitter which is ascertained from an edge of a first maximum on a short-wavelength side of a normalized photoluminescence spectrum of the at least one fluorescent emitter;
$S_1^K(S)$ is an energy of a first excited state of the at least one sensitizer which is ascertained from an edge of a first maximum on a short-wavelength side of a normalized photoluminescence spectrum of the at least one sensitizer;
$S_1^{max}(FE)$ is the energy of the first excited singlet state of the at least one fluorescent emitter which is ascertained from a location of the first maximum at short wavelengths of a photoluminescence spectrum of the at least one fluorescent emitter;
$S_1^{max}(S)$ is the energy of the first excited state of the at least one sensitizer which is ascertained from a location of the first maximum at short wavelengths of a photoluminescence spectrum of the at least one sensitizer, wherein the fluorescent emitter is a sterically shielded compound having a shielding factor (SF) of not less than 0.5,
wherein the photoluminescence emission spectrum of the at least one sensitizer overlaps with an absorption spectrum of the at least one fluorescent emitter, and
wherein the Forster radius is not more than 3 nm.

17. The composition according to claim 16, wherein the composition comprises at least one further material selected from a group consisting of electron transport materials, electron injection materials, electron blocker materials, hole transport materials, hole injection materials, hole blocker materials, n-dopants, p-dopants, quantum materials, host materials, matrix materials, wide band gap materials, phosphorescent emitters, fluorescent emitters, and emitters having delayed fluorescence.

18. A formulation comprising the composition according to claim 16 and at least one solvent.

19. A electronic device comprising at least one composition according to claim 16.

20. A composition comprising at least one sensitizer and at least one fluorescent emitter, wherein both the at least one sensitizer and the at least one fluorescent emitter are deposited by co-evaporation in the same one of at least one layer as a mixture, wherein the at least one sensitizer is a phosphorescent compound and wherein at least one of the two following conditions (I) and (II) must be satisfied:

$$S_1^K(FE) - S_1^K(S) \geq X \quad (I)$$

$$S_1^{max}(FE) - S_1^{max}(S) \leq Y \quad (II),$$

wherein the at least one fluorescent emitter is a sterically shielded compound having a shielding factor (SF) of not less than 0.5, and
wherein the composition contains the at least one fluorescent emitter in a concentration of 1% to 10% by weight, based on the overall composition,
where the parameters used are as follows:
X, Y are each −0.5 eV or are each −0.4 eV,
$S_1^K(FE)$ is an energy of a first excited singlet state of the at least one fluorescent emitter which is ascertained from an edge of a first maximum on a short-wavelength side of a normalized photoluminescence spectrum of the at least one fluorescent emitter;
$S_1^K(S)$ is an energy of a first excited state of the at least one sensitizer which is ascertained from an edge of a first maximum on a short-wavelength side of a normalized photoluminescence spectrum of the at least one sensitizer;
$S_1^{max}(FE)$ is the energy of the first excited singlet state of the at least one fluorescent emitter which is ascertained from a location of the first maximum at short wavelengths of a photoluminescence spectrum of the at least one fluorescent emitter;
$S_1^{max}(S)$ is the energy of the first excited state of the at least one sensitizer which is ascertained from a location of the first maximum at short wavelengths of a photoluminescence spectrum of the at least one sensitizer; and
wherein the photoluminescence emission spectrum of the at least one sensitizer overlaps with an absorption spectrum of the at least one fluorescent emitter and
wherein the Forster radius is not more than 3 nm.

21. The composition according to claim 20, wherein the composition contains the at least one fluorescent emitter in a concentration of 1% to 3% by weight, based on the overall composition.

* * * * *